(12) United States Patent
Lim et al.

(10) Patent No.: US 10,038,009 B2
(45) Date of Patent: Jul. 31, 2018

(54) THREE-DIMENSIONAL SEMICONDUCTOR MEMORY DEVICES

(71) Applicants: Joon-Sung Lim, Yongin-si (KR); Jang-Gn Yun, Hwaseong-si (KR); Jaesun Yun, Anyang-si (KR)

(72) Inventors: Joon-Sung Lim, Yongin-si (KR); Jang-Gn Yun, Hwaseong-si (KR); Jaesun Yun, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/662,714

(22) Filed: Jul. 28, 2017

(65) Prior Publication Data
US 2017/0330894 A1   Nov. 16, 2017

Related U.S. Application Data

(63) Continuation of application No. 14/962,263, filed on Dec. 8, 2015, now Pat. No. 9,741,733.

(30) Foreign Application Priority Data

Dec. 9, 2014  (KR) .................. 10-2014-0176089

(51) Int. Cl.
*H01L 27/115* (2017.01)
*H01L 23/522* (2006.01)
(Continued)

(52) U.S. Cl.
CPC ...... *H01L 27/11582* (2013.01); *H01L 23/528* (2013.01); *H01L 23/5226* (2013.01); *H01L 27/11573* (2013.01); *H01L 2924/0002* (2013.01)

(58) Field of Classification Search
CPC ......... H01L 27/11582; H01L 27/11573; H01L 23/5226; H01L 23/528; H01L 2924/0002
(Continued)

(56) References Cited

U.S. PATENT DOCUMENTS 7,915,667 B2   3/2011  Knoefler et al.
8,188,530 B2   5/2012  Tanaka
(Continued)

*Primary Examiner* — Johannes P Mondt
(74) *Attorney, Agent, or Firm* — Myers Bigel, P.A.

(57) ABSTRACT

Provided are a semiconductor device, a method of manufacturing the semiconductor device, and an electronic system adopting the same. The semiconductor device includes a semiconductor pattern, which is disposed on a semiconductor substrate and has an opening. The semiconductor pattern includes a first impurity region having a first conductivity type and a second impurity region having a second conductivity type different from the first conductivity type. A peripheral transistor is disposed between the semiconductor substrate and the semiconductor pattern. A first peripheral interconnection structure is disposed between the semiconductor substrate and the semiconductor pattern. The first peripheral interconnection structure is electrically connected to the peripheral transistor. Cell gate conductive patterns are disposed on the semiconductor pattern. Cell vertical structures are disposed to pass through the cell gate conductive patterns and to be connected to the semiconductor pattern. Cell bit line contact plugs are disposed on the cell vertical structures. A bit line is disposed on the cell bit line contact plugs. A peripheral bit line contact structure is disposed between the bit line and the first peripheral interconnection structure. The peripheral bit line contact structure crosses the opening of the semiconductor.

11 Claims, 56 Drawing Sheets

(51) Int. Cl.
　　　*H01L 23/528*　　　(2006.01)
　　　*H01L 27/11582*　　(2017.01)
　　　*H01L 27/11573*　　(2017.01)
(58) Field of Classification Search
　　　USPC .................................. 257/314, 316, 324
　　　See application file for complete search history.

(56) References Cited

U.S. PATENT DOCUMENTS

| | | | |
|---|---|---|---|
| 8,288,816 B2 * | 10/2012 | Komori | H01L 27/11573 |
| | | | 257/324 |
| 8,324,680 B2 | 12/2012 | Izumi et al. | |
| 8,338,882 B2 | 12/2012 | Tanaka et al. | |
| 8,541,831 B2 | 9/2013 | Chae et al. | |
| 8,791,523 B2 | 7/2014 | Iino et al. | |
| 9,419,013 B1 * | 8/2016 | Lee | H01L 27/11582 |
| 2012/0068247 A1 | 3/2012 | Lee et al. | |
| 2012/0108048 A1 * | 5/2012 | Lim | H01L 27/11529 |
| | | | 438/586 |
| 2013/0161717 A1 * | 6/2013 | Choi | H01L 27/1157 |
| | | | 257/314 |
| 2014/0015128 A1 | 1/2014 | Chae et al. | |
| 2014/0197542 A1 | 7/2014 | Yun et al. | |

* cited by examiner

THREE-DIMENSIONAL SEMICONDUCTOR MEMORY DEVICES

CROSS-REFERENCE TO RELATED APPLICATION

This application claims priority under 35 U.S.C. § 119 to Korean Patent Application No. 10-2014-0176089 filed on Dec. 9, 2014, and U.S. patent application Ser. No. 14/962,263 filed on Dec. 8, 2015 with the United States Patent Office, the disclosures of which are hereby incorporated by reference in their entirety.

BACKGROUND

Technical Field

Embodiments of the inventive concept relate to a semiconductor device, a method of manufacturing the semiconductor device, and an electronic system adopting the same.

Description of Related Art

In semiconductor devices such as flash memories, a degree of integration is one of the important factors for determining a price of a semiconductor product. Generally, in the case of a two-dimensional semiconductor device including two-dimensionally arranged memory cells, systems of a super-high price for the refinement of patterns are required in order to increase the degree of integration. Therefore, there is a limit to increase the degree of integration of the semiconductor device including the two-dimensionally arranged memory cells. In order to increase the degree of integration of the two-dimensional semiconductor device, a three-dimensional semiconductor device including three-dimensionally arranged memory cells has been proposed.

SUMMARY

In accordance with an embodiment of the inventive concept, a semiconductor device is provided. The semiconductor device includes a semiconductor pattern, which is disposed on a semiconductor substrate and has an opening. The semiconductor pattern includes a first impurity region having a first conductivity type and a second impurity region having a second conductivity type different from the first conductivity type. A peripheral transistor is disposed between the semiconductor substrate and the semiconductor pattern. A first peripheral interconnection structure is disposed between the semiconductor substrate and the semiconductor pattern. The first peripheral interconnection structure is electrically connected to the peripheral transistor. Cell gate conductive patterns are disposed on the semiconductor pattern. Cell vertical structures are disposed to pass through the cell gate conductive patterns and to be connected to the semiconductor pattern. Cell bit line contact plugs are disposed on the cell vertical structures. A bit line is disposed on the cell bit line contact plugs. A peripheral bit line contact structure is disposed between the bit line and the first peripheral interconnection structure. The peripheral bit line contact structure crosses the opening of the semiconductor pattern.

In accordance with an embodiment of the inventive concept, a semiconductor device is provided. The semiconductor device includes a semiconductor pattern, which is disposed on a semiconductor substrate and has an opening. A first peripheral interconnection structure having a first peripheral contact pad is disposed between the semiconductor substrate and the semiconductor pattern. A second peripheral interconnection structure is disposed to be disposed between the semiconductor substrate and the semiconductor pattern, to extend in an outside direction of the semiconductor pattern, and to have a second peripheral contact pad. A cell array area is disposed on the semiconductor pattern. A first step area is disposed on a side of the cell array area on the semiconductor pattern. A cell gate conductive pattern is disposed on the semiconductor pattern. The cell gate conductive pattern is disposed in the cell array area and extends to the first step area. A cell vertical structure is disposed to pass through the cell gate conductive pattern in the cell array area and to be connected to the semiconductor pattern. A bit line is disposed on the cell vertical structure. A peripheral bit line contact structure is disposed between the bit line and the first peripheral contact pad. The peripheral bit line contact structure crosses the opening of the semiconductor pattern. A cell gate contact structure is disposed on the cell gate conductive pattern of the step area on the semiconductor pattern. A peripheral word line contact structure is disposed on the second peripheral contact pad. The peripheral word line contact structure is disposed on an outside of the semiconductor pattern. A word line interconnection structure is disposed to electrically connect the cell gate contact structure to the peripheral word line contact structure.

In accordance with an embodiment of the inventive concept, a semiconductor device is provided. The semiconductor device includes a semiconductor pattern disposed on a semiconductor substrate. A peripheral transistor is disposed between the semiconductor substrate and the semiconductor pattern. A peripheral interconnection structure is disposed between the semiconductor substrate and the semiconductor pattern. The peripheral interconnection structure is electrically connected to the peripheral transistor and has a peripheral contact pad. A gate conductive structure is disposed on the semiconductor pattern. The gate conductive structure includes a plurality of cell gate conductive patterns stacked in a direction perpendicular to the semiconductor pattern. A cell vertical structure is disposed to pass through the gate conductive structure. A cell conductive line is disposed on the cell vertical structure. The cell conductive line has a length smaller than a width of the semiconductor pattern. A peripheral contact structure is disposed between the cell conductive line and the peripheral contact pad.

In accordance with yet another aspect of the inventive concept, a semiconductor device is provided. The semiconductor device includes a peripheral transistor disposed on a semiconductor substrate. A peripheral interconnection structure is disposed on the semiconductor substrate to be electrically connected to the peripheral transistor. The peripheral interconnection structure has a peripheral contact pad. A lower interlayer insulating layer is disposed on the semiconductor substrate to cover the peripheral transistor and the peripheral interconnection structure. A buffer insulating layer is disposed on the lower interlayer insulating layer. A semiconductor pattern is disposed on the buffer insulating layer. The semiconductor pattern overlaps the peripheral transistor and the peripheral interconnection structure. A first gate conductive structure, a second gate conductive structure, and a third gate conductive structure are disposed on the semiconductor pattern to be sequentially arranged in a horizontal direction. Each of the first to third gate conductive structures includes a plurality of cell gate conductive patterns stacked in a direction perpendicular to the semiconductor pattern. Cell vertical structures are disposed to pass through the first to third gate conductive structures. Cell bit line contact plugs are disposed on the cell vertical structures. A bit line is disposed on the cell bit line contact plugs. A peripheral bit line contact structure is disposed between the bit line and the peripheral contact pad to pass through the semiconductor pattern.

Details of other embodiments are included in detailed explanations and the drawings.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
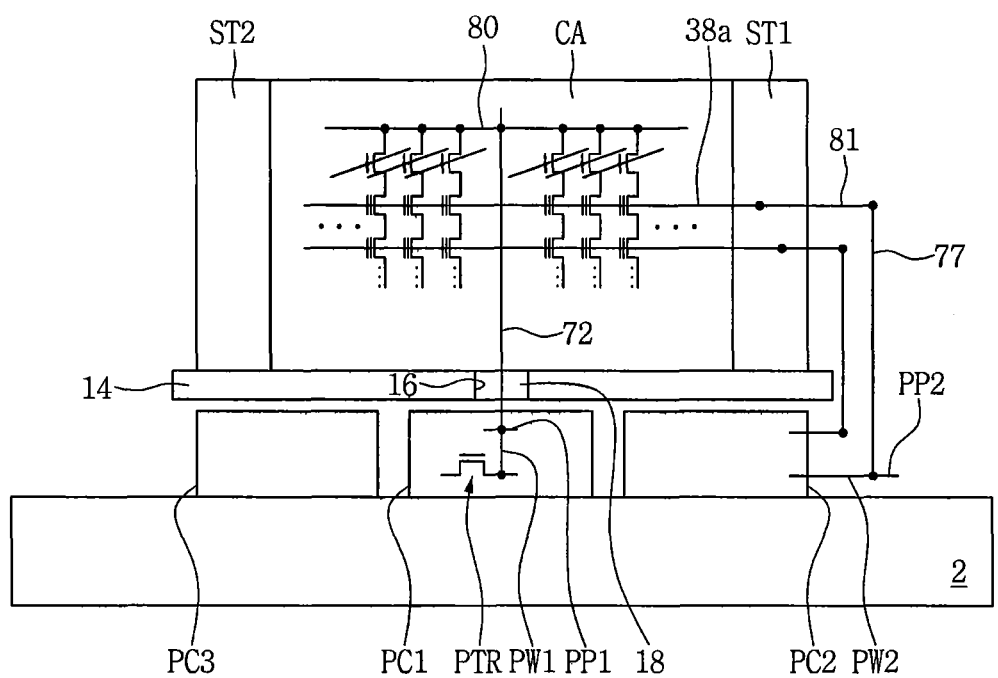
FIG. 1 is a conceptual view showing a semiconductor device in accordance with an embodiment of the inventive concept.

The inventive concept may, however, be embodied in various different forms, and should be construed as limited, not by the embodiments set forth herein, but only by the accompanying claims. Rather, these embodiments are provided so that this disclosure is thorough and complete and fully conveys the inventive concept to those skilled in the art. In the drawings, the sizes and relative sizes of layers and regions may be exaggerated for clarity. The same reference symbols denote the same components throughout the specification.

Embodiments are described herein with reference to cross-sectional views, plan views, and/or block diagrams that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Therefore, regions illustrated in the drawings are schematic in nature, and their shapes are not intended to limit the inventive concept but only to illustrate characteristic forms of regions of devices.

The thicknesses of layers and regions in the drawings may be exaggerated for the sake of clarity. Further, it will be understood that when a layer is referred to as being "on" another layer or a substrate, the layer may be formed directly on the other layer or the substrate, or there may be an intervening layer therebetween. The same reference numerals indicate the same components throughout the specification.

Terms such as "top," "bottom," "upper," "lower," "above," "below," and the like are used herein to describe the relative positions of elements or features. It will be understood that such descriptions are intended to encompass different orientations in use or operation in addition to orientations depicted in the drawings. For example, when an upper part of a drawing is referred to as a "top" and a lower part of a drawing as a "bottom" for the sake of convenience, in practice, the "top" may also be called a "bottom" and the "bottom" a "top" without departing from the teachings of the inventive concept.

Furthermore, throughout this disclosure, directional terms such as "upper," "intermediate," "lower," and the like may be used herein to describe the relationship of one element or feature with another, and the inventive concept should not be limited by these terms. Accordingly, these terms such as "upper," "intermediate," "lower," and the like may be replaced by other terms such as "first," "second," "third," and the like to describe the elements and features.

It will be understood that, although the terms "first," "second," etc. may be used herein to describe various elements, these elements should not be limited by these terms. These terms are only used to distinguish one element from another. Thus, a first element could be termed a second element without departing from the teachings of the present inventive concept.

The terminology used herein to describe embodiments of the invention is not intended to limit the scope of the inventive concept.

As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
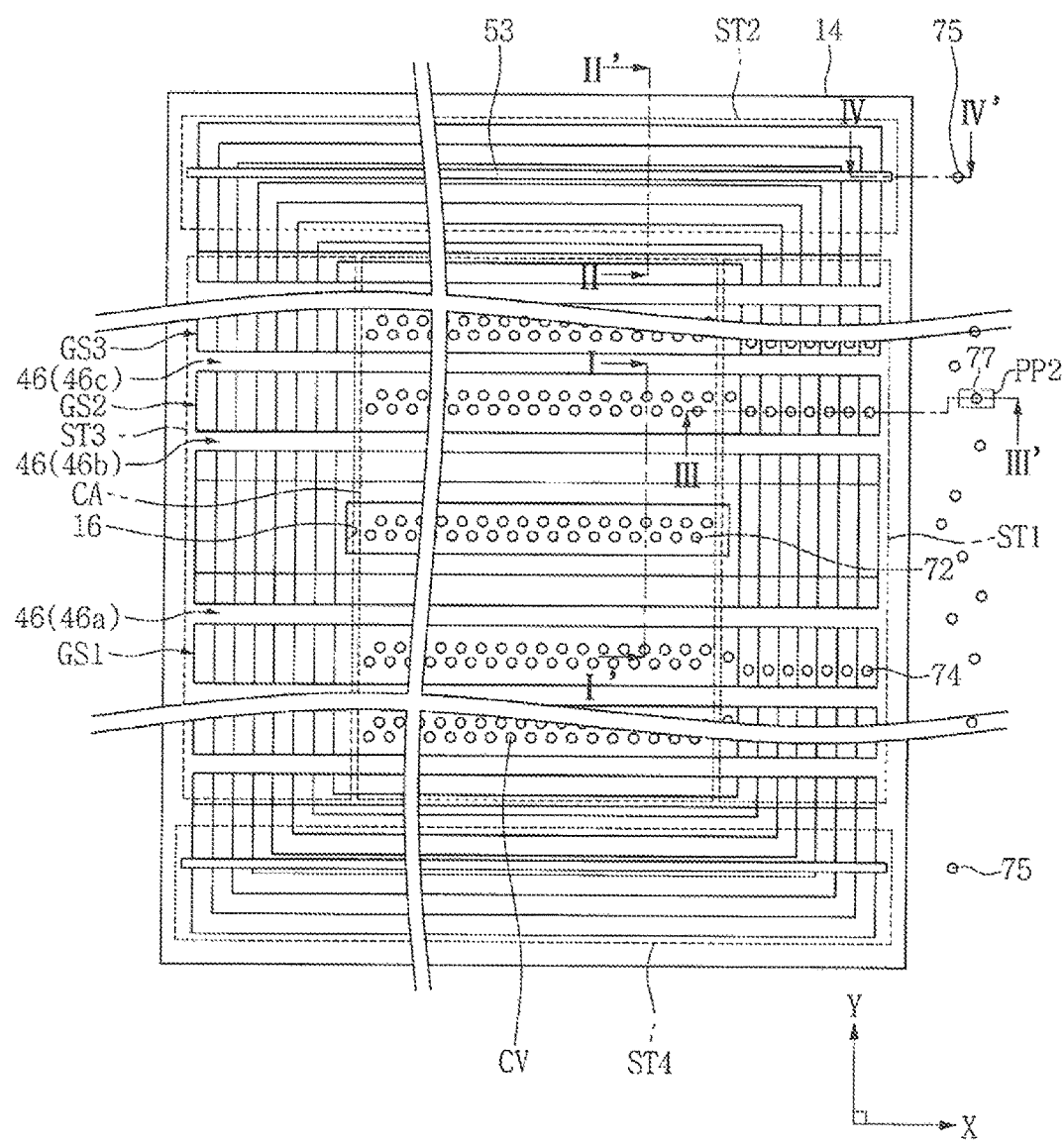
FIGS. 2A and 2B are plan views showing the semiconductor device in accordance with an embodiment of the inventive concept.
Figure 2B:
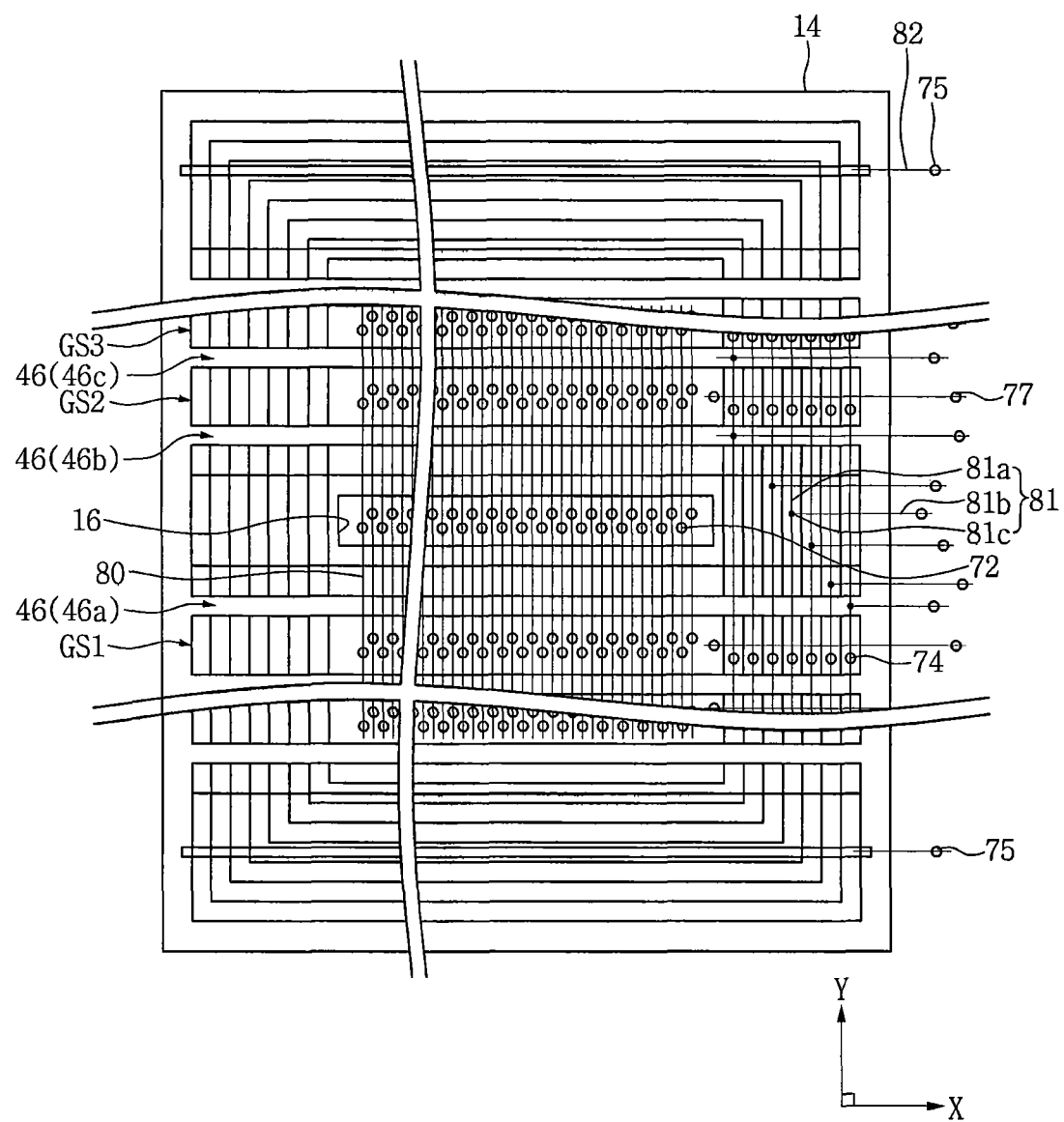
Figure 3A:
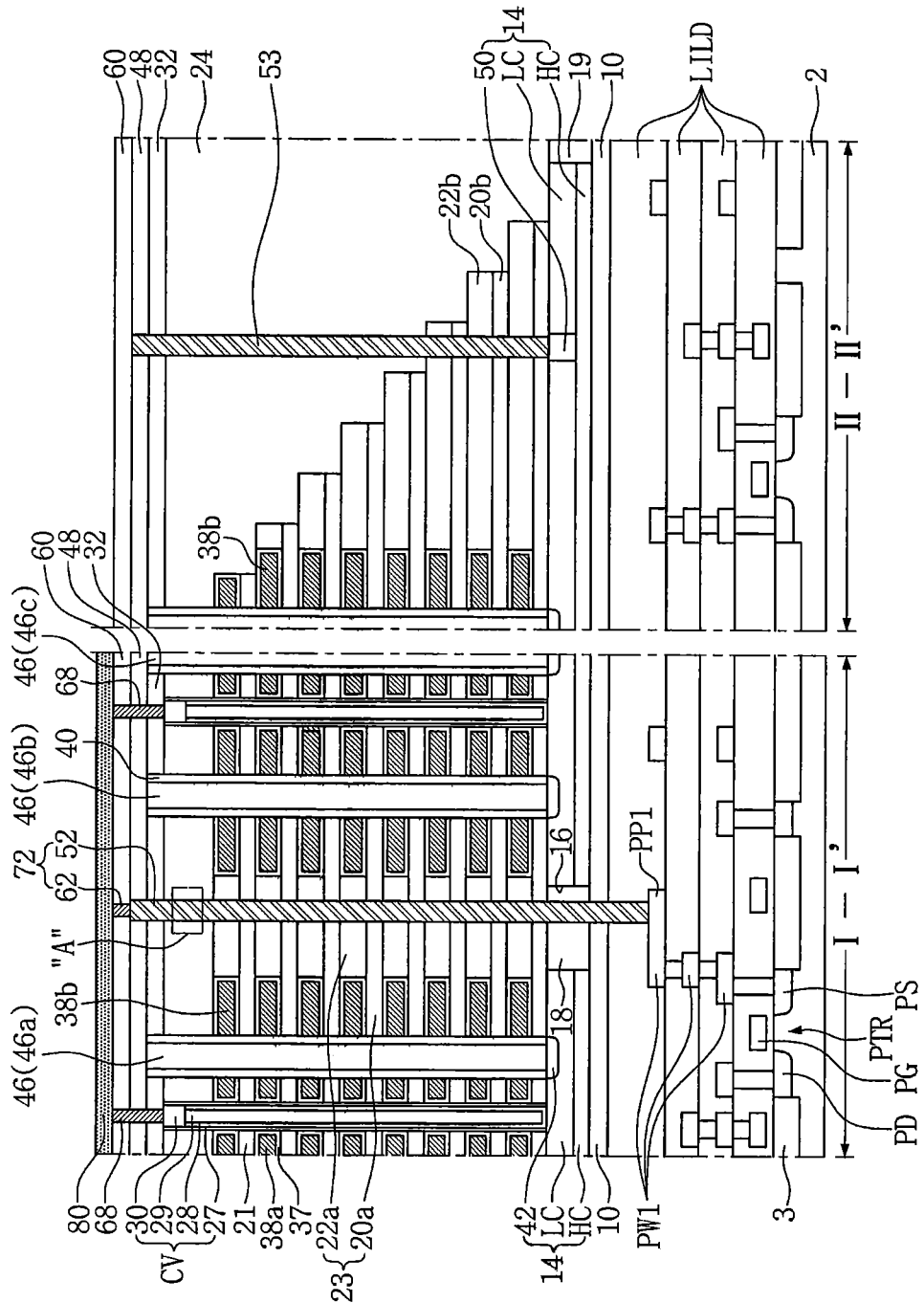
FIGS. 3A and 3B are cross-sectional views showing the semiconductor device in accordance with the embodiment of the inventive concept and FIG. 3C is an enlarged view of part "A" shown in FIG. 3A.
Figure 3B:
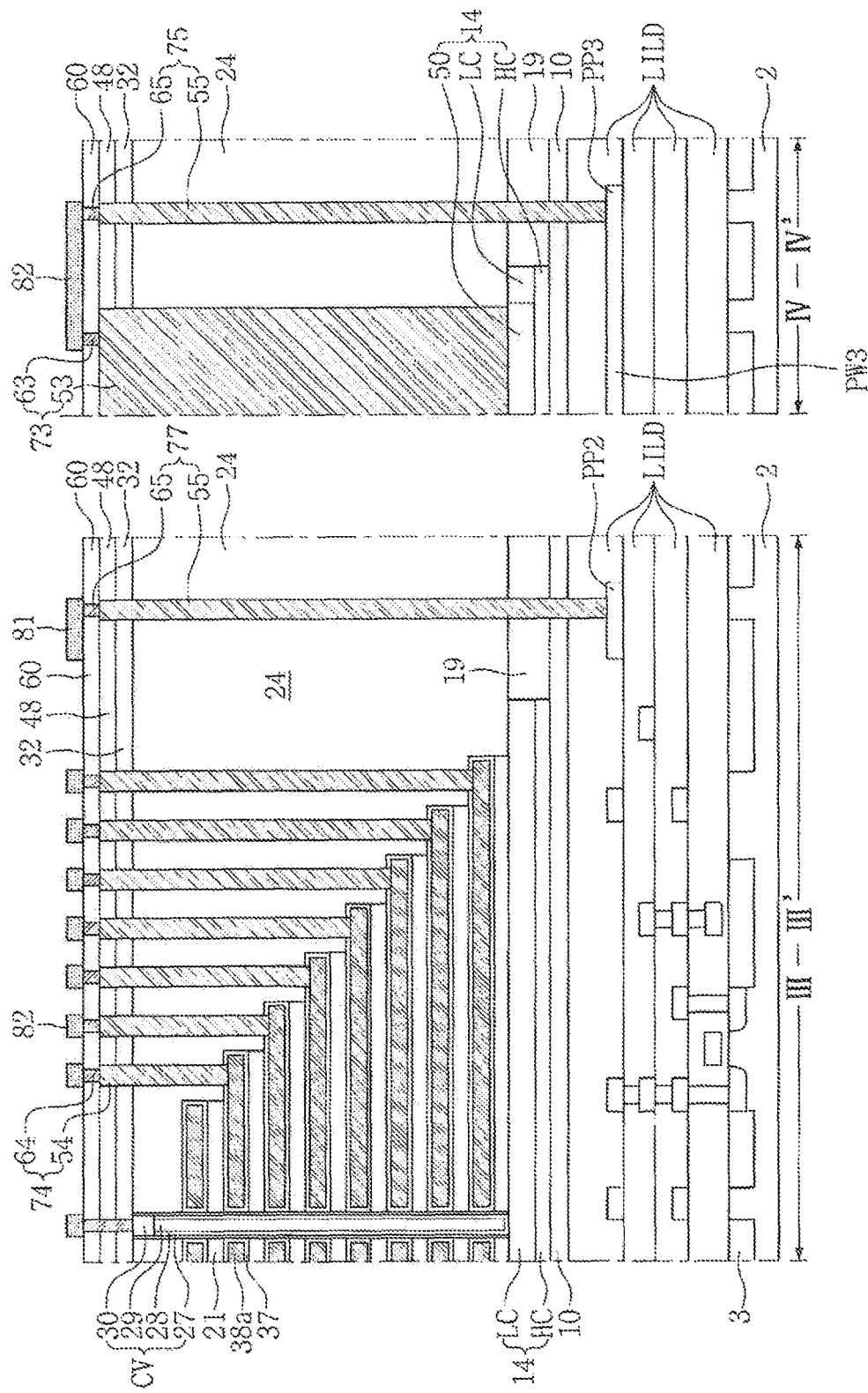
Figure 3C:
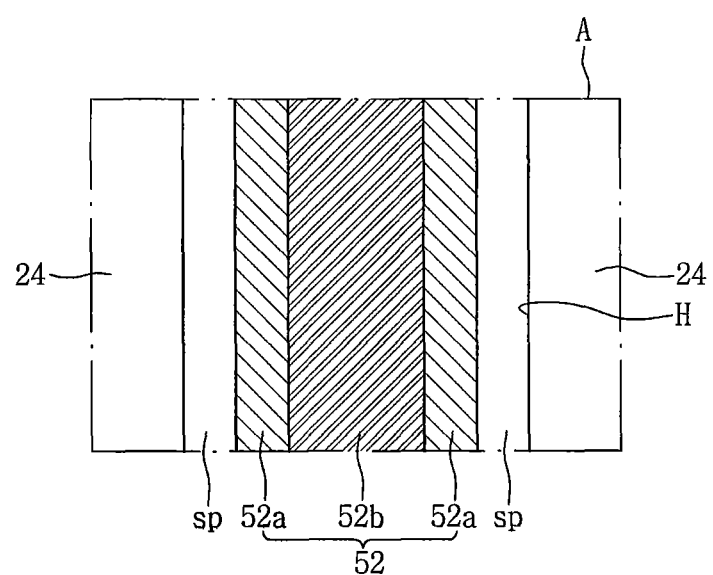

FIG. 1 is a conceptual view for schematically describing a semiconductor device in accordance with an embodiment of the inventive concept. FIGS. 2A and 2B are plan views showing the semiconductor device in accordance with the embodiment of the inventive concept. FIG. 2B is a plan view in which interconnection structures are added to the drawing of FIG. 2A in order to avoid complexity of the drawing, FIG. 3A is a cross-sectional view showing areas taken along lines I-I' and II-II' of FIG. 2A and FIG. 3B is a cross-sectional view showing areas taken along lines III-III' and IV-IV' of FIG. 2B. FIG. 3C is an enlarged view of part "A" shown in FIG. 3A.

First, the semiconductor device in accordance with the embodiment of the inventive concept will be described with reference to FIGS. 1 to 3C.

Referring to FIGS. 1 to 3C, a peripheral circuit area may be disposed on a semiconductor substrate 2. The semiconductor substrate 2 may be formed of a semiconductor material such as silicon, etc. The peripheral circuit area may include a first peripheral circuit area PC1, a second peripheral circuit area PC2, and a third peripheral circuit area PC3. The first peripheral circuit area PC1 may include a page buffer circuit. The first peripheral circuit area PC1 may include a peripheral transistor PTR that may configure a circuit and a first peripheral interconnection structure PW1 which is electrically connected to the peripheral transistor PTR. The first peripheral interconnection structure PW1 may include a first peripheral contact pad part PP1.

The peripheral transistor PTR may include a peripheral gate PG and peripheral impurity regions PS and PD. The peripheral gate PG may be disposed in an active region defined by an isolation area 3. The peripheral impurity regions PS and PD may be disposed in the active region of both sides of the peripheral gate PG and may serve as a source/drain.

A lower interlayer insulating layer LILD may be disposed to cover the first to third peripheral circuit areas PC1, PC2, and PC3 of the semiconductor substrate 2. The lower interlayer insulating layer LILD may be formed of an insulating material including silicon oxide. The first peripheral interconnection structure PW1 and the first peripheral contact pad part PP1 of the first peripheral interconnection structure PW1 may be covered by the lower interlayer insulating layer LILD.

A buffer insulating layer 10 may be disposed on the lower interlayer insulating layer LILD. The buffer insulating layer 10 may have an etch selectivity different from a part of the lower interlayer insulating layer LILD being in contact with the buffer insulating layer 10. For example, the buffer insulating layer 10 may be formed of silicon nitride and the part of the lower interlayer insulating layer LILD being in contact with the buffer insulating layer 10 may be formed of silicon oxide.

A semiconductor pattern 14 having an opening 16 may be disposed on the buffer insulating layer 10. The semiconductor pattern 14 may overlap the first peripheral circuit area PC1, the second peripheral circuit area PC2, and/or the third peripheral circuit area PC3. The semiconductor pattern 14 may include a first impurity region LC having a first conductivity type, a second impurity region 42 having a conductivity type different from the first conductivity type, a cell body contact impurity region 50 having the first conductivity type and an impurity concentration higher than the first impurity region LC, and a third impurity region HC, which has the first conductivity type and an impurity concentration higher than the first impurity region LC, and is disposed under the first impurity region LC. The first impurity region LC may be referred to as a low concentration impurity region, the second impurity region 42 may be referred to as a cell source impurity region, and the third impurity region HC may be referred to as a high concentration impurity region.

In an embodiment, the first impurity region LC, the third impurity region HC, and the cell body contact impurity region 50 may have P-type conductivity and the second impurity region 42 may have N-type conductivity.

The peripheral transistor PTR and the first peripheral interconnection structure PW1 may be interposed between the semiconductor substrate 2 and the semiconductor pattern 14.

A second peripheral interconnection structure PW2 (shown in FIG. 1) and a third peripheral interconnection structure PW3 (shown in FIG. 3B) may be disposed to be interposed between the semiconductor substrate 2 and the semiconductor pattern 14 and to extend in an outside direction of the semiconductor pattern 14.

The second peripheral interconnection structure PW2 (shown in FIG. 1) may have a second peripheral contact pad PP2 on a part in which the second peripheral circuit area PC2 does not overlap the semiconductor pattern 14. The third peripheral interconnection structure PW3 (shown in FIG. 3B) may have a third peripheral contact pad PP3 in a part in which the third peripheral circuit area PC3 does not overlap the semiconductor pattern 14. The first peripheral contact pad PP1 of the first peripheral interconnection structure PW1 may be located between the semiconductor substrate 2 and the semiconductor pattern 14.

A gap fill insulating layer 18 may be disposed in the opening 16 of the semiconductor pattern 14. An intermediate interlayer insulating layer 19 may be disposed on a side surface of the semiconductor pattern 14. The gap fill insulating layer 18 and the intermediate interlayer insulating layer 19 may be formed of silicon oxide.

A cell array area CA and step areas ST1, ST2, ST3, and ST4 may be disposed on the semiconductor pattern 14. The step areas ST1, ST2, ST3, and ST4 may include the first and third step areas ST1 and ST3 facing each other in which the cell array area CA is interposed therebetween, and second and fourth step areas ST2 and ST4 facing each other in which the cell array area CA is interposed therebetween, in a plan view.

Cell gate conductive structures GS1, GS2, and GS3 may be disposed on the semiconductor pattern 14. The cell gate conductive structures GS1, GS2, and GS3 may be disposed in the cell array area CA. The cell gate conductive structures GS1, GS2, and GS3 may extend from the cell array area CA into the first and third step areas ST1 and ST3.

The cell gate conductive structures GS1, GS2, and GS3 may include a first gate conductive structure GS1, a second gate conductive structure GS2, and a third gate conductive structure GS3. A distance between the first and second gate conductive structures GS1 and GS2 may be greater than a distance between the second and third gate conductive structures GS2 and GS3.

Each of the first to third gate conductive structures GS1, GS2, and GS3 may be sequentially stacked on the semiconductor pattern 14 and may include cell gate conductive patterns 38a spaced apart from each other. The cell gate conductive patterns 38a may be disposed so as to have a step structure in the first step area ST1 and the second step area. ST2 of the semiconductor pattern 14. The step structure may be gradually lowered as further away from the cell array area CA.

Cell interlayer insulating patterns 21 may be interposed between the cell gate conductive patterns 38a and between a lowermost pattern of the cell gate conductive patterns 38a and the semiconductor pattern 14. The cell interlayer insulating patterns 21 and the cell gate conductive patterns 38a may be alternately and repeatedly stacked.

An insulating structure 23 may be disposed on the semiconductor pattern 14 between the first and second gate conductive structures GS1 and GS2.

The insulating structure 23 may include first insulating patterns 20a and second insulating patterns 22a, which are alternately and repeatedly stacked. Therefore, the insulating structure 23 may include the plurality of first insulating patterns 20a and the plurality of second insulating patterns 22a.

The first insulating pattern 20a may have a width greater than the second insulating pattern 22a and may have an etch selectivity with respect to the second insulating pattern 22a. For example, the first insulating pattern 20a may be formed of silicon oxide and the second insulating pattern 22a may be formed of silicon nitride.

Dummy gate conductive patterns 38b may be disposed in a horizontal direction of the second insulating pattern 22a on the semiconductor pattern 14 between the first and second gate conductive structures GS1 and GS2. The second insulating patterns 22a and the cell gate conductive patterns 38a may be disposed on the same plane.

The insulating structure 23 may overlap the opening 16. The insulating structure 23 may overlap the gap fill insulating layer 18 included in the opening 16.

Third insulating patterns 20b and fourth insulating patterns 22b may be disposed on the second and fourth step areas ST2 and ST4 on the semiconductor pattern 14 to be alternately and repeatedly stacked and to be formed to have a step structure. The step structure may be gradually lowered in a direction further away from the cell array area CA. The third insulating patterns 20b, and the first insulating patterns 20a and the cell interlayer insulating patterns 21 may be formed of the same material and disposed on the same plane. The fourth insulating patterns 22b and the second insulating patterns 22a may be formed of the same material and disposed on the same plane. The second insulating patterns 22a and the fourth insulating patterns 22b, and the cell gate conductive patterns 38a may be disposed on the same plane.

A first upper interlayer insulating layer 24 may be disposed on the semiconductor substrate 2 having the cell gate conductive structures GS1, GS2, and GS3, the insulating structure 23, and the third and fourth insulating patterns 20b and 22b.

Cell vertical structures CV may be disposed in the cell array area CA on the semiconductor pattern 14. The cell vertical structures CV may be disposed in the first impurity region LC of the semiconductor pattern 14. The cell vertical structures CV may pass through the first upper interlayer insulating layer 24, the cell gate conductive patterns 38a, and the cell interlayer insulating patterns 21 and may be connected to the first impurity region LC of the semiconductor pattern 14.

Each of the cell vertical structures CV may include a first dielectric 27, a cell semiconductor layer 28, a core insulating pattern 29, and a cell pad pattern 30. The cell pad pattern 30 may be disposed on the core insulating pattern 29. The cell pad pattern 30 may be formed of doped silicon. The cell pad pattern 30 may have N-type conductivity.

The cell semiconductor layer 28 may be disposed so as to surround a side surface and a bottom of the core insulating pattern 29. The cell semiconductor layer 28 may be formed of a material that may be used as a channel of a transistor, for example, silicon. The first dielectric 27 may be disposed outside the cell semiconductor layer 28. The cell semiconductor layer 28 may be interposed between the first dielectric 27 and the core insulating pattern 29.

A second dielectric 37 may be interposed between the cell vertical structures CV and the cell gate conductive patterns 38a.

Any one of the first and second dielectrics 27 and 37 may include a data storage layer that may store data. For example, the first dielectric 27 may include a tunnel dielectric layer and a data storage layer, which are sequentially formed from the cell semiconductor layer 28. The second dielectric 37 may include a blocking dielectric. The first and second dielectrics 27 and 37 may have the same structure as a dielectric between a control gate of a NAND flash memory device and a body of a cell transistor of the NAND flash memory device. However, the scope of the inventive concept is not limited to a structure of the NAND flash memory device and the inventive concept may be used for various memory devices.

A second upper interlayer insulating layer 32 may be disposed on the first upper interlayer insulating layer 24.

A plurality of cell source patterns 46 may be disposed on the semiconductor pattern 14 to cross the cell array area CA and extend into the first and third step areas ST1 and ST3. The cell source patterns 46 may be disposed on the second impurity regions 42, that is, the cell source impurity regions. The cell source patterns 46 may include a conductive material. The cell source patterns 46 may overlap and be electrically connected to the second impurity regions 42. The cell source patterns 46 may have a line shape which extends in a first direction X. The cell source patterns 46 may be sequentially arranged in a second direction Y perpendicular to the first direction X and parallel to each other.

The cell source patterns 46 may pass through the first and second upper interlayer insulating layers 24 and 32, vertically cross the cell gate conductive patterns 38a, and be connected to the second impurity regions 42 of the semiconductor pattern 14.

The cell source patterns 46 may include a first source pattern 46a, a second source pattern 46b, and a third source pattern 46c, which are sequentially arranged and spaced apart from each other to have different distances. For example, a distance between the adjacent first and second source patterns 46a and 46b may be greater than a distance between the adjacent second and third source patterns 46b and 46c.

The cell gate conductive patterns 38a may be interposed between the source patterns, which are selected from the source patterns 46 and arranged to have a relatively small distance, for example, the second and third source patterns 46b and 46c. The cell gate conductive patterns 38a may not be interposed between the source patterns, which are selected from the source patterns 46 and arranged to have a relatively large distance, for example, the first and second source patterns 46a and 46b, and the insulating structure 23 and the dummy gate conductive patterns 38b may be disposed therebetween.

A third upper interlayer insulating layer 48 may be disposed on the second upper interlayer insulating layer 32 and the cell source patterns 46. A fourth upper interlayer insulating layer 60 may be disposed on the third upper interlayer insulating layer 48.

A bit line contact structure 72 may be disposed to be electrically connected to the peripheral transistor PTR under the semiconductor pattern 14. The bit line contact structure 72 may pass through the cell array area CA in a vertical direction and may be electrically connected to the first peripheral contact pad PP1 of the first peripheral circuit area PC1 under the cell array area CA.

The peripheral bit line contact structure 72 may include a bit line lower contact plug 52 and a bit line upper contact plug 62 on the bit line lower contact plug 52. The bit line lower contact plug 52 may pass through the first to third upper interlayer insulating layers 24, 32, and 48, the insulating structure 23, the gap fill insulating layer 18, and a part of the lower interlayer insulating layer LILD which covers the first peripheral contact pad PP1, and may be electrically connected to the first peripheral contact pad PP1 of the first peripheral interconnection structure PW1 which is electrically connected to the peripheral transistor PTR. The bit line upper contact plug 62 may pass through the fourth upper interlayer insulating layer 60 and may be electrically connected to the bit line lower contact plug 52.

In an embodiment, as shown in FIG. 3C, the bit line lower contact plug 52 (shown in FIG. 3C) may include a plug metal layer 52b and a barrier metal layer 52a on a side surface of the plug metal layer 52b. For example, the plug metal layer 52b may include a metal material and the barrier metal layer 52a may include a metal nitride.

In an embodiment, as shown in FIG. 3C, an oxide spacer sp may be interposed between the bit line lower contact plug 52 (shown in FIG. 3C) and a contact hole H. The oxide spacer sp may be formed of silicon oxide.

Cell bit line plugs 68 may be disposed to be electrically connected to the cell vertical structures CV. The cell bit line plugs 68 may pass through the first to fourth upper interlayer insulating layers 24, 32, 48, and 60.

Cell gate contact structures 74 may be disposed to be electrically connected to the cell gate conductive patterns 38a. The cell gate contact structures 74 may be disposed in the first step area ST1.

Each of the cell gate contact structures 74 may include a cell gate lower contact structure 54 and a cell gate upper contact structure 64 on the cell gate lower contact structure 54.

The cell gate lower contact structure 54 may pass through the first to third upper interlayer insulating layers 24, 32, and 48 and may be electrically connected to the cell gate conductive patterns 38a. The cell gate upper contact structure 64 may pass through the fourth upper interlayer insulating layer 60 and may be electrically connected to the cell gate lower contact structure 54.

A cell body contact structure 73 may be disposed to be electrically connected to the cell body contact impurity region 50. The cell body contact structure 73 may include a cell body lower contact structure 53 and a cell body upper contact structure 63 on the cell body lower contact structure 53.

The cell body lower contact structure 53 may pass through the first to third upper interlayer insulating layers 24, 32, and 48 and the third and fourth insulating patterns 20b and 22b in step areas located in the second direction Y perpendicular to the cell source patterns 46, and may be connected to the semiconductor pattern 14. The cell body lower contact structure 53 and the peripheral bit line lower contact plug 52 may have lower surfaces which are located on different planes and upper surfaces located on the same plane. The cell body upper contact structure 63 may pass through the fourth upper interlayer insulating layer 60 and may be electrically connected to the cell body lower contact structure 53.

A peripheral body contact structure 75 may be disposed to be interposed between the semiconductor substrate 2 and the semiconductor pattern 14 and to be electrically connected to the third peripheral contact pad PP3 of the third peripheral interconnection structure PW3 which extends in the outside direction of the semiconductor pattern 14. The cell body contact structure 73 may be disposed on and may overlap the semiconductor pattern 14 and the peripheral body contact structure 75 may not overlap the semiconductor pattern 14. The peripheral body contact structure 75 may be disposed outside the semiconductor pattern 14.

The peripheral body contact structure 75 may include a peripheral body lower contact structure 55 and a peripheral body upper contact structure 65 on the peripheral body lower contact structure 55. The peripheral body lower contact structure 55 may pass through the first to third upper interlayer insulating layers 24, 32, and 48, the buffer insulating layer 10, and a part of the lower interlayer insulating layer LILD and may be electrically connected to the third peripheral contact pad PP3. The peripheral body upper contact structure 65 may pass through the fourth upper interlayer insulating layer 60.

An interconnection structure may be disposed on the fourth interlayer insulating layer 60. The interconnection structure may include cell conductive lines 80, word line interconnection structures 81, and body interconnection structures 82. The cell conductive lines 80 may be cell bit lines.

The cell conductive lines 80 may be disposed on the cell bit line contact plugs 68 and the peripheral bit line contact structure 72 and electrically connected to the cell bit line contact plugs 68 and the peripheral bit line contact structure 72.

The cell conductive lines 80, that is, the cell bit lines may each have a length smaller than a width of the semiconductor pattern 14. The cell conductive lines 80 may have a line shape which extends in the second direction Y. The width of the semiconductor pattern 14 may be a width of the second direction Y. The cell conductive lines 80 may overlap the semiconductor pattern 14. The cell conductive lines 80 may overlap the semiconductor pattern 14 and may be interposed between side surfaces of the semiconductor pattern 14 in a plan view.

As shown in FIG. 2B, the word line interconnection structures 81 may each include a lower word line interconnection 81*a*, a upper word line interconnection 81*b*, and a word line interconnection contact plug 81*c* between the lower and upper word line interconnections 81*a* and 81*b*. The lower word line interconnection 81*a* (shown in FIG. 2B) may have a line shape of the second direction Y perpendicular to the cell gate conductive structures GS1, GS2, and GS3 and the upper word line interconnection 81*b* (shown in FIG. 2B) may have a line shape perpendicular to the lower word line interconnection 81*a*. The upper word line interconnection 81*b* (shown in FIG. 2B) may extend from the first step area ST1 in the outside direction of the semiconductor pattern 14.

In the outside of the semiconductor pattern 14, a peripheral word line contact structure 77 may be interposed between the word line interconnection structure 81 and the second peripheral contact pad PP2 of the second peripheral interconnection structure PW2 of the second peripheral circuit area PC.

The body interconnection structures 82 may be electrically connected to the cell body contact structure 73 and the peripheral body contact structure 75.

In an embodiment, the bit line lower contact plug 52 may have an upper surface disposed on the same plane as an upper surface of the body lower contact plug 53.

In an embodiment, the bit line lower contact plug 52 may have an upper surface located at a level higher than the cell vertical structures CV and the source patterns 46. However, the scope of the inventive concept is not limited thereto.

Figure 4A:
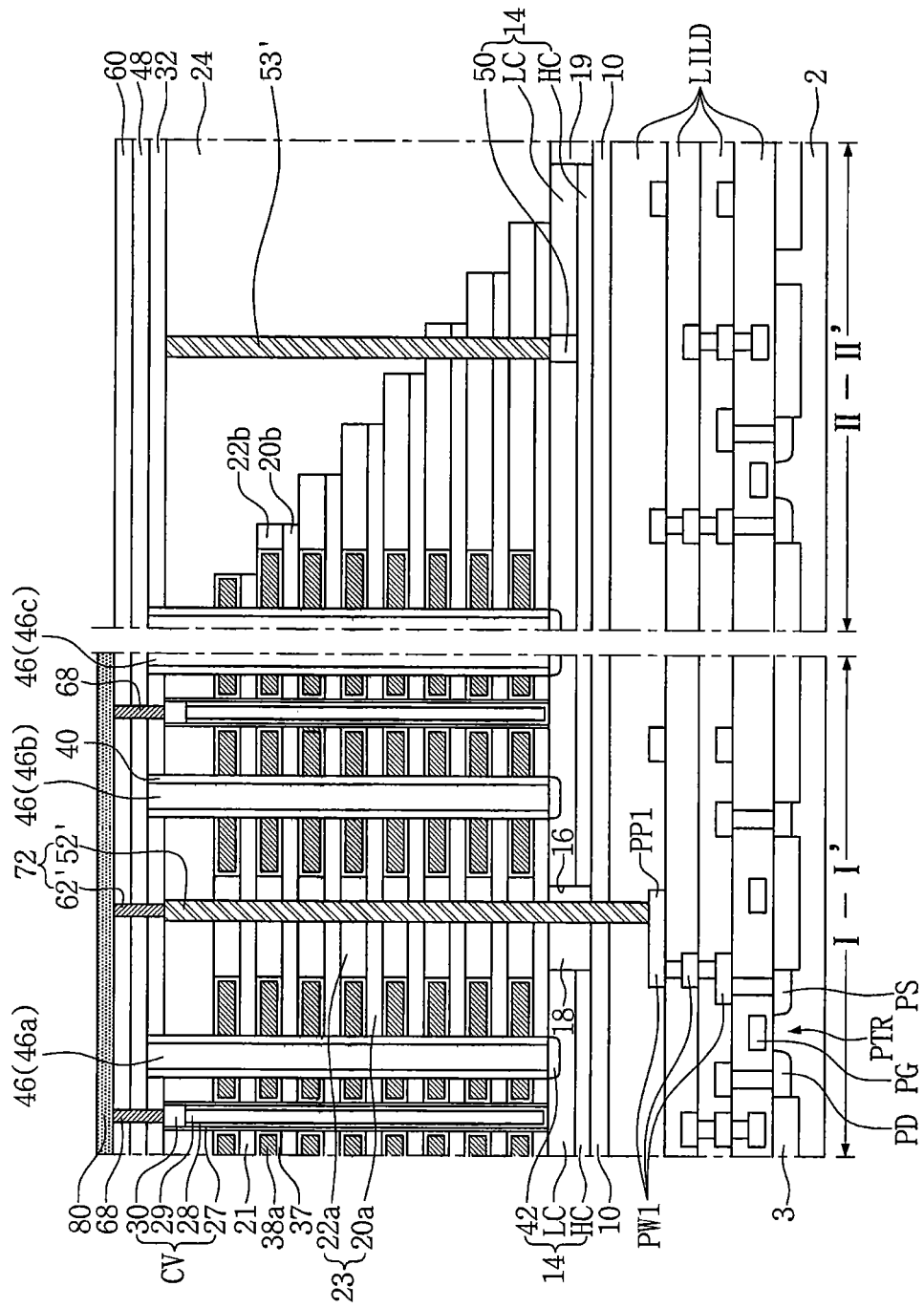
FIGS. 4A and 4B are cross-sectional views showing a semiconductor device in accordance with an embodiment of the inventive concept.
Figure 4B:
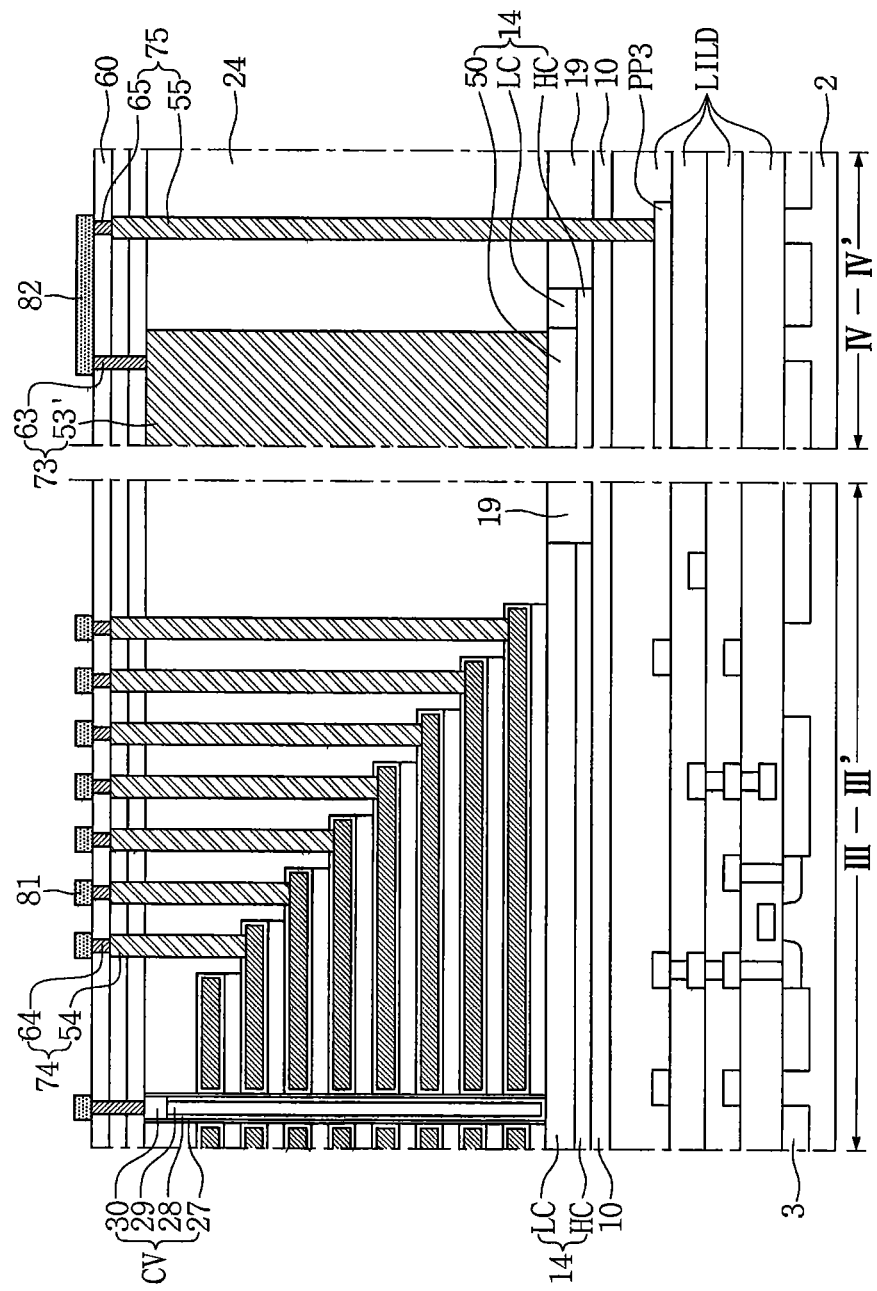

In an embodiment, as shown in FIGS. 4A and 4B, a bit line lower contact plug 52' and a body lower contact plug 53' may be disposed to have upper surfaces which are disposed on the same plane as upper surfaces of the cell vertical structures CV and are located at a level lower than upper surfaces of the source patterns 46.

Figure 5A:
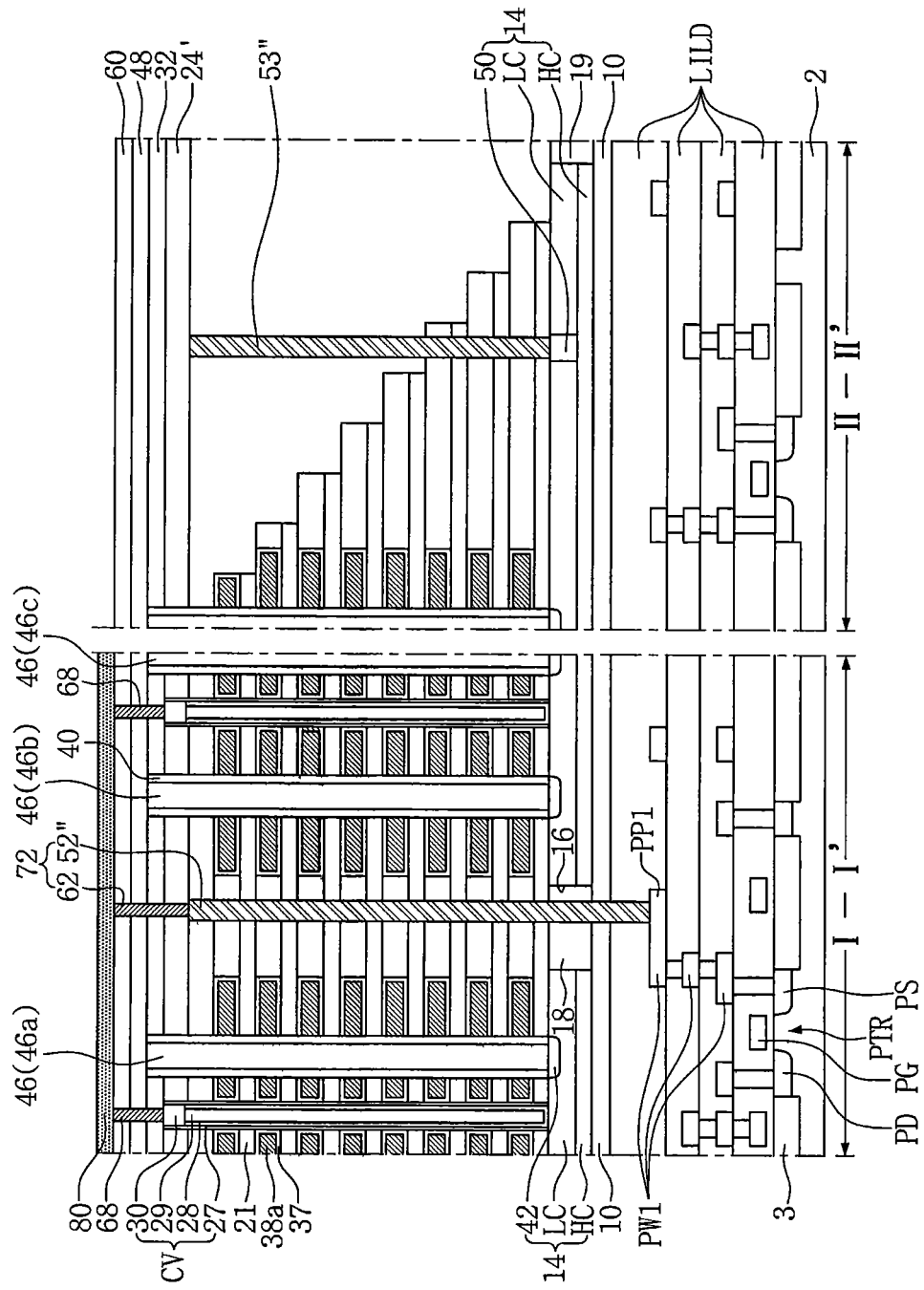
FIGS. 5A and 5B are cross-sectional views showing a semiconductor device in accordance with an embodiment of the inventive concept.
Figure 5B:
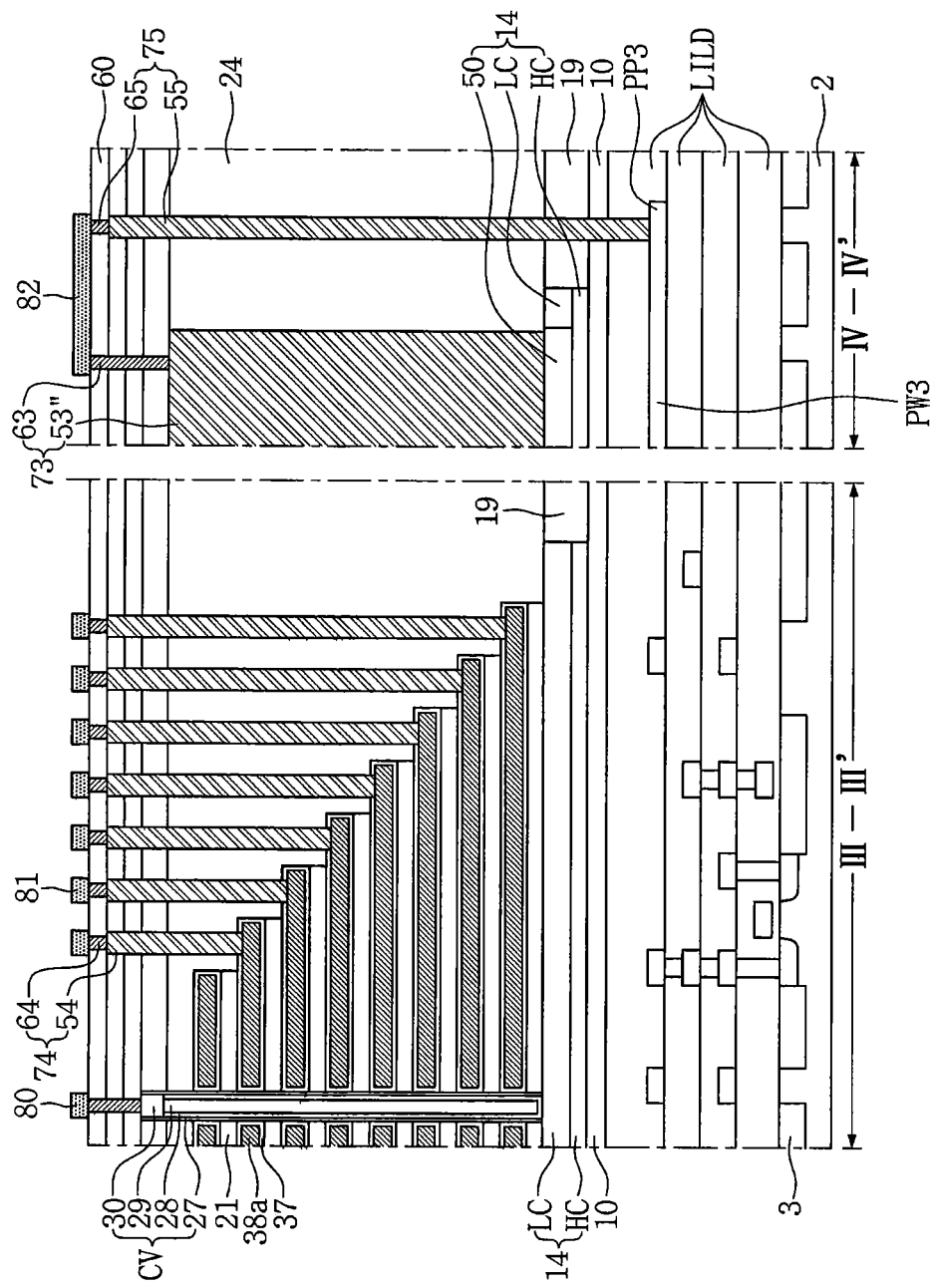

In an embodiment, as shown in FIGS. 5A and 5B, a bit line lower contact plug 52" and a body lower contact plug 53" may be disposed to have upper surfaces located at a level lower than the upper surfaces of the cell vertical structures CV and the source patterns 46.

The opening 16 of the semiconductor pattern 14 may be formed in a rectangular shape inside the semiconductor pattern 14. However, the scope of the inventive concept is not limited thereto.

Figure 6:
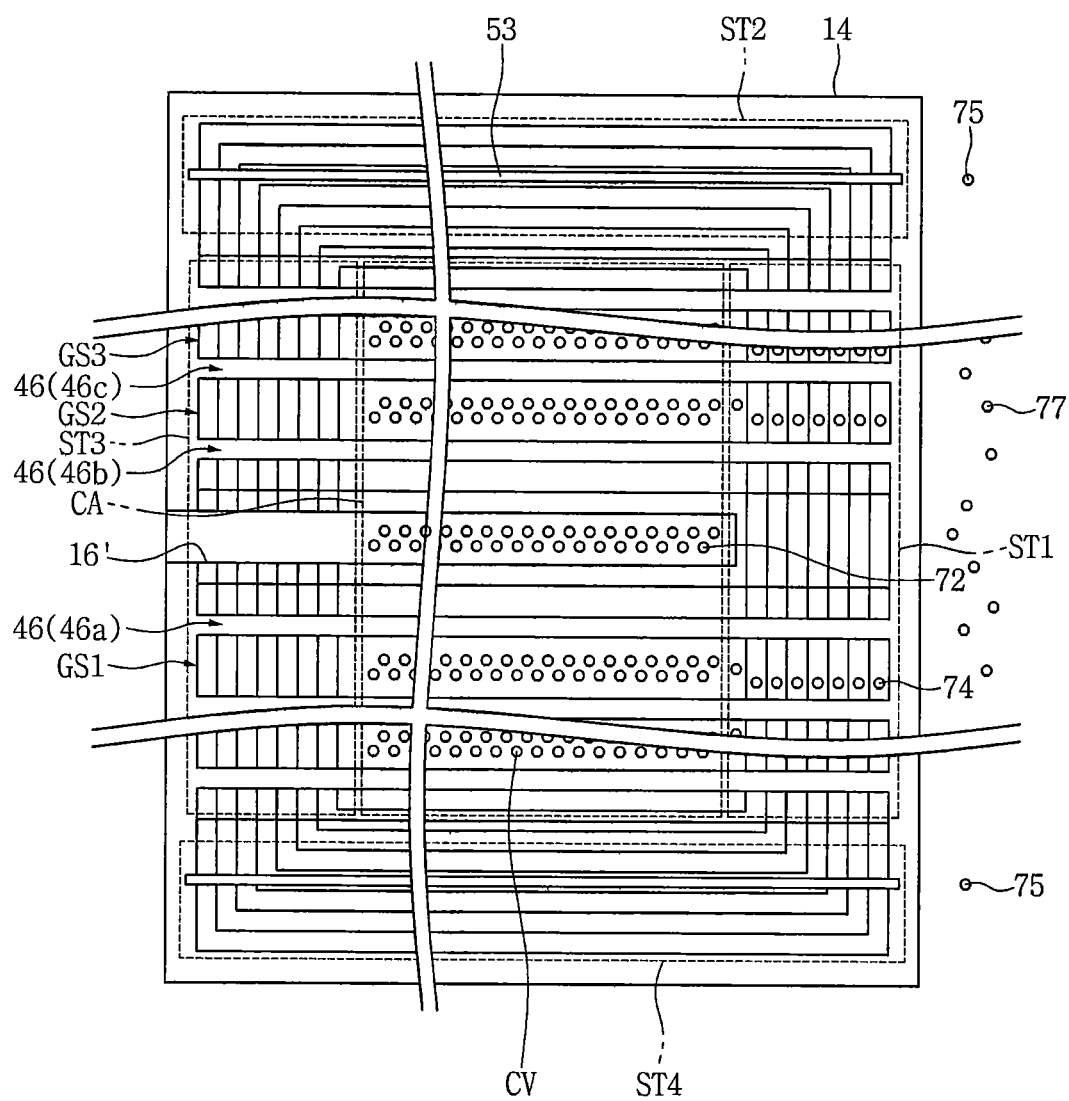
FIGS. 6 and 10 are plan views showing semiconductor devices in accordance with embodiments of the inventive concept.

In an embodiment, referring to FIG. 6, the semiconductor pattern 14 (shown in FIG. 6) may have an opening 16' having a shape which crosses the cell array area CA and crosses any one step area. ST3 of the first and third step areas ST1 and ST3.

Figure 7:
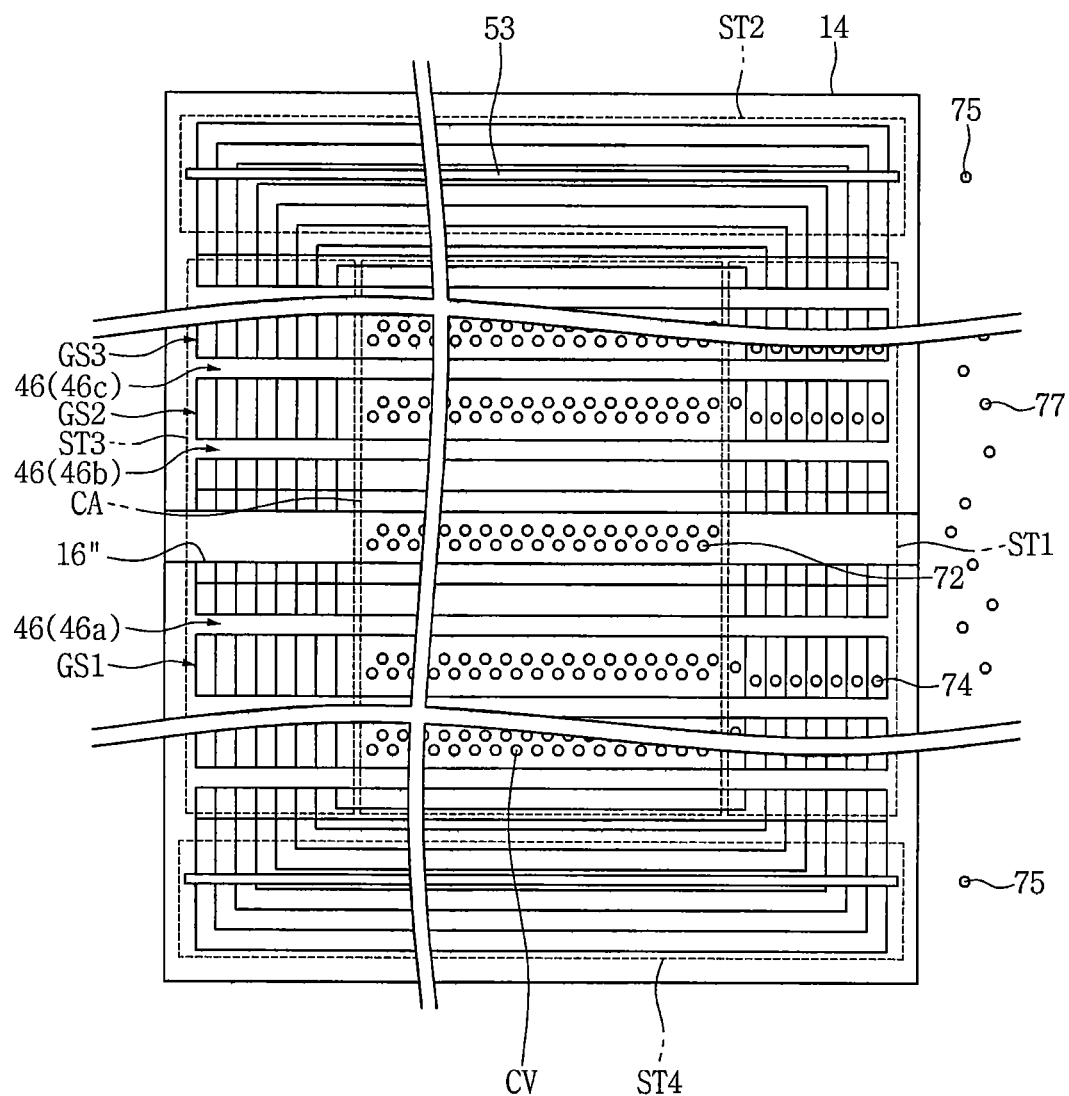

In an embodiment, referring to FIG. 7, the semiconductor pattern 14 (shown in FIG. 7) may have an opening 16" of a shape which crosses the cell array area CA and crosses all the first and third step areas ST1 and ST3. Therefore, the semiconductor pattern 14 (shown in FIG. 7) may be configured of two patterns spaced apart from each other.

Figure 8:
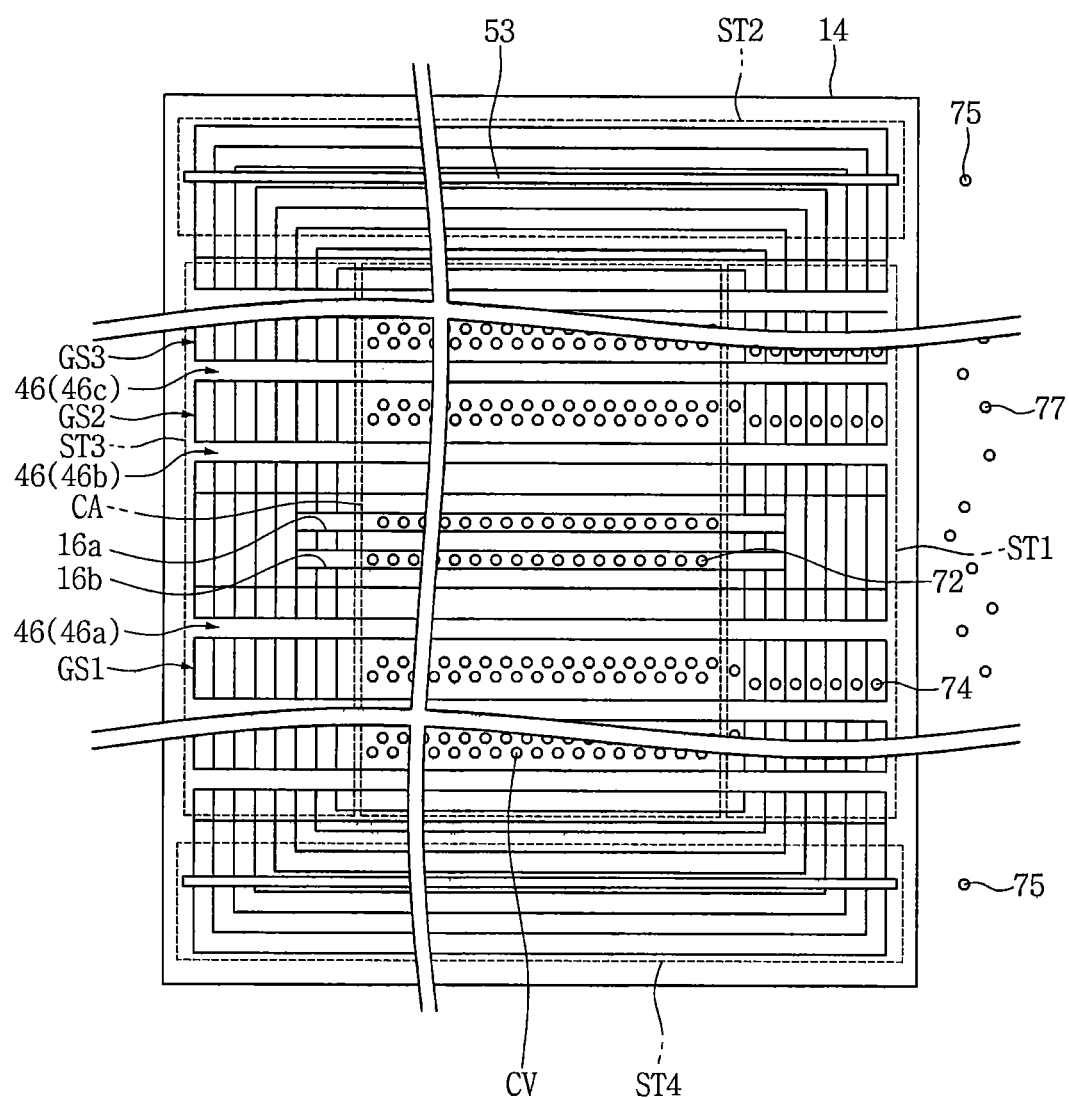

In an embodiment, referring to FIG. 8, the semiconductor pattern 14 (shown in FIG. 8) may have a plurality of openings 16*a* and 16*b* which cross the cell array area CA.

Figure 9:
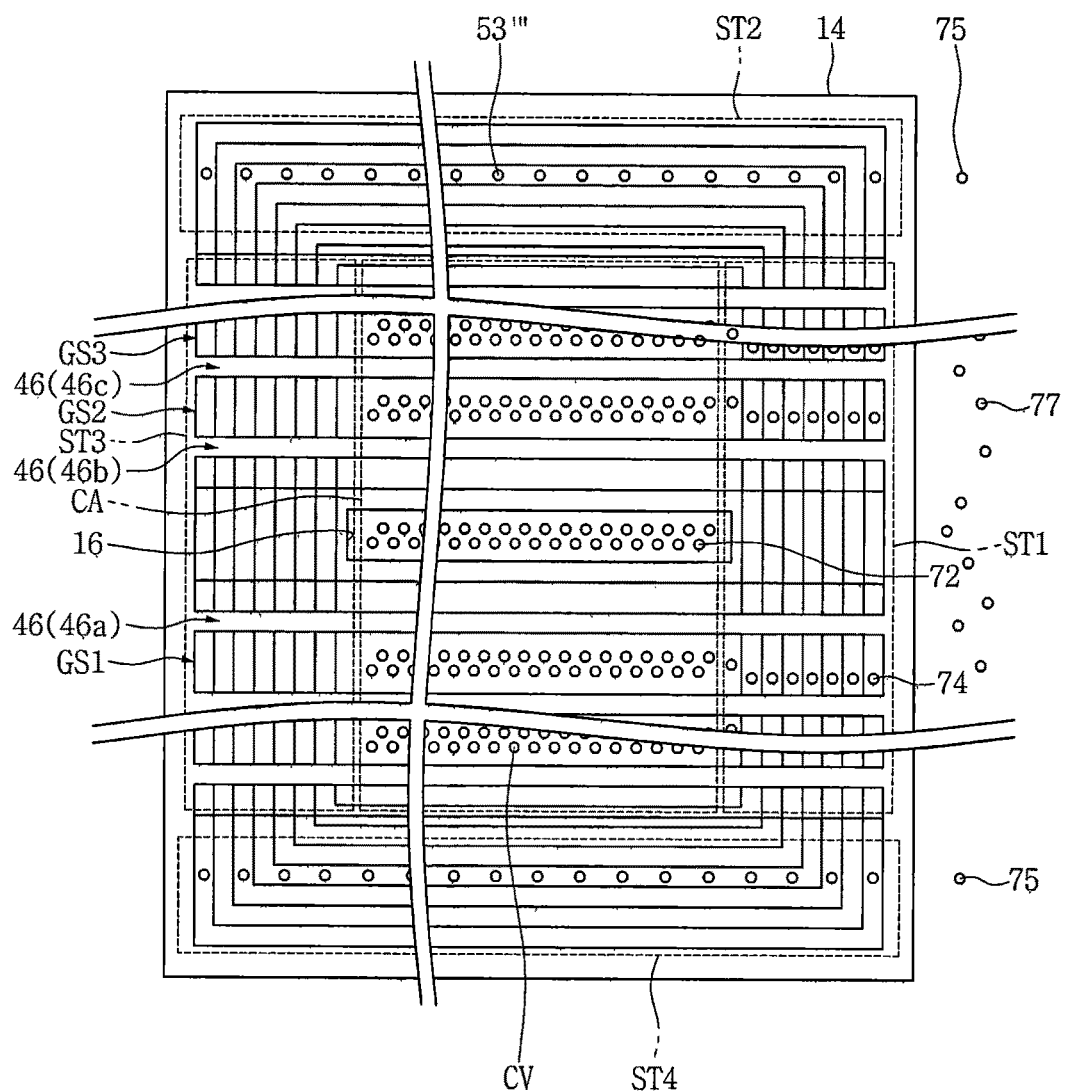
Figure 10:
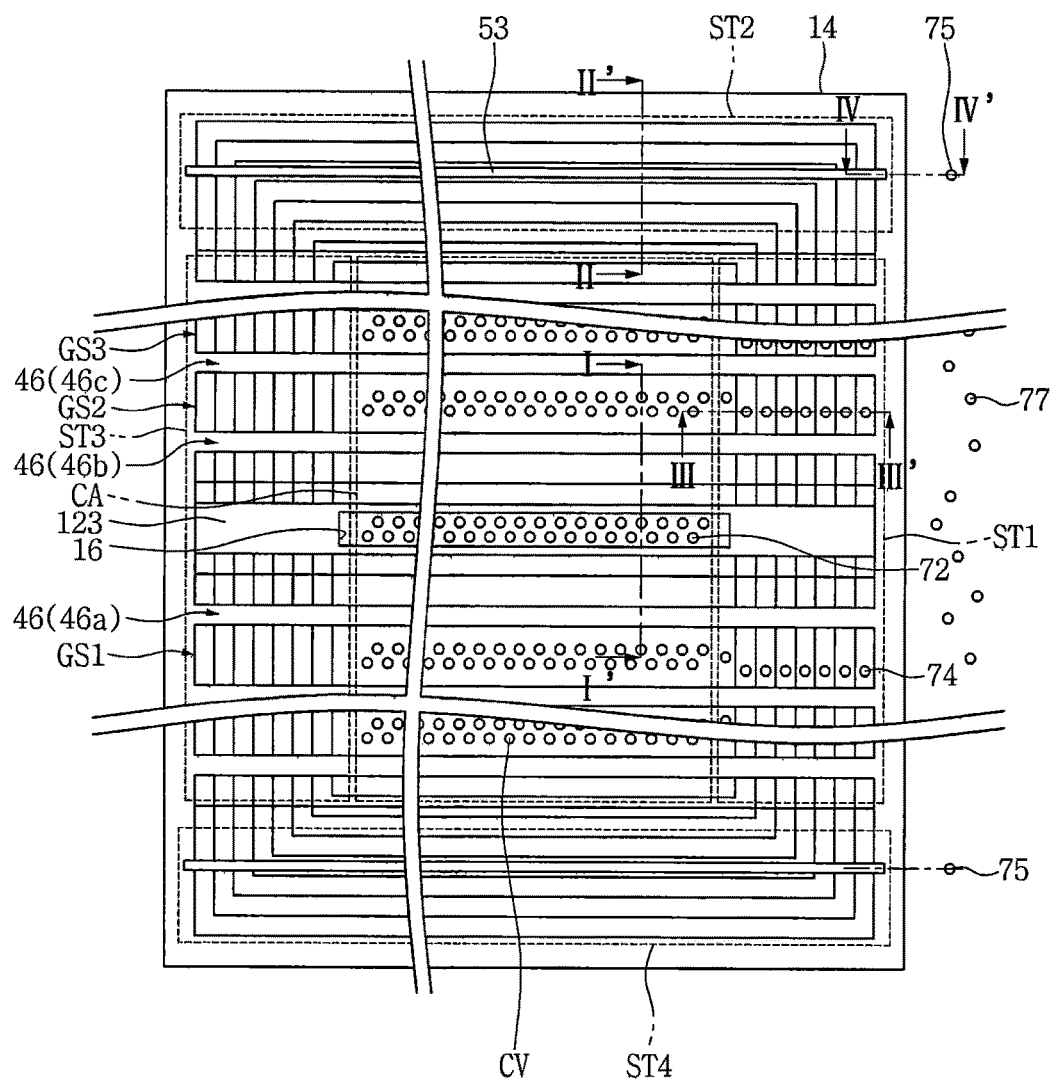
Figure 11A:
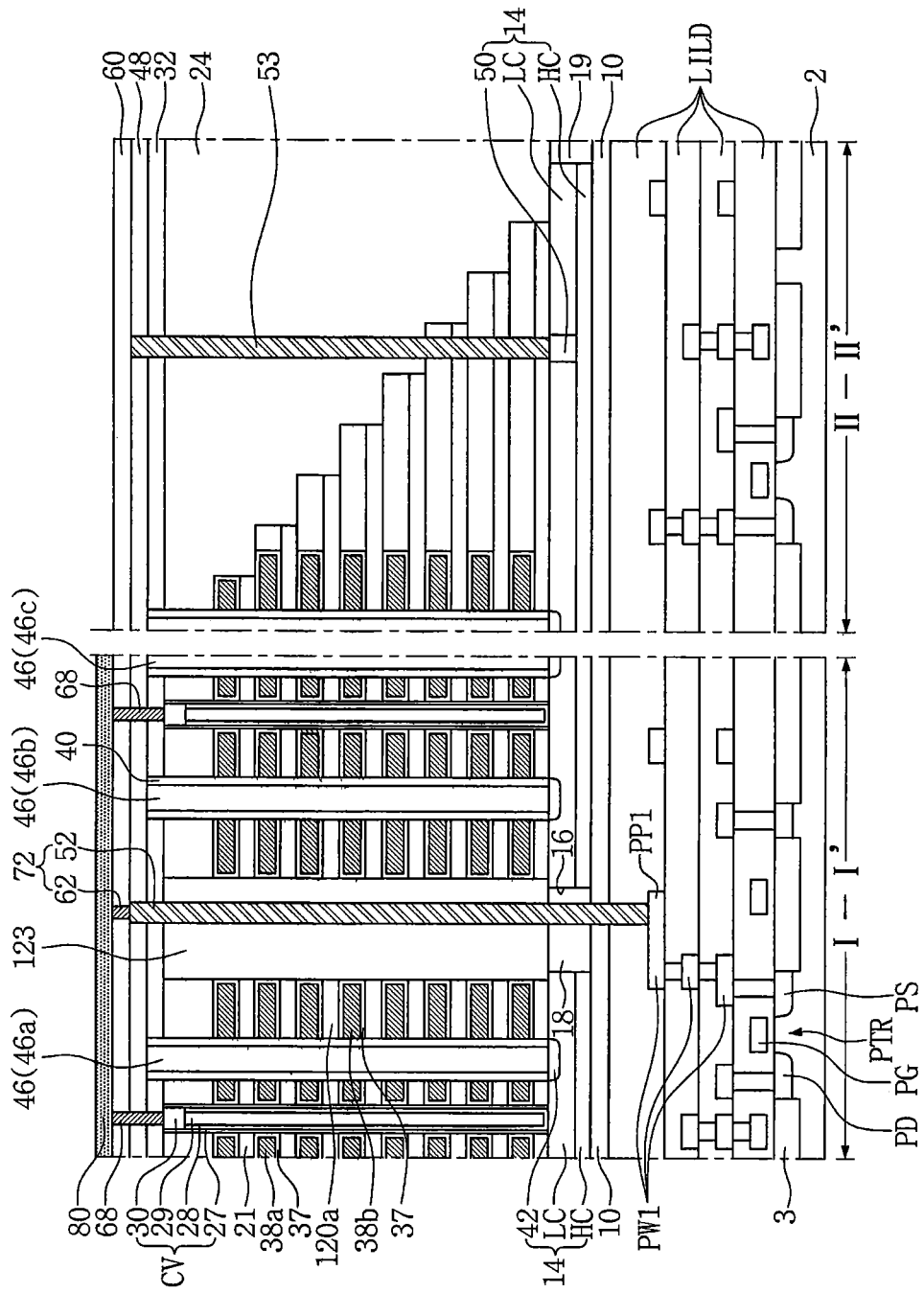
FIGS. 11A and 11B are cross-sectional views showing a semiconductor device in accordance with an embodiment of the inventive concept.
Figure 11B:
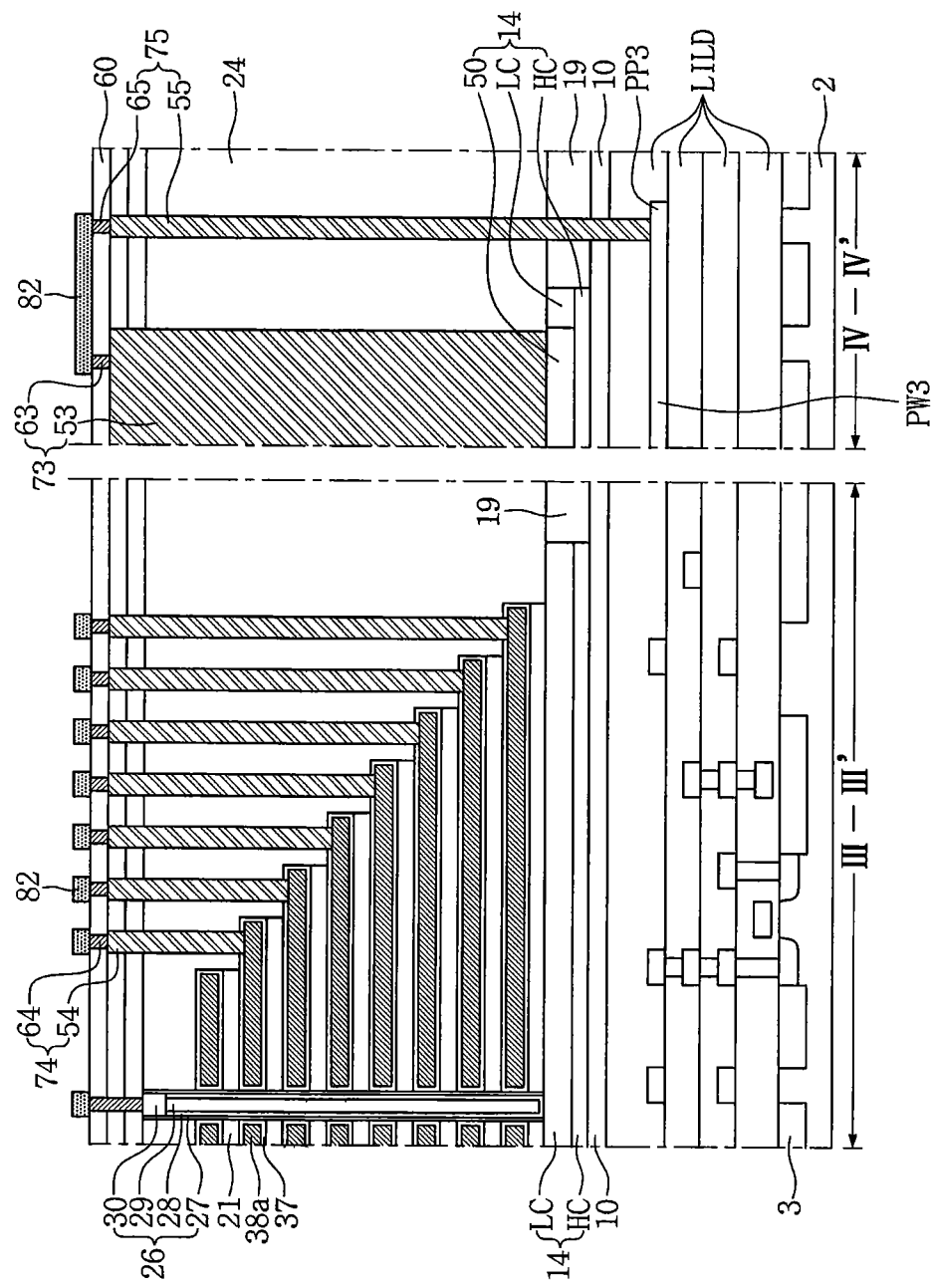

The cell body lower plug 53 may be formed in a line shape. However, the scope of the inventive concept is not limited thereto. For example, cell body lower plugs 53''' (shown in FIG. 9) may be disposed to be formed in a shape of a plurality of dots.

A semiconductor device in accordance with an embodiment of the inventive concept will be described with reference to FIGS. 1, 10, 11A, and 11B.

Referring to FIGS. 1, 10, 11A, and 11B, as described in FIGS. 2A, 2B, 3A, and 3B, the peripheral circuit areas PC1, PC2, and PC3 may be disposed on the semiconductor substrate 2, the semiconductor pattern 14 having the opening 16 may be disposed in the peripheral circuit areas PC1, PC2, and PC3, and the cell array area CA and the first to fourth step areas ST1 to ST4 may be disposed on the semiconductor pattern 14.

As described in FIGS. 2A, 2B, 3A, and 3B, the cell vertical structures CV, the cell gate conductive patterns 38*a*, and the source patterns 46 may be disposed on the semiconductor pattern 14 and the cell interlayer insulating patterns 21 may be interposed between the cell gate conductive patterns 38*a*.

The first to fourth upper interlayer insulating layers 24, 32, 48, and 60 such as those described in FIGS. 2A, 2B, 3A, and 3B may be disposed.

An insulating structure 123 may be interposed between the first and second source patterns 46*a* and 46*b*, which are selected from the source patterns 46 and relatively and widely spaced apart from each other. The insulating structure 123 may be disposed on the opening 16 of the semiconductor pattern 14. The insulating structure 123 may be formed of silicon oxide.

First insulating patterns 120*a* may be disposed on a side surface of the insulating structure 123. The first insulating patterns 120*a* and the cell interlayer insulating patterns 21 may be disposed on the same plane and formed of the same material, for example, silicon oxide.

Dummy gate conductive patterns 38*b* may be disposed to be disposed on the side surface of the insulating structure 123 and between the first insulating patterns 120*a*. A second dielectric 37 may be interposed between the dummy gate conductive patterns 38*b* and the insulating structure 123 and between the dummy gate conductive patterns 38*b* and the first insulating patterns 120*a*. The insulating structure 123 may be disposed to have a structure which passes through between the first insulating patterns 120*a* and the dummy gate conductive patterns 38*b*.

As described in FIGS. 2A, 2B, 3A, and 3B, the bit line contact structure 72 which is electrically connected to the peripheral transistor PTR under the semiconductor pattern 14, the cell bit line plugs 68 which are electrically connected to the cell vertical structures CV, the cell gate contact structures 74 which are electrically connected to the cell gate conductive patterns 38a, the cell body contact structure 73 which is electrically connected to the cell body contact impurity region 50, and the peripheral body contact structure 75 which is electrically connected to the third peripheral contact pad PP3 which extends from the third peripheral interconnection structure PW3 under the semiconductor pattern 14 to the outside of the semiconductor pattern 14 may be disposed.

As described in FIGS. 2A, 2B, 3A, and 3B, the peripheral bit line contact structure 72 may include the bit line lower contact plug 52 and the bit line upper contact plug 62 on the bit line lower contact plug 52. The bit line lower contact plug 52 may pass through the first to third upper interlayer insulating layers 24, 32, and 48, the insulating structure 123, the gap fill insulating layer 18, and a part of the lower interlayer insulating layer LILD which covers the first peripheral contact pad PP1 and may be electrically connected to the first peripheral contact pad PP1 which is electrically connected to the peripheral transistor PTR.

The cell conductive lines 80, that is, the cell bit lines, the word line interconnection structures 81, and the body interconnection structures 82 such as those described in FIGS. 2A, 2B, 3A, and 3B may be disposed.

A semiconductor device in accordance with an embodiment of the inventive concept will be described with reference to FIGS. 12, 13A, 13B, 14A, and 14B.

Figure 12:
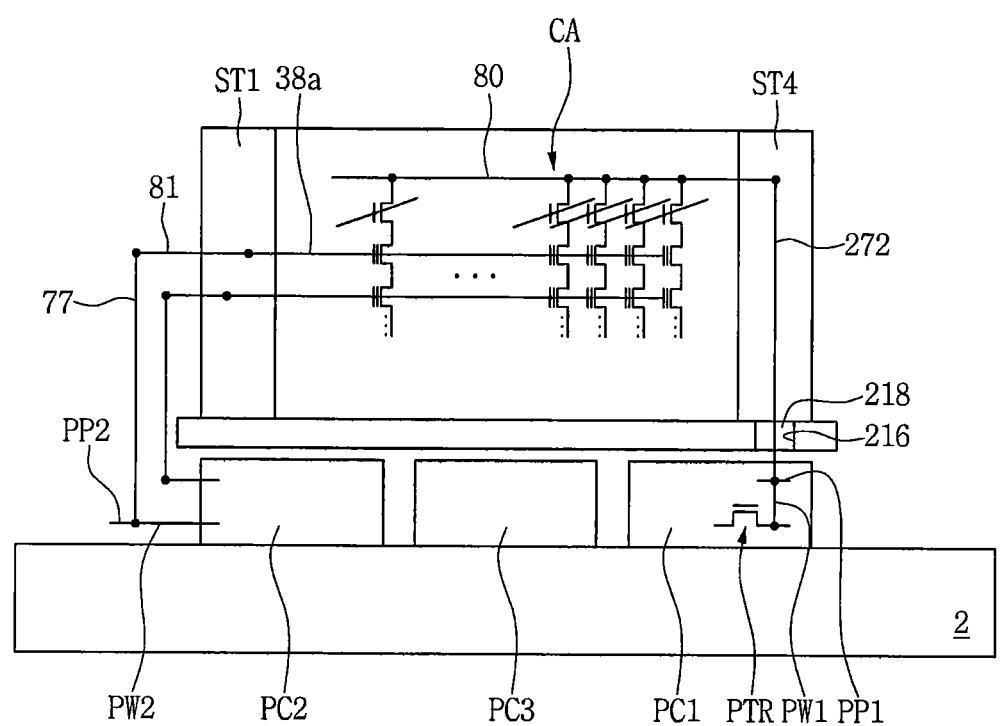
FIG. 12 is a conceptual view showing a semiconductor device in accordance with the embodiment of the inventive concept.
Figure 13A:
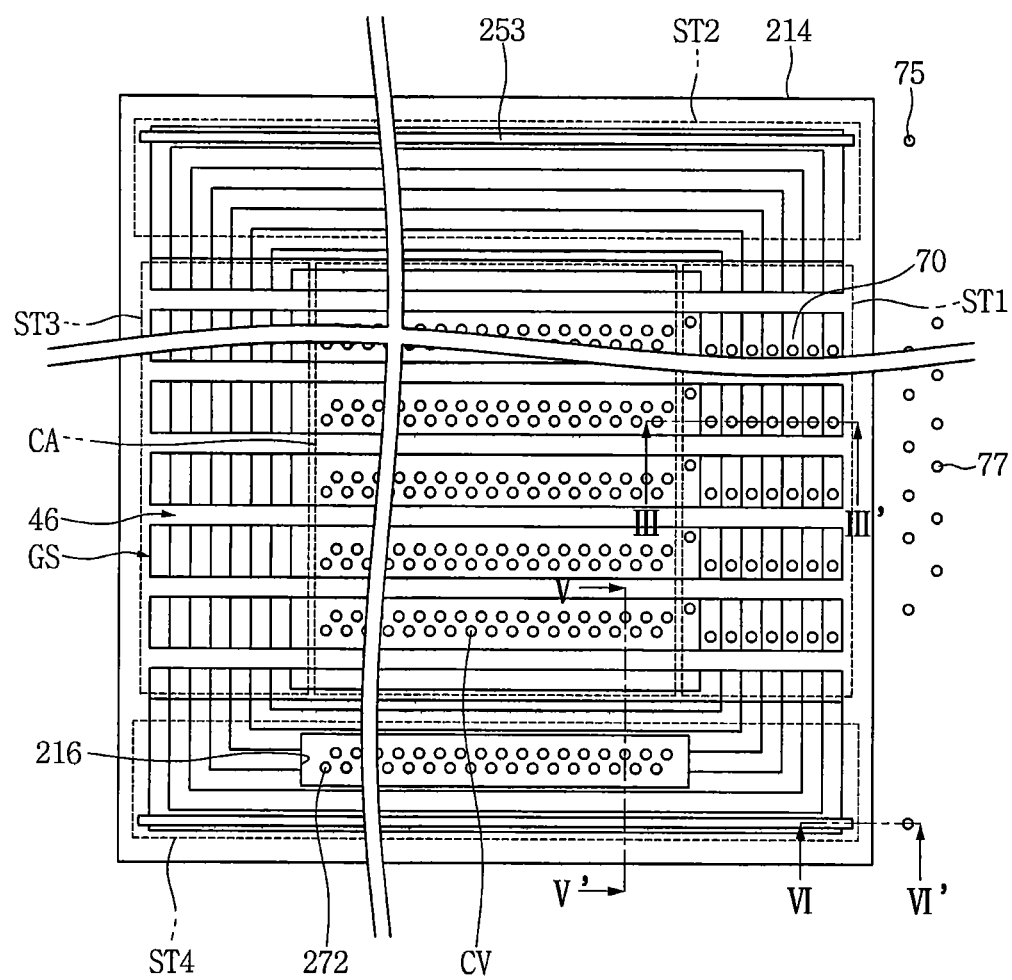
FIGS. 13A and 13B are plan views showing a semiconductor device in accordance with the embodiment of the inventive concept.
Figure 13B:
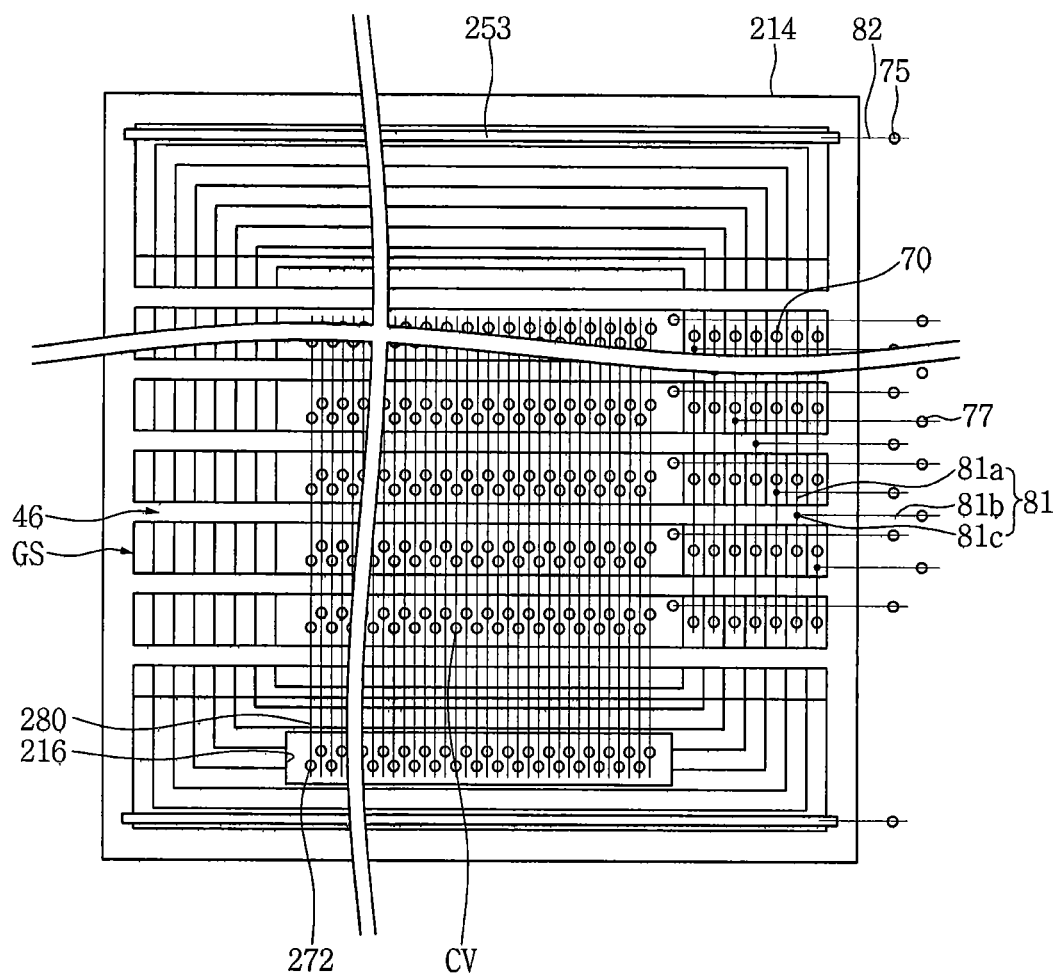

FIG. 12 is a conceptual view showing the semiconductor device in accordance with the embodiment of the inventive concept. FIGS. 13A and 13B are plan views showing the semiconductor device in accordance with the embodiment of the inventive concept. FIG. 13B is a plan view in which interconnection structures are added to the drawing of FIG. 13A in order to avoid complexity of the drawing. A part indicated by line III-III' of FIG. 13A may correspond to a part indicated by line III-III' of FIG. 2A. A cross-sectional shape of the part indicated by line of FIG. 13A may be substantially the same as a cross-sectional shape of the part indicated by line III-III' of FIG. 3B. Therefore, since the cross-sectional shape of the part indicated by line III-III' of FIG. 13A corresponds to the cross-sectional shape of the part indicated by line III-III' of FIG. 3B, the cross-sectional shape of the part indicated by line III-III' of FIG. 3B will be referred in below the drawings and descriptions in order to avoid duplication of the drawings.

Figure 14:
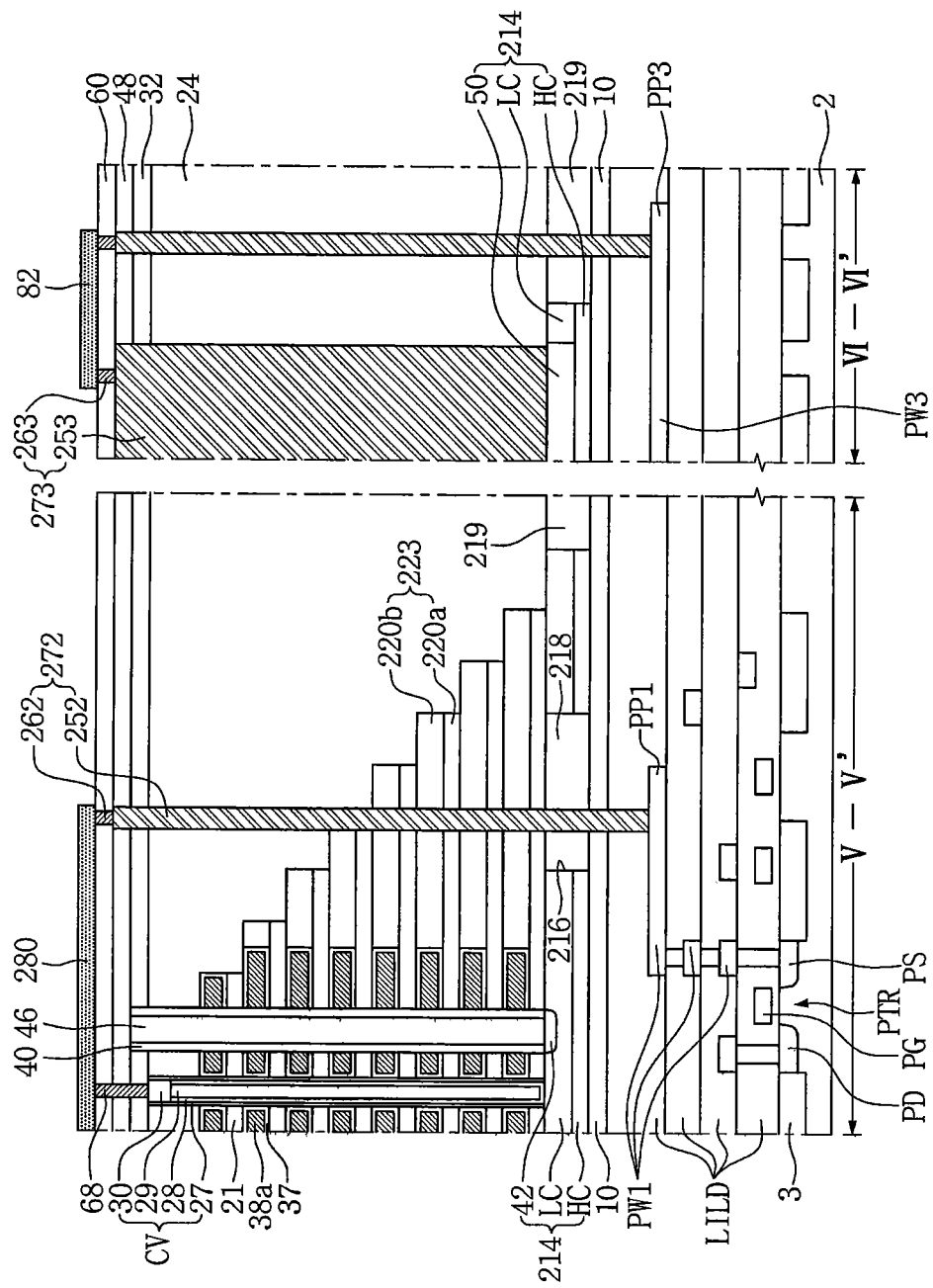
FIG. 14 is a cross-sectional view showing a semiconductor device in accordance with an embodiment of the inventive concept.

FIG. 14 is a cross-sectional view showing areas taken along lines V-V' and VI-VI' of FIG. 13A.

Referring to the part indicated by line III-III' of FIG. 3B and FIGS. 12, 13A, 13B, and 14, a peripheral circuit area may be disposed on a semiconductor substrate 2. The peripheral circuit area may include a first peripheral circuit area PC1, a second peripheral circuit area PC2, and a third peripheral circuit area PC3. The first peripheral circuit area PC1 may include a page buffer circuit. As described in FIGS. 1, 2A, 2B, 3A, and 3B, the first peripheral circuit area PC1 may include a peripheral transistor PTR that may configure a peripheral circuit and a first peripheral interconnection structure PW1 which is electrically connected to the peripheral transistor PTR. The first peripheral interconnection structure PW1 may include a first peripheral contact pad part PP1.

A lower interlayer insulating layer LILD may be disposed to cover the first to third peripheral circuit areas PC1, PC2, and PC3 of the semiconductor substrate 2. The lower interlayer insulating layer LILD may be formed of an insulating material including silicon oxide. The first peripheral interconnection structure PW1 and the first peripheral contact pad part PP1 of the first peripheral interconnection structure PW1 may be covered by the lower interlayer insulating layer LILD.

A buffer insulating layer 10 may be disposed on the lower interlayer insulating layer LILD. The buffer insulating layer 10 may have an etch selectivity different from a part of the lower interlayer insulating layer LILD being in contact with the buffer insulating layer 10.

A semiconductor pattern 214 having an opening 216 may be disposed on the buffer insulating layer 10. The semiconductor pattern 214 may be formed of polysilicon.

The semiconductor pattern 214 may include a first impurity region LC having a first conductivity type, a second impurity region 42 having a conductivity type different from the first conductivity type, a cell body contact impurity region 50, which has the first conductivity type and an impurity concentration higher than the first impurity region LC, and a third impurity region HC, which has the first conductivity type and an impurity concentration higher than the first impurity region LC and is disposed under the first impurity region LC. The first impurity region LC may be referred to as a low concentration impurity region, the second impurity region 42 may be referred to as a cell source impurity region, and the third impurity region FTC may be referred to as a high concentration impurity region. In an embodiment, the first impurity region LC, the third impurity region HC, and the cell body contact impurity region 50 may have P-type conductivity and the second impurity region 42 may have N-type conductivity.

A gap fill insulating layer 218 may be disposed in the opening 216 of the semiconductor pattern 214. An intermediate interlayer insulating layer 219 may be disposed on a side surface of the semiconductor pattern 214. The gap fill insulating layer 218 and the intermediate interlayer insulating layer 219 may be formed of silicon oxide.

A cell array area CA and step areas ST1, ST2, ST3, and ST4 may be disposed on the semiconductor pattern 214. The step areas ST1, ST2, ST3, and ST4 may include the first and third step areas ST1 and ST3 facing each other in which the cell array area CA is interposed therebetween and the second and fourth step areas ST2 and ST4 facing each other in which the cell array area CA is interposed therebetween, in a plan view. The first and third step areas ST1 and ST3 may be interposed between the second and fourth step areas ST2 and ST4.

The opening 216 of the semiconductor pattern 214 and the gap fill insulating layer 218 may not overlap the cell array area CA. The opening 216 of the semiconductor pattern 214 and the gap fill insulating layer 218 may be disposed under any one step area of the second and fourth step areas ST2 and ST4, for example, the fourth step area ST4.

Cell gate conductive structures GS may be disposed on the semiconductor pattern 214. The cell gate conductive structures GS may be disposed in the cell array area CA and may extend to the first and third step areas ST1 and ST3. The cell gate conductive structures GS may be spaced apart from each other to have a regular distance. Each of the cell gate conductive structures GS may include cell gate conductive patterns 38a stacked in a vertical direction on the semiconductor pattern 214. The cell gate conductive patterns 38a may be formed to have a step structure in the first and third step areas ST1 and ST3. Cell interlayer insulating patterns 21 may be interposed between the cell gate conductive patterns 38a.

An insulating structure 3 may be disposed in any one step area of the second and fourth step areas ST2 and ST4 on the semiconductor pattern 214, for example, the fourth step area ST4.

The insulating structure 223 may include first insulating patterns 220a and second insulating patterns 220b, which are alternately and repeatedly stacked to have a step structure. The step structure may be gradually lowered in a direction further away from the cell array area CA.

The first insulating patterns 220a and the cell interlayer insulating patterns 21 may be disposed on the same plane and formed of the same material. The second insulating patterns 220b and the cell gate conductive patterns 38a may be disposed on the same plane. The insulating structure 223 may be disposed on the opening 216 of the semiconductor pattern 214.

A first upper interlayer insulating layer 24 may be disposed on the semiconductor substrate 2 having the cell gate conductive structures GS, the cell interlayer insulating patterns 21, and the insulating structure 223.

Cell vertical structures CV may be disposed in the cell array area CA on the semiconductor pattern 214. The cell vertical structures CV may be disposed in the first impurity region LC of the semiconductor pattern 214. The cell vertical structures CV may pass through the first upper interlayer insulating layer 24, the cell gate conductive patterns 38a, and the cell interlayer insulating patterns 21 and may be connected to the first impurity region LC of the semiconductor pattern 214.

Each of the cell vertical structures CV may include the first dielectric 27, the cell semiconductor layer 28, the core insulating pattern 29, and the cell pad pattern 30 such as those described in FIGS. 2A, 3A, and 3B.

As described in FIGS. 2A, 3A, and 3B, a second dielectric 37 may be interposed between the cell vertical structures CV and the cell gate conductive patterns 38a and any one of the first and second dielectrics 27 and 37 may include a data storage layer that may store data.

A second upper interlayer insulating layer 32 may be disposed on the first upper interlayer insulating layer 24. A plurality of cell source patterns 46 may be disposed on the semiconductor pattern 214 to cross the cell array area CA and to extend into the first and third step areas ST1 and ST3. The source patterns 46 may be disposed on the second impurity regions 46 and may be electrically connected to the second impurity regions 46. The cell source patterns 46 may be parallel to each other. The cell source patterns 46 may pass through the first and second upper interlayer insulating layers 24 and 32, may vertically cross the cell gate conductive patterns 38a, and be connected to the second impurity regions 42 of the semiconductor pattern 214.

A third upper interlayer insulating layer 48 may be disposed on the second upper interlayer insulating layer 32 and the cell source patterns 46. A fourth upper interlayer insulating layer 60 may be disposed on the third upper interlayer insulating layer 48.

A bit line contact structure 272 may be disposed to pass through the fourth step area ST4 and the semiconductor pattern 214 under the fourth step area ST4 and to be electrically connected to the peripheral transistor PTR under the semiconductor pattern 214.

The bit line contact structure 272 may include a bit line lower contact plug 252 and a bit line upper contact plug 262 on the bit line lower contact plug 252.

The bit line lower contact plug 252 may pass through the first to third upper interlayer insulating layers 24, 32, and 48, the insulating structure 223, the gap fill insulating layer 218 in the opening 216, and a part of the lower interlayer insulating layer LILD which covers the first peripheral contact pad PP1, and may be electrically connected to the first peripheral contact pad PP1 which is electrically connected to the peripheral transistor PTR. The bit line upper contact plug 262 may pass through the fourth upper interlayer insulating layer 60 and be electrically connected to the bit line lower contact plug 252.

The cell bit line plugs 68, the cell gate contact structures 74, the cell body contact structure 73, and the peripheral body contact structure 75 such as those described in FIGS. 2A, 3A, and 3B may be disposed.

Cell conductive lines, for example, bit lines 280, may be disposed on the fourth interlayer insulating layer 60. The bit lines 280 may overlap the cell bit line contact plugs 68 and the bit line contact structure 272 and may be electrically connected to the cell bit line contact plugs 68 and the bit line contact structure 272. The bit lines 280 may extend from the cell array area CA to the fourth step area ST4.

The word line interconnection structures 81 and the body interconnection structures 82 such as those described in FIGS. 2A, 3A, and 3B may be disposed on the fourth interlayer insulating layer 60.

In an embodiment, the bit line lower contact plug 252 may have an upper surface disposed on the same plane as the upper surface of the body lower contact plug 53.

In an embodiment, the bit line lower contact plug 252 may have an upper surface located at a level higher than the cell vertical structures CV and the source patterns 46. However, the scope of the inventive concept is not limited thereto.

Figure 15:
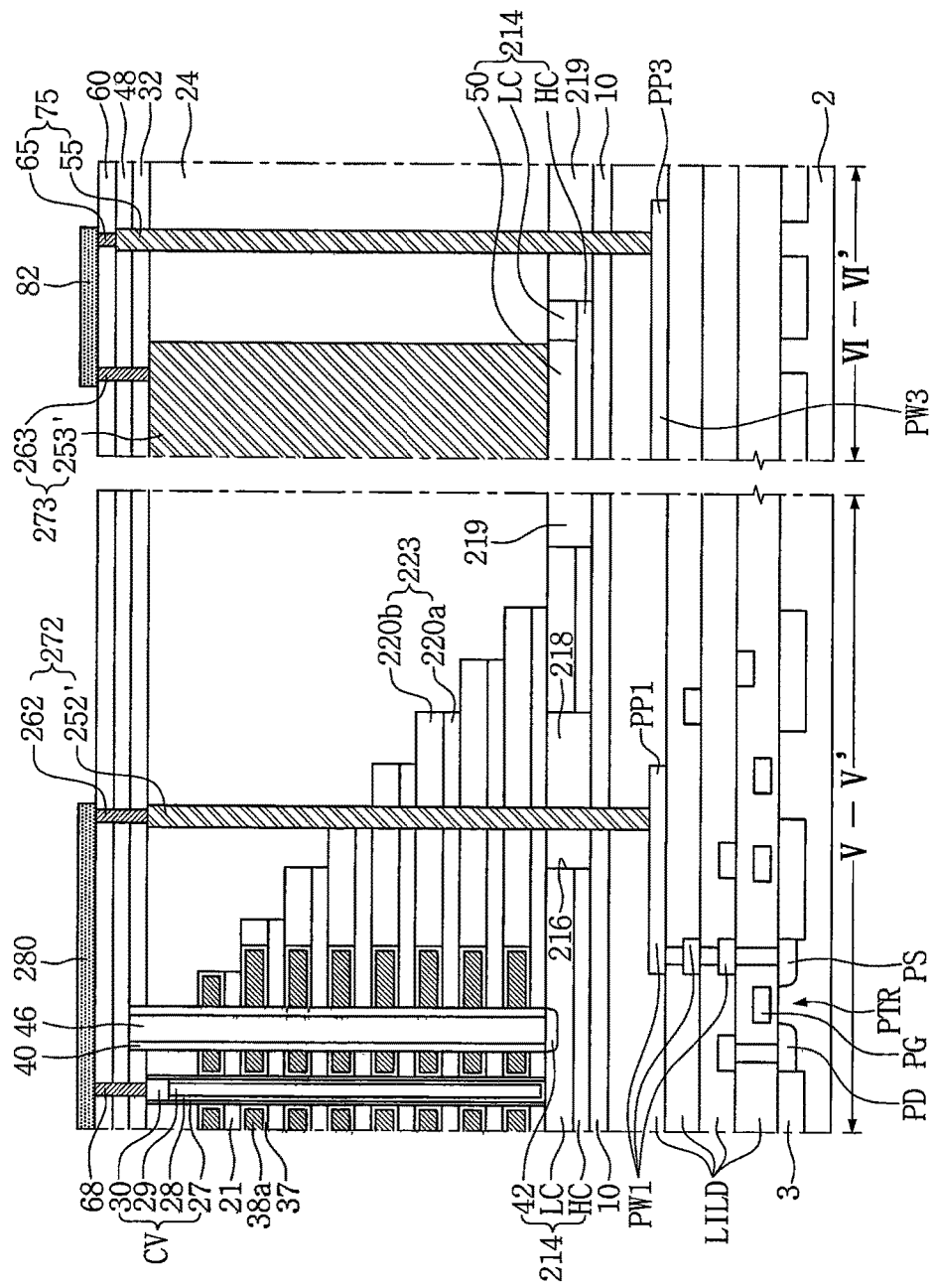
FIG. 15 is a cross-sectional view showing a semiconductor device in accordance with an embodiment of the inventive concept.

In an embodiment, as shown in FIG. 15, a bit line lower contact plug 252' and a body lower contact plug 253' may be disposed to be disposed on the same plane as the upper surfaces of the cell vertical structures CV and to have upper surfaces located at a level lower than the upper surfaces of the source patterns 46.

Figure 16:
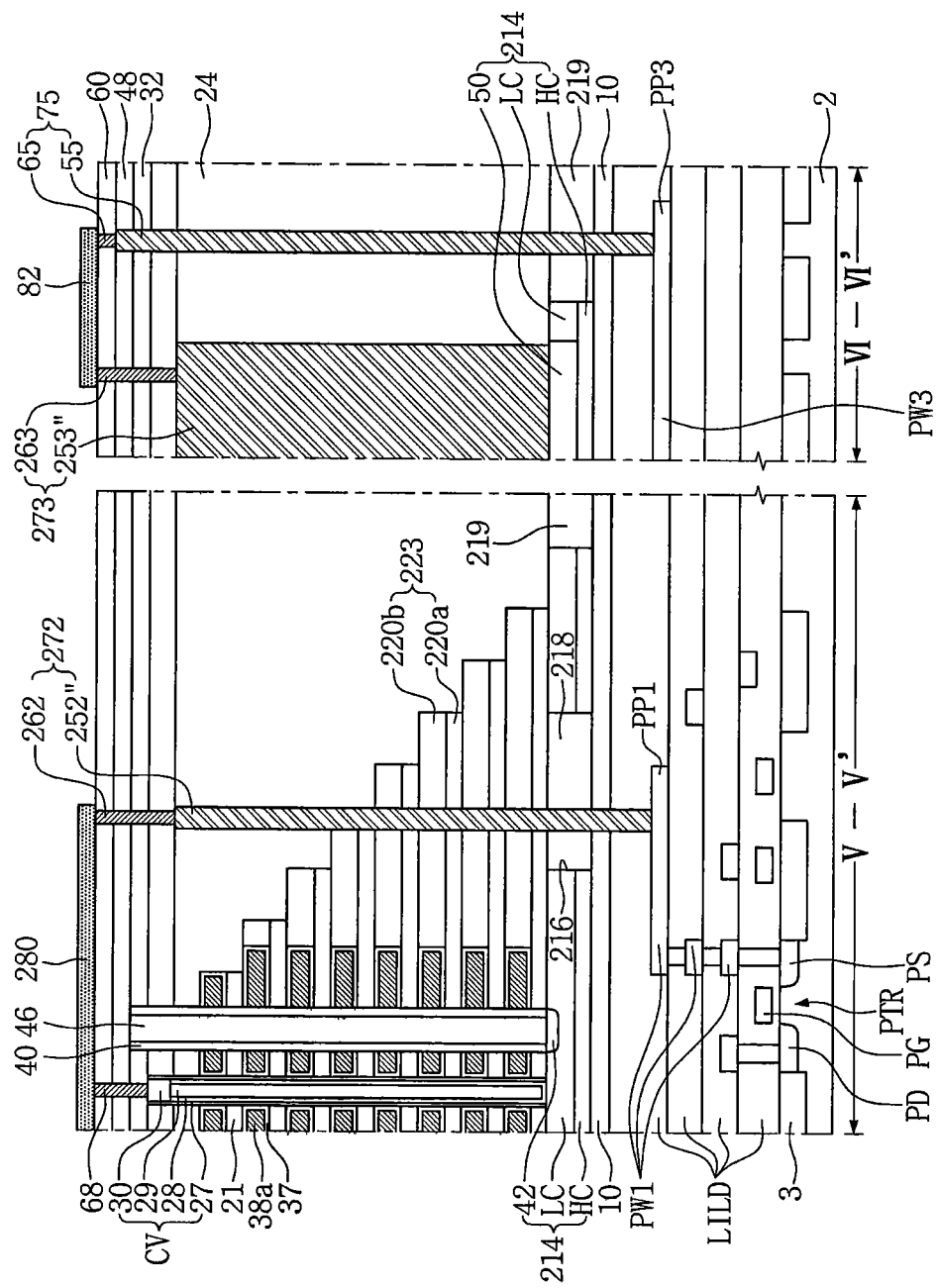
FIG. 16 is a cross-sectional view showing a semiconductor device in accordance with an embodiment of the inventive concept.

In an embodiment, as shown in FIG. 16, a bit line lower contact plug 252' and a body lower contact plug 253" may be disposed to have upper surfaces located at a level lower than the upper surfaces of the cell vertical structures CV and the source patterns 46.

A semiconductor device in accordance with an embodiment of the inventive concept will be described with reference to FIGS. 17 and 18.

Figure 17:
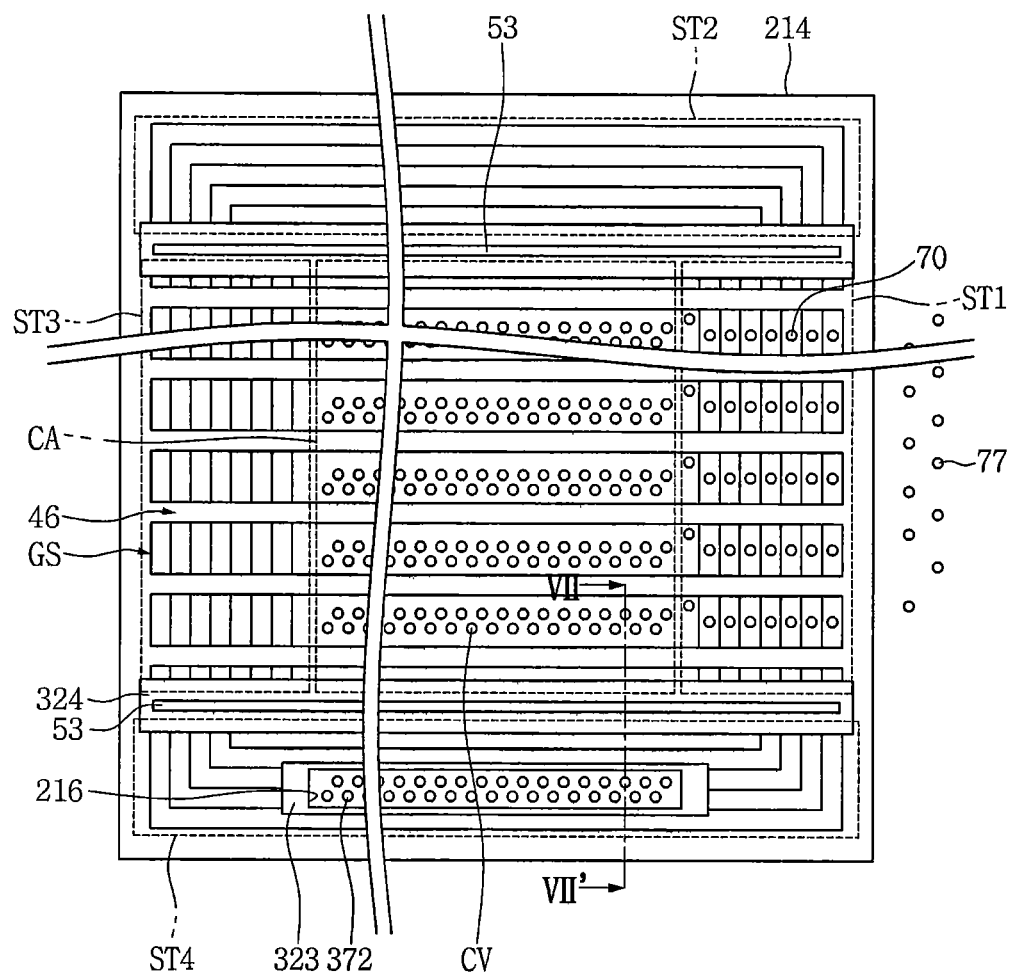
FIG. 17 is a plan view showing a semiconductor device in accordance with an embodiment of the inventive concept.
Figure 18:
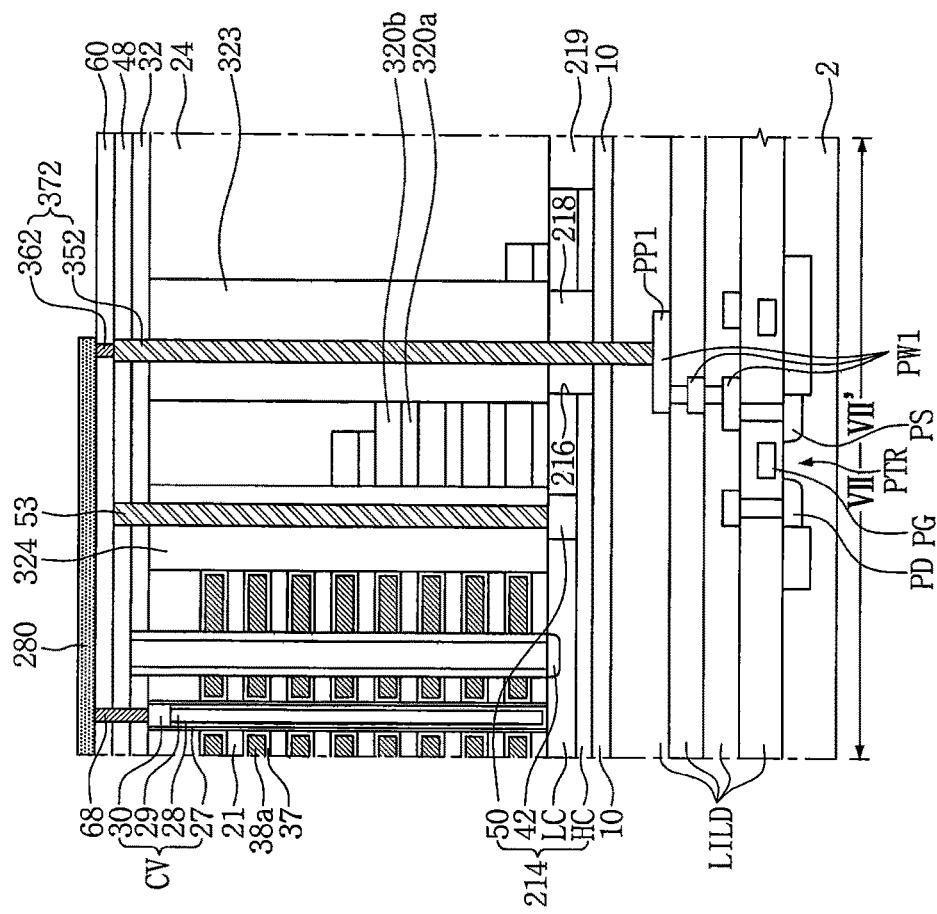
FIG. 18 is a cross-sectional view showing a semiconductor device in accordance with an embodiment of the inventive concept.

Referring to FIGS. 17 and 18, as described in FIGS. 13A, 13B, and 14, the first to third peripheral circuit areas PC1, PC2, and PC3 may be disposed on the semiconductor pattern 214. As described in FIGS. 1, 2A, 2B, 3A, 3B, the first peripheral circuit area PC1 may include a peripheral transistor PTR that may configure a peripheral circuit and a first peripheral interconnection structure PW1 which is electrically connected to the peripheral transistor PTR. The first peripheral interconnection structure PW1 may include a first peripheral contact pad part PP1.

A lower interlayer insulating layer LILD may be disposed to cover the first third peripheral circuit areas PC1, PC2, and PC3 of the semiconductor substrate 2.

As described in FIGS. 13A, 13B, and 14, the buffer insulating layer 10 may be disposed on the lower interlayer insulating layer LILD, the semiconductor pattern 214 having the opening 216 may be disposed on the buffer insulating layer 10, and the gap fill insulating layer 218 which fills the opening 216 and the intermediate interlayer insulating layer 219 which is disposed on the side surface of the semiconductor pattern 214 may be disposed.

The cell gate conductive patterns 38a, the second dielectric 37, the cell vertical structures CV, the cell source patterns 46, the cell interlayer insulating patterns 21, and the first to fourth upper interlayer insulating layers 24, 32, 48, and 60 such as those described in FIGS. 13A, 13B, and 14 may be disposed on the semiconductor pattern 214.

A first insulating structure 323 may be disposed on the gap fill insulating layer 218 of the opening 216 of the semiconductor pattern 214.

A second insulating structure 324 may be disposed to be spaced apart from the opening 216 of the semiconductor pattern 214 and the cell gate conductive patterns 38a. The first and second insulating structures 323 and 324 may be formed of silicon oxide.

In an embodiment, the second insulating structure 324 may be disposed on the semiconductor pattern 214 between the first insulating structure 323 and the cell gate conductive patterns 38a.

In an embodiment, first insulating patterns 320a and second insulating patterns 320b may be disposed to be alternately and repeatedly stacked between the first and second insulating structures 323 and 324. The first insulating pattern 320a may be formed of silicon oxide and the second insulating pattern 320b may be formed of silicon nitride.

In an embodiment, the first and second insulating structures 323 and 324 may be disposed to have a structure which passes through the first upper interlayer insulating layer 24 and the first and second insulating patterns 320a and 320b.

As described in FIGS. 13A, 13B, and 14, a bit line contact structure 372 may be disposed to pass through the fourth step area ST4 and the semiconductor pattern 214 under the fourth step area ST4 and to be electrically connected to the peripheral transistor PTR under the semiconductor pattern 214.

The bit line contact structure 372 may include a bit line lower contact plug 352 and a bit line upper contact plug 362 on the bit line lower contact plug 352.

The bit line lower contact plug 352 may pass through the second and third upper interlayer insulating layers 32 and 48, the first insulating structure 323, the gap fill insulating layer 218 in the opening 216, and a part of the lower interlayer insulating layer LILD which covers the first peripheral contact pad PP1, and may be electrically connected to the first peripheral contact pad PP1 which is electrically connected to the peripheral transistor PTR.

The bit line upper contact plug 362 may pass through the fourth upper interlayer insulating layer 60 and be electrically connected to the bit line lower contact plug 352.

In an embodiment, the cell body lower contact structure 53 of the cell body contact structure 73 such as those described in FIGS. 2A, 3A, and 3B may pass through the second insulating structure 324 and be connected to the semiconductor pattern 214.

The cell bit line plugs 68, the cell gate contact structures 74, and the peripheral body contact structure 75 such as those described in FIGS. 2A, 3A, and 3B may be disposed.

Cell conductive lines, for example, the bit lines 280, may be disposed on the fourth interlayer insulating layer 60. The bit lines 280 may overlap the cell bit line contact plugs 68 and the bit line contact structure 372 and be electrically connected to the cell bit line contact plugs 68 and the bit line contact structure 372. The bit lines 280 may extend from the cell array area CA to the fourth step area ST4.

The word line interconnection structures 81 and the body interconnection structures 82 such as those described in FIGS. 2A, 3A, and 3B may be disposed on the fourth interlayer insulating layer 60.

A method of forming a semiconductor device in accordance with an embodiment of the inventive concept will be described with reference to FIG. 19.

Figure 19:
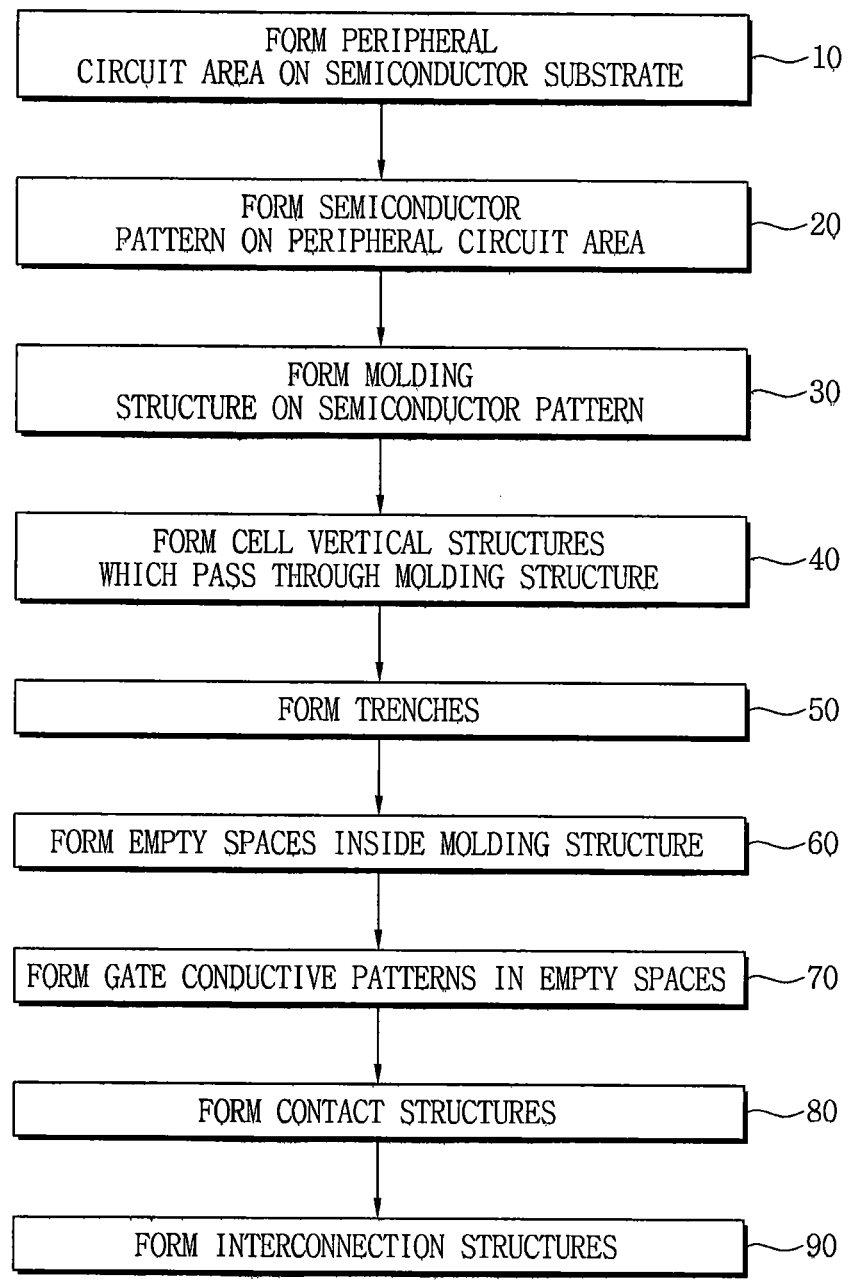
FIG. 19 is a flowchart showing a method of forming a semiconductor device in accordance with an embodiment of the inventive concept.

Referring to FIG. 19, a peripheral circuit area may be formed on a semiconductor substrate (S10). A semiconductor pattern may be formed in the peripheral circuit area (S20). A molding structure may be formed on the semiconductor pattern (S30). Cell vertical structures may be formed on the semiconductor pattern to pass through the molding structure (S40). Trenches may be formed (S50). Empty spaces may be formed inside the molding structure (S60). Gate conductive patterns may be formed in the empty spaces (S70). Contact structures may be formed (S80). Interconnection structures may be formed (S90).

An example of the method of forming the semiconductor device in accordance with the embodiment of the inventive concept described with reference to FIG. 19 will be described with reference to FIGS. 20A to 26B in addition to FIGS. 1, 2A, 2B, 3A, and 3B.

Referring to FIGS. 1, 2A, 19, 20A, and 20B, a semiconductor substrate 2 may be prepared. The semiconductor substrate 2 may be a semiconductor substrate formed of a semiconductor material such as silicon, etc. A peripheral circuit area may be formed on the semiconductor substrate 2 (S10). The peripheral circuit area may include a first peripheral circuit area PC1, a second peripheral circuit area PC2, and/or a third peripheral circuit area PC3.

The first peripheral circuit area PC1 may include a peripheral transistor PTR that may configure a peripheral circuit and a first peripheral interconnection structure PW1 electrically connected to the peripheral transistor PTR. The first peripheral interconnection structure PW1 may be disposed in the first peripheral circuit area PC1 and may include a first peripheral contact pad PP1. The formation of the peripheral transistor PTR may include forming an isolation area 3 which defines an active region, forming a peripheral gate PG in the active region, and forming peripheral impurity regions PS and PD that may serve as a source and a drain on both sides of the peripheral gate PG.

The second peripheral circuit area PC2 (shown in FIG. 1) may include a second peripheral interconnection structure PW2 (shown in FIG. 1) having a second peripheral contact pad PP2. The third peripheral circuit area PC3 may include a third peripheral interconnection structure PW3 having a third peripheral contact pad PP3.

A lower interlayer insulating layer LILD may be formed to cover the peripheral circuits in the first to third peripheral circuit areas PC1, PC2, and PC3 of the semiconductor substrate 2.

The first peripheral interconnection structure PW1 may be configured to have a plurality of components including a peripheral plug, a peripheral interconnection, the first peripheral contact pad part PP1, etc. The peripheral plug of the first peripheral interconnection structure PW1 may be formed so as to pass through a part of the lower interlayer insulating layer LILD after the part of the lower interlayer insulating layer LILD may be formed. The peripheral interconnection of the first peripheral interconnection structure PW1 may be formed so as to be electrically connected to the peripheral plug. The peripheral interconnection and the first peripheral contact pad part PP1 of the first peripheral interconnection structure PW1 may be covered by the lower interlayer insulating layer LILD.

A buffer insulating layer 10 may be formed on the lower interlayer insulating layer LILD. The buffer insulating layer 10 may be formed of a material having an etch selectivity different from the lower interlayer insulating layer LILD being in contact with the buffer insulating layer 10. For example, the part of the lower interlayer insulating layer LILD which covers the first peripheral contact pad part PP1 of the first peripheral interconnection structure PW1 may be formed of silicon oxide and the buffer insulating layer 10 may be formed of silicon nitride.

A semiconductor pattern 14 may be formed on the buffer insulating layer 10. The semiconductor pattern 14 may have an opening 16. The formation of the semiconductor pattern 14 having the opening 16 may include forming a semiconductor layer on the buffer insulating layer 10 and patterning the semiconductor layer. The semiconductor pattern 14 may be formed of silicon. The semiconductor pattern 14 may be formed of polysilicon.

The semiconductor pattern 14 may overlap the first peripheral circuit area PC1, the second peripheral circuit area PC2, and/or the third peripheral circuit area PC3. The semiconductor pattern 14 may be formed in the first to third peripheral circuit areas PC1, PC2, and PC3 (S20).

The semiconductor pattern 14 may include a high concentration impurity region HC and a low concentration impurity region LC which is formed on the high concentration impurity region HC and has an impurity concentration lower than the high concentration impurity region HC. The high concentration impurity region HC and the low concentration impurity region LC may have P-type conductivity.

Referring to FIGS. 1, 2A, 19, 21A, and 21B, after an insulating material layer is formed on the semiconductor substrate 2 having the semiconductor pattern 14, the insulating material layer is planarized until the semiconductor pattern 14 is exposed, a gap fill insulating layer 18 is formed to fill an inside of the opening 16 of the semiconductor pattern 14, and an intermediate interlayer insulating layer 19 may be formed on a side surface of the semiconductor pattern 14. The gap fill insulating layer 18 and the intermediate interlayer insulating layer 19 may be formed of silicon oxide.

A molding structure MS may be formed on the semiconductor pattern 14 (S30). The formation of the molding structure MS may include alternately and repeatedly forming a first molding layer 20 and a second molding layer 22 on the semiconductor substrate 2 having the semiconductor pattern 14, the gap fill insulating layer 18, and the intermediate interlayer insulating layer 19, patterning the first and second molding layers 20 and 22, and then forming end parts of the first and second molding layers 20 and 22 to have a step structure. An end part of the molding structure MS may be formed to have a step structure.

The first molding layer 20 may be formed of a material having an etch selectivity with respect to the second molding layer 22. For example, the first molding layer 20 may be formed of silicon oxide and the second molding layer 22 may be formed of silicon nitride.

Referring to FIGS. 1, 2A, 19, 22A, and 22B, a first upper interlayer insulating layer 24 may be formed on the semiconductor substrate 2 having the molding structure MS. The first upper interlayer insulating layer 24 may be formed of silicon oxide. The first upper interlayer insulating layer 24 may be formed so as to cover the molding structure MS and have a substantially flat upper surface.

Cell vertical structures CV may be formed to pass through the molding structure MS (S40). The cell vertical structures CV may be formed on the semiconductor pattern 14. The cell vertical structures CV may pass through the first upper interlayer insulating layer 24 and the molding structure MS and be connected to the semiconductor pattern 14.

Each of the cell vertical structures CV may include a first cell dielectric 27, a cell semiconductor layer 28, a core insulating pattern 29, and a cell pad pattern 30. For example, the formation of the cell vertical structures CV may include forming holes which pass through the first upper interlayer insulating layer 24 and the molding structure MS, forming the first cell dielectric 27 on side walls of the holes, conformally forming the cell semiconductor layer 28 on the semiconductor substrate 2 in which the first cell dielectric 27 is formed, forming the core insulating pattern 29 which partially fills the holes on the cell semiconductor layer 28, forming a pad layer on the semiconductor substrate 2 having the core insulating pattern 29, and planarizing the pad layer and the cell semiconductor layer 28 until the first upper interlayer insulating layer 24 is exposed, and then forming the cell pad pattern 30 defined in the hole and the cell semiconductor layer 28.

The cell semiconductor layer 28 may be connected to the semiconductor pattern 14. The cell semiconductor layer 28 and the cell pad pattern 30 may be formed of silicon. For example, the cell semiconductor layer 28 and the cell pad pattern 30 may be formed of polysilicon.

The forming of the first cell dielectric 27 may include forming a data storage material layer (e.g., a silicon nitride layer that may trap the charge, etc.) and a tunnel oxide layer (e.g., silicon oxide). The cell pad pattern 30 may be formed to have N-type conductivity using an ion implantation process.

Referring to FIGS. 1, 2A, 19, 23A, and 23B, a second upper interlayer insulating layer 32 may be formed on the semiconductor substrate 2 having the cell vertical structures CV. The second upper interlayer insulating layer 32 may be formed of silicon oxide.

Trenches 34 may be formed (S50). The trenches 34 may pass through the first and second upper interlayer insulating layers 24 and 32 and the molding structure MS and may expose the semiconductor pattern 14.

In an embodiment, the trenches 34 may cross the molding structure MS.

The trenches 34 may have line shapes which extend in a first direction X. The trenches 34 may be arranged in a second direction Y perpendicular to the first direction X in parallel.

The trenches 34 may be sequentially arranged in the second direction Y and may include a first trench 34a, a second trench 34b, and a third trench 34c, which are parallel to each other. A distance between the adjacent first and second trenches 34a and 34b may be greater than a distance between the adjacent second and third trenches 34b and 34c. The cell vertical structures CV may be interposed between the trenches 34 which are relatively and narrowly spaced apart, for example, between the second and third trenches 34b and 34c.

The opening 16 of the semiconductor pattern 14 may be disposed in the semiconductor pattern 14 between the trenches 34 which are relatively and widely spaced apart, for example, between the first and second trenches 34a and 34b.

Empty spaces 36 may be formed inside the molding structure MS (S60). The formation of the empty spaces 36 may include etching the second molding layers 22 exposed by the trenches 34. Parts in which the second molding layers 22 are etched may be formed as the empty spaces 36.

The second molding layers 22, which are selected from the second molding layers 22 and are located between the first and second trenches 34a and 34b which are relatively and widely spaced apart, may remain by partially etching. As described above, the second molding layers 22 which remain between the first and second trenches 34a and 34b may be defined as second insulating patterns 22a.

Further, the second molding layers 22, which are selected from the second molding layers 22 and are located in the step areas located at the second direction Y perpendicular to the trenches 34, may remain by partially etching. As described above, the second molding layers 22 which remain in the step areas may be defined as fourth insulating patterns 22b.

The first molding layers 20 located between the trenches 34, which are selected from the trenches 34 and are relatively and narrowly spaced apart, for example, between the second and third trenches 34b and 34c may be defined as cell interlayer insulating patterns 21. The first molding layer 20 located between the first and second trenches 34a and 34b may be defined as first insulating patterns 20a. The first molding layers 20 located in the step areas located at the second direction Y perpendicular to the trenches 34 may be defined as third insulating patterns 20b.

The first insulating patterns 20a and the second insulating patterns 22a located between the first and second trenches 34a and 34b which are relatively and widely spaced apart may be defined as an insulating structure 23. Therefore, the insulating structure 23 may include the first insulating pattern 20a and the second insulating pattern 22a, which are alternately and repeatedly stacked. The second insulating pattern 22a may have a width smaller than the first insulating pattern 20a.

Referring to FIGS. 1, 2A, 19, 24A, and 24B, a second cell dielectric 37 may be conformally formed on the semiconductor substrate 2 having the empty spaces 36. Gate conductive patterns may be formed in the empty spaces 36. The formation of the gate conductive patterns may include forming a conductive material layer on the semiconductor substrate 2 having the second cell dielectric 37 and removing the conductive material layer formed, which is on the second upper interlayer insulating layer 32 and in the trenches 34, using an etching process.

The gate conductive patterns may be formed in the empty spaces 36 between the trenches 34, which are selected from the trenches 34 and are relatively and narrowly spaced apart, for example, between the second and third trenches 34b and 34c, the gate conductive patterns which surround side surfaces of the cell vertical structures CV may be defined as cell gate conductive patterns 38a, and the gate conductive patterns, that may be formed in the empty spaces 36 between the trenches 34 which are relatively and widely spaced apart, for example, between the first and second trenches 34a and 34b and in the empty spaces located in the step areas located at a direction perpendicular to the trenches 34, may be defined as dummy gate conductive patterns 38b. The cell gate conductive patterns 38a may be formed on end parts located at the first direction X parallel to the trenches 34 to have a step structure.

Referring to FIGS. 1, 2A, 25A, and 25B, insulating spacers 40 may be formed on side walls of the trenches 34. The insulating spacer 40 may be formed of an insulating material such as silicon oxide, silicon nitride, or the like.

A cell source impurity region 42 may be formed in the semiconductor pattern 14 exposed by the trenches 34 by performing an ion implantation process. The cell source impurity region 42 may be formed in the low concentration impurity region LC of the semiconductor pattern 14. The cell source impurity region 42 may have a conductivity type differ from the low concentration impurity region LC. For example, the low concentration impurity region LC may have P-type conductivity and the cell source impurity region 42 may have N-type conductivity.

Cell source patterns 46 may be formed in the trenches 34. The cell source patterns 46 may be formed of a conductive material (e.g., a material such as Ti, TiN, W, or the like).

Figure 23A:
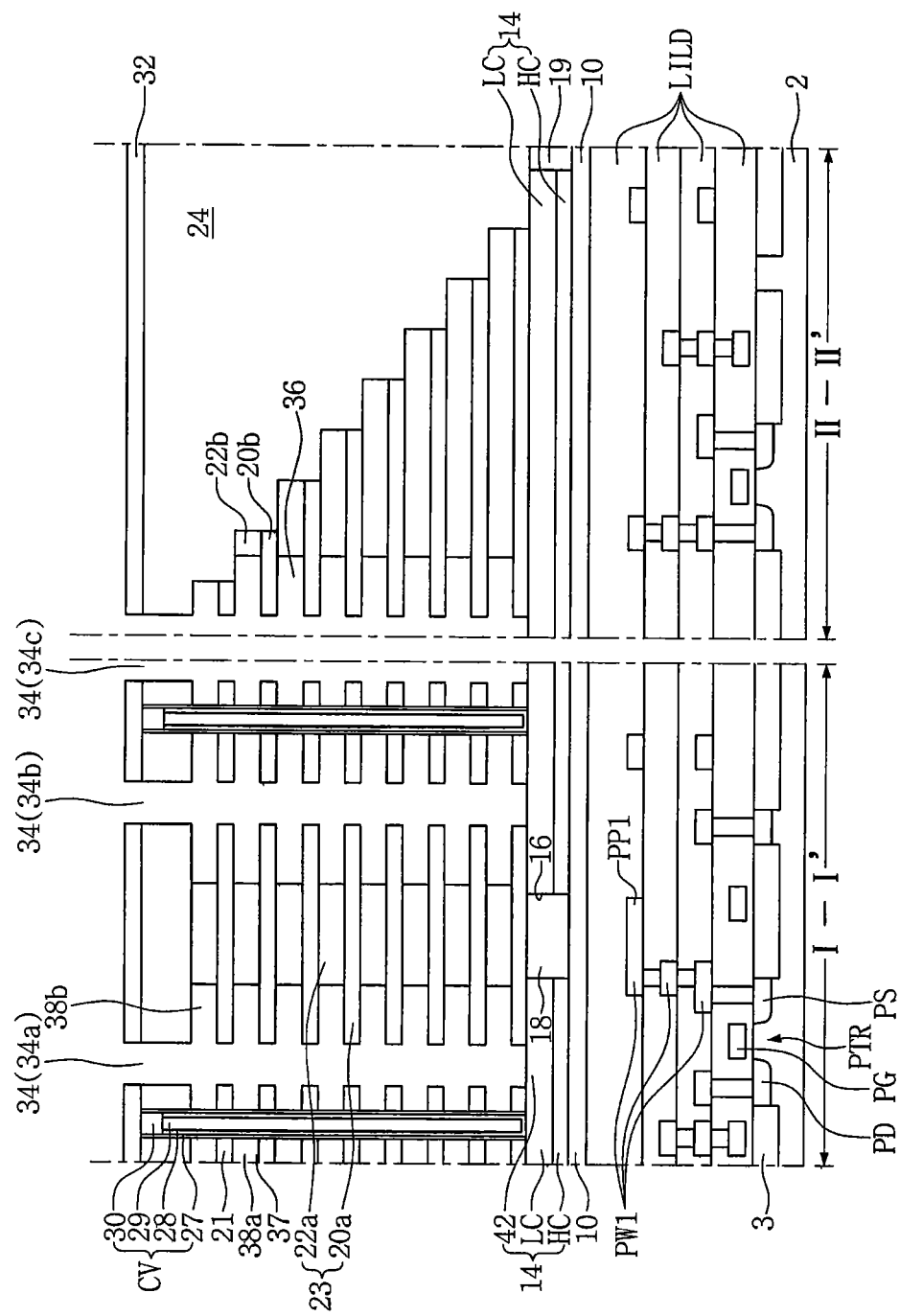
Figure 23B:
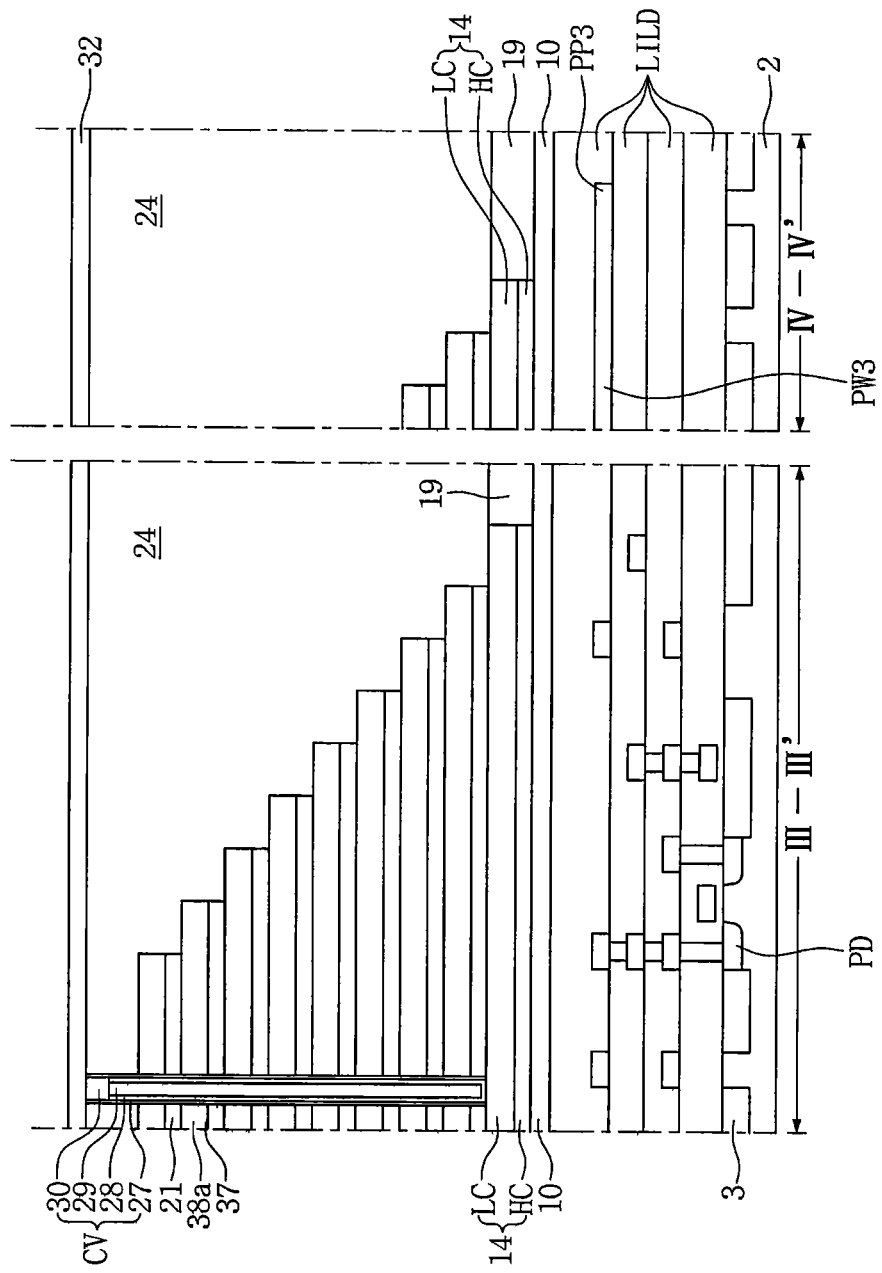

The cell source patterns 46 may include first to third source patterns 46a, 46b, and 46c corresponding to the first to third trenches 34a, 34b, and 34c described in FIGS. 23A and 23B.

A third upper interlayer insulating layer 48 may be formed on the semiconductor substrate 2 having the cell source patterns 46. The third upper interlayer insulating layer 48 may be formed of silicon oxide.

Referring to FIGS. 1, 2A, 26A, and 26B, a peripheral bit line lower contact plug 52, a cell body lower contact structure 53, a cell gate lower contact plug 54, and a peripheral body lower contact structure 55 may be formed.

The peripheral bit line lower contact plug 52 may be interposed between the first and second source patterns 46a and 46b. The peripheral bit line lower contact plug 52 may pass through insulating material layers located on the first peripheral contact pad PP1 and may be connected to the first peripheral contact pad PP1. For example, the peripheral bit line lower contact plug 52 may pass through the first to third upper interlayer insulating layers 24, 32, and 48, the first and second insulating patterns 20a and 22a, the gap fill insulating layer 18, and a part of the lower interlayer insulating layers LILD, which is selected from the lower interlayer insulating layers LILD and covers the peripheral pads PP1 and PP2, and may be electrically connected to the first peripheral contact pad PP1.

The cell body lower contact structure 53 may pass through the first to third upper interlayer insulating layers 24, 32, and 48 and the third and fourth insulating patterns 20b and 22b in the step areas located in the second direction Y perpendicular to the cell source patterns 46, and may be connected to the semiconductor pattern 14.

In an embodiment, the cell body lower contact structure 53 may be formed in a line shape.

In an embodiment, the cell body lower contact structure 53 may be formed in a shape of a plurality of circles spaced apart from each other.

The cell gate lower contact plug 54 may pass through the first to third upper interlayer insulating layers 24, 32, and 48 and be connected to the cell gate conductive patterns 38a in the step area located between the cell source patterns 46.

The peripheral body lower contact structure 55 may sequentially pass through a part of the lower interlayer insulating layer LILD located on the third peripheral contact pad PP3, the buffer insulating layer 10, the intermediate interlayer insulating layer 19, and the first to third upper interlayer insulating layers 24, 32, and 48, and may be electrically connected to the third peripheral contact pad PP3.

The formation of the peripheral bit line lower contact plug 52, the cell body lower contact structure 53, the cell gate lower contact plug 54, and the peripheral body lower contact structure 55 may include forming contact holes by performing a photolithography process and an etching process, and forming a conductive material layer which fills the contact holes.

In an embodiment, before the contact holes are formed and filled with the conductive material layer, impurities may be implanted in contact parts exposed by the contact holes by performing an ion implantation process. Therefore, a cell body contact impurity region 50 may be formed in the semiconductor pattern 14 under the cell body lower contact structure 53. The cell body contact impurity region 50 may have P-type conductivity. The cell body contact impurity region 50 may be formed to have an impurity concentration higher than the low concentration impurity region LC.

Referring again to FIGS. 1, 2A, 2B, 3A, 3B, and 19, a fourth upper interlayer insulating layer 60 may be formed on the semiconductor substrate 2 having the peripheral bit line lower contact plug 52, the cell body lower contact structure 53, the cell gate lower contact plug 54, and the peripheral body lower contact structure 55.

A peripheral bit line upper contact plug 62, a cell body upper contact structure 63, cell gate upper contact plugs 64, a peripheral body upper contact structure 65, and cell bit line contact plugs 68 may be formed.

The peripheral bit line upper contact plug 62 may pass through the fourth upper interlayer insulating layer 60 and may be electrically connected to the peripheral bit line lower contact plug 52. The peripheral bit line upper contact plug 62 and the peripheral bit line lower contact plug 52 may configure a peripheral bit line contact structure 72.

The cell body upper contact structure 63 may pass through the fourth upper interlayer insulating layer 60 and be electrically connected to the cell body lower contact structure 53. The cell body upper contact structure 63 and the cell body lower contact structure 53 may configure a cell body contact structure 73.

The cell gate upper contact plugs 64 may pass through the fourth upper interlayer insulating layer 60 and be electrically connected to the cell gate lower contact plug 54.

The cell gate upper contact plugs 64 and the cell gate lower contact plug 54 may configure a cell gate contact structure 74.

The peripheral body upper contact structure 65 may pass through the fourth upper interlayer insulating layer 60 and be electrically connected to the peripheral body lower contact structure 55. The peripheral body upper contact structure 65 and the peripheral body lower contact structure 55 may configure a peripheral body contact structure 75.

In an embodiment, the peripheral word line contact structure 77 (shown in FIG. 1) may be formed. The peripheral word line contact structure 77 may be simultaneously formed with the peripheral body contact structure 75 to have the same structure as the peripheral body contact structure 75. Therefore, the peripheral word line contact structure 77 may be configured of a peripheral lower word line contact plug and a peripheral upper word line contact plug corresponding to the peripheral body lower contact structure 55 and the peripheral body upper contact structure 65 of the peripheral body contact structure 75.

The cell bit line contact plugs 68 may pass through the second to fourth upper interlayer insulating layers 32, 48, and 60 and be formed on the cell pad patterns 30.

Then, interconnection structures may be formed on the fourth interlayer insulating layer 60 by performing an interconnection process (S90). The interconnection structures may include bit lines 80, word line interconnection structures 81, and body interconnection structures 82.

The bit lines 80 may overlap and may be electrically connected to the cell bit line contact plugs 68 and the peripheral bit line contact structure 72.

The word line interconnection structures 81 may be electrically connected to the cell gate contact structure 74 and the peripheral word line contact structure 77.

The body interconnection structures 82 may be electrically connected to the cell body contact structure 73 and the peripheral body contact structure 75.

Therefore, the semiconductor device such as that described in FIGS. 1, 2A, 2B, 3A, and 3B may be formed. An example of the method of forming the semiconductor device such as that described in FIGS. 4A and 4B will be described with reference to FIG. 27 using the method of forming the semiconductor device in accordance with the embodiment of the inventive concept.

Figure 27:
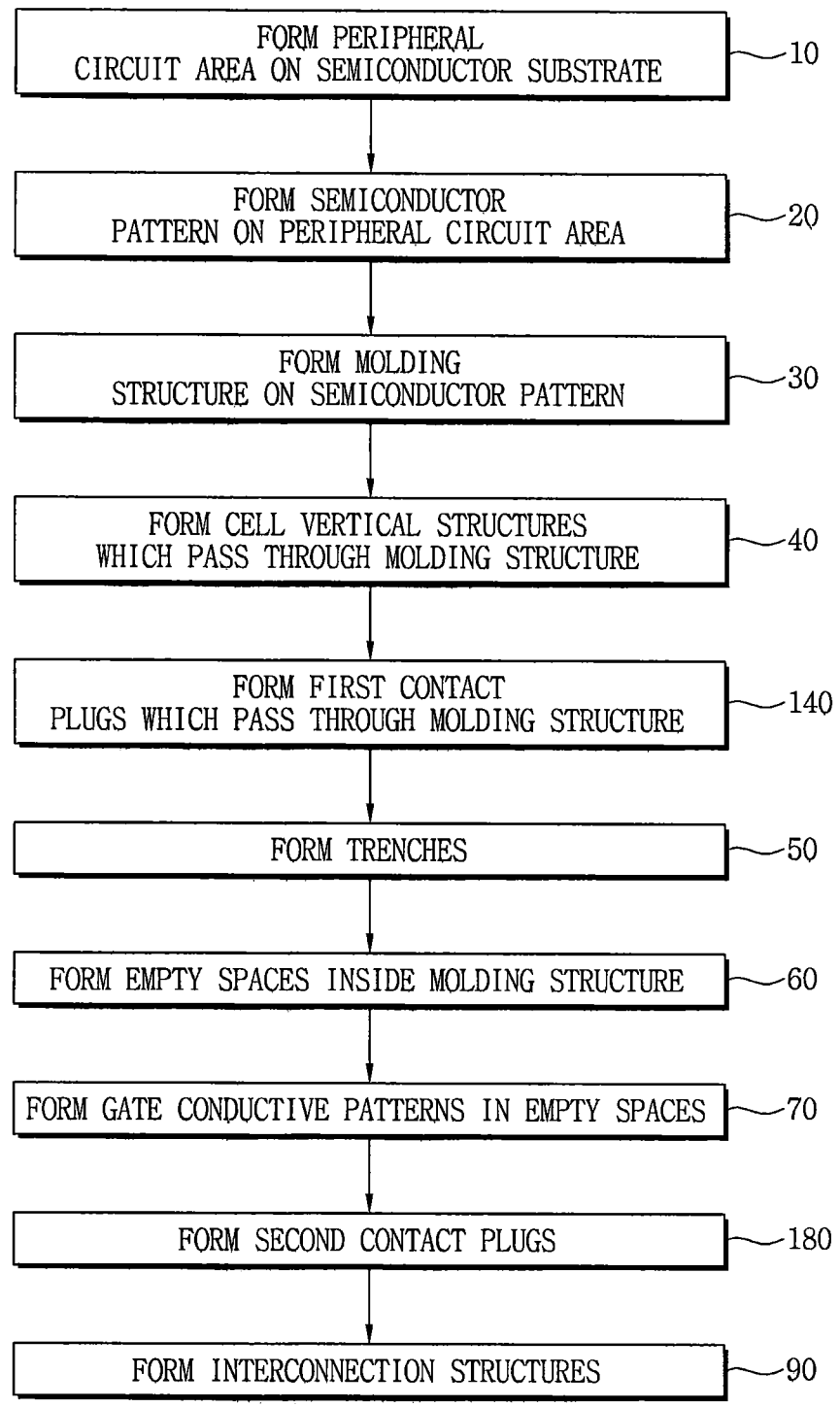
FIG. 27 is a flowchart showing a method of forming a semiconductor device in accordance with an embodiment of the inventive concept.

Referring to FIG. 27, as described in FIG. 19, the peripheral circuit area may be formed on the semiconductor substrate (S10), the semiconductor pattern may be formed in the peripheral circuit area (S20), the molding structure may be formed on the semiconductor pattern (S30), and the vertical structures which pass through the molding structure may be formed on the semiconductor pattern (S40).

First contact plugs may be formed to pass through the molding structure (S140). The first contact plugs may be a peripheral bit line lower contact plug 52' and a cell body lower contact plug 53' shown in FIGS. 4A and 4B.

As described in FIG. 19, the trenches may be formed (S50), the empty spaces may be formed inside the molding structure (S60), and the gate conductive patterns may be formed inside the empty spaces (S70).

Second contact plugs may be formed (S180). The second contact plugs may be the cell gate lower contact plugs 54 and the peripheral body lower contact plugs 55 shown in FIG. 4B. Cell bit line contact plugs 68, a bit line upper contact plug 62', and a peripheral upper body contact plug 65 may be formed. Then, as described in FIG. 19, the interconnection structures may be formed (S90).

Next, an example of the method of forming the semiconductor device such as that described in FIGS. 5A and 5B will be described with reference to FIG. 28.

Figure 28:
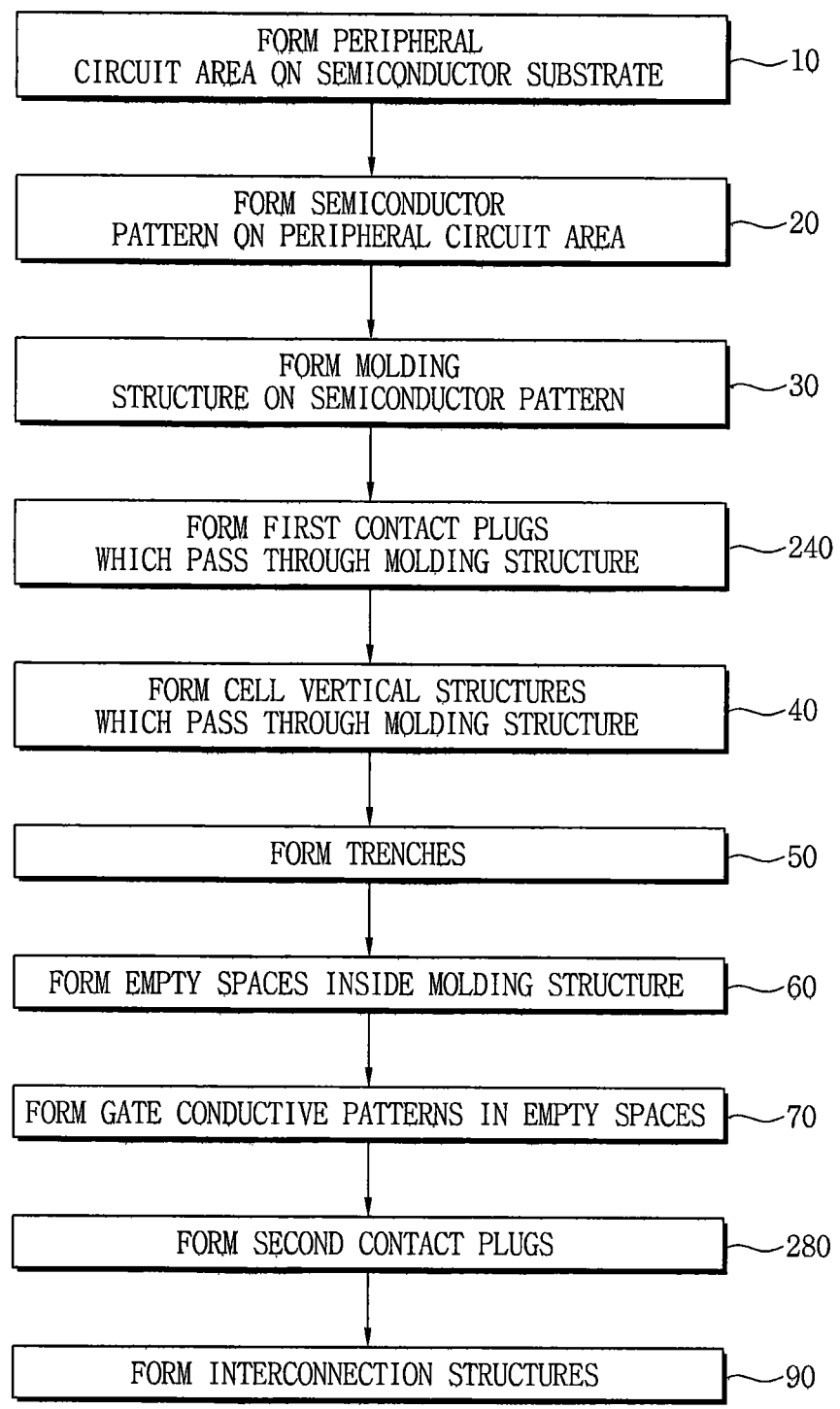
FIG. 28 is a flowchart showing a method of forming a semiconductor device in accordance with an embodiment of the inventive concept.

Referring to FIG. 28, as described in FIG. 19, the peripheral circuit area may be formed on the semiconductor substrate (S10), the semiconductor pattern may be formed in the peripheral circuit area (S20), and the molding structure may be formed on the semiconductor pattern (S30). First contact plugs may be formed to pass through the molding structure (S240). The first contact plugs may be a bit line lower contact plug 52" and a body lower contact plug 53" shown in FIGS. 5A and 5B.

As described in FIG. 19, the vertical structures may be formed to pass through the molding structure (S40), the trenches may be formed (S50), the empty spaces may be formed inside the molding structure (S60), and the gate conductive patterns may be formed in the empty spaces (S70). Second contact plugs may be formed (S280). The second contact plugs may be the cell gate lower contact plug 54 and the peripheral body lower contact plugs 55 shown in FIG. 5B. Cell bit line contact plugs 68, a bit line upper contact plug 62, a cell gate upper contact structure 64, and a peripheral upper body contact plug 65 may be formed. Then, as described in FIG. 19, the interconnection structures may be formed (S90).

Next, an example of the method of forming a semiconductor device in accordance with an embodiment of inventive concept will be described with reference to FIG. 29.

Figure 29:
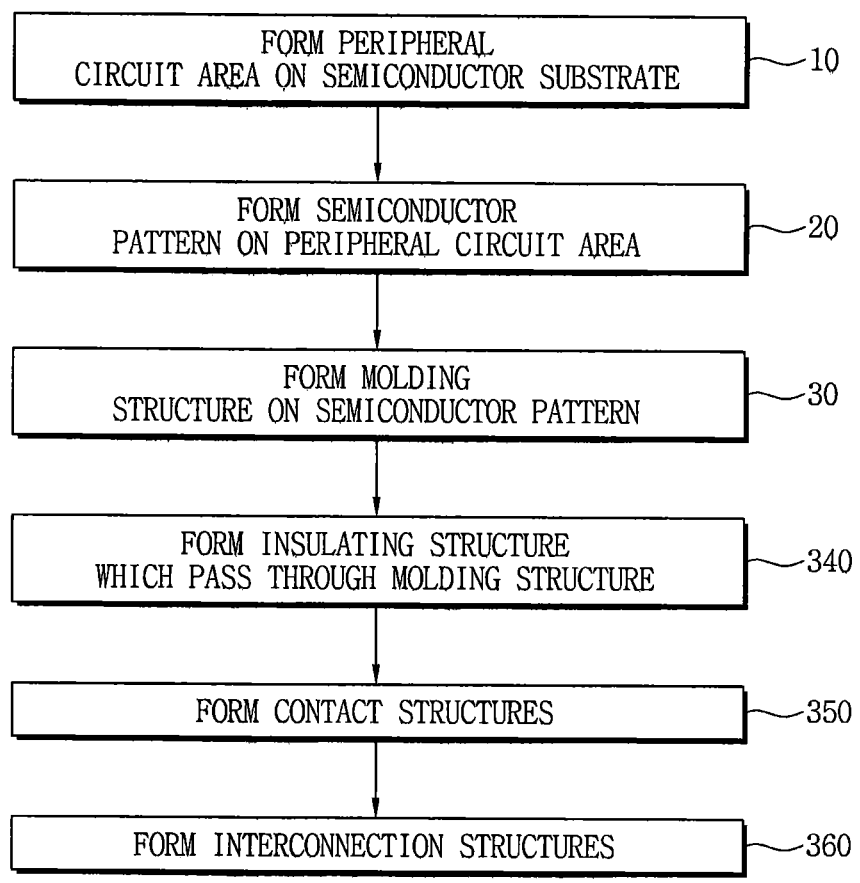
FIG. 29 is a flowchart showing a method of forming a semiconductor device in accordance with an embodiment of the inventive concept.
Figure 30A:
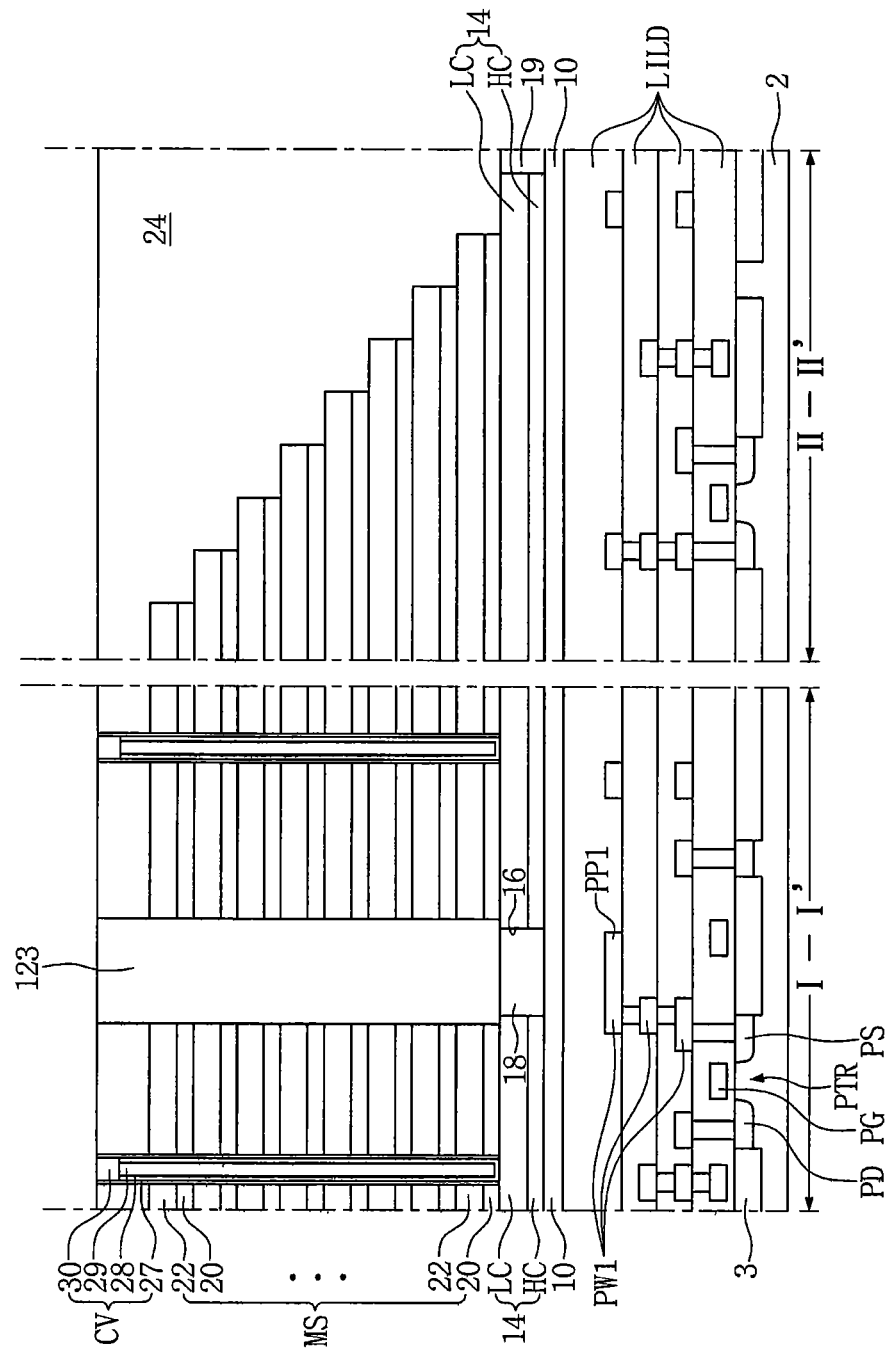
FIGS. 30A to 32B are cross-sectional views showing a method of forming a semiconductor device according to embodiments of the inventive concept.
Figure 30B:
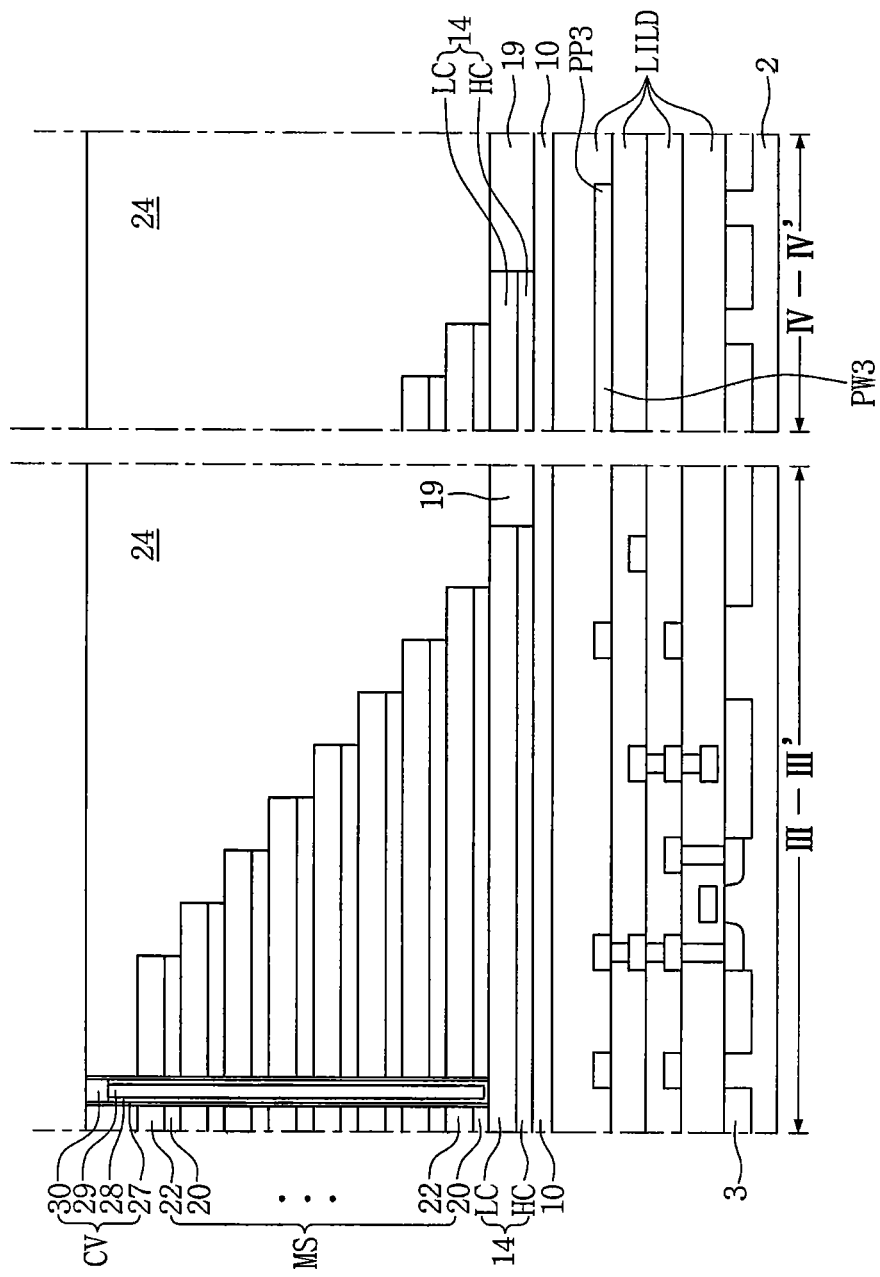
Figure 31A:
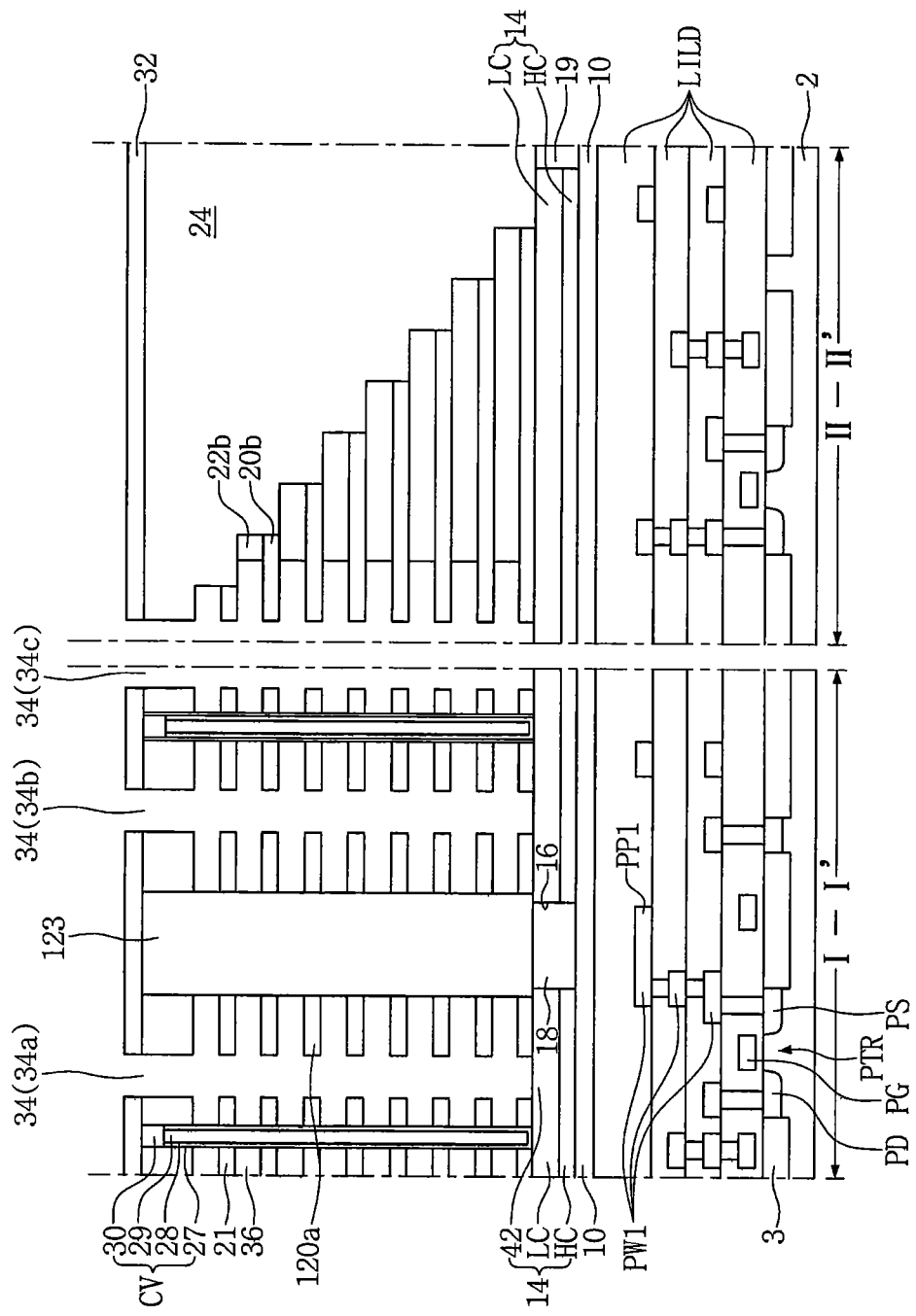
Figure 31B:
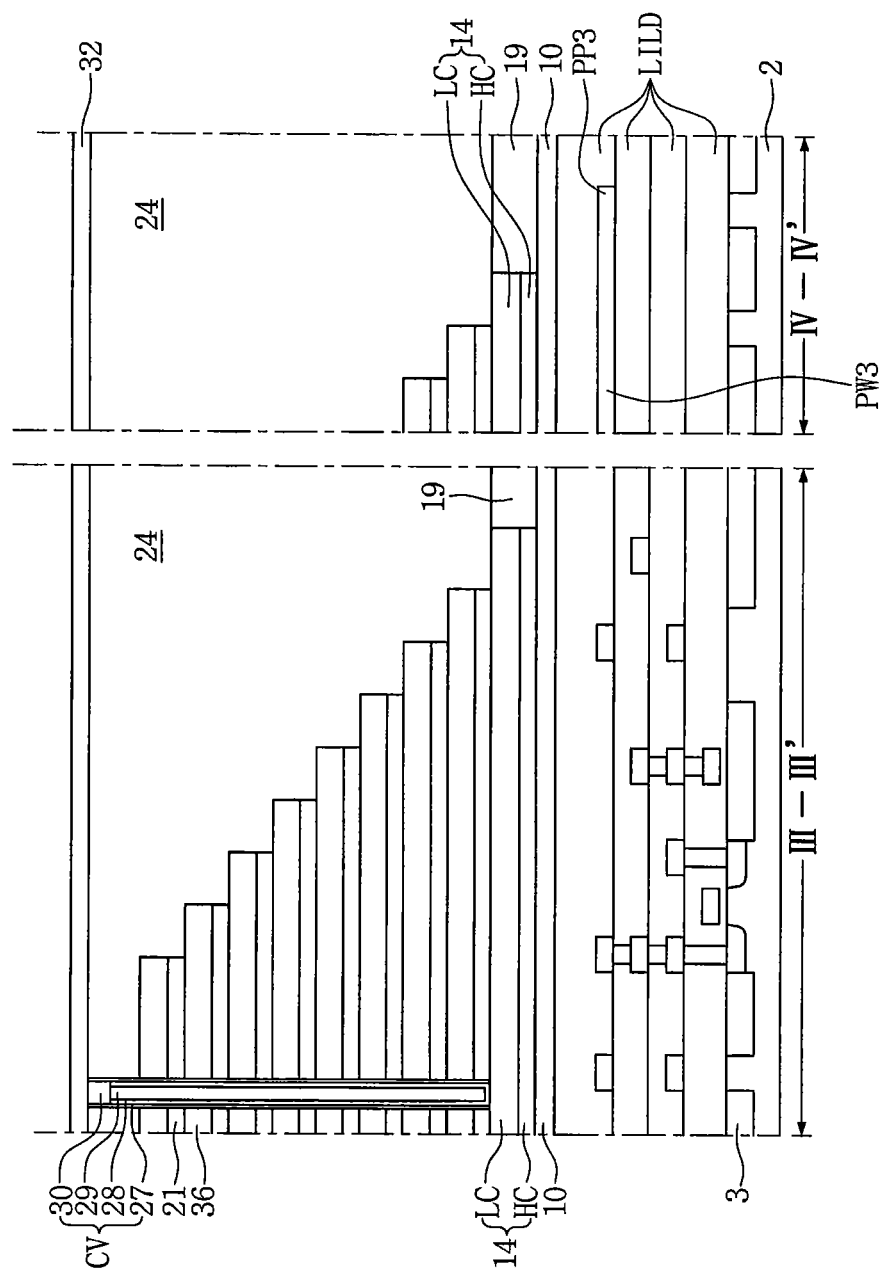
Figure 32A:
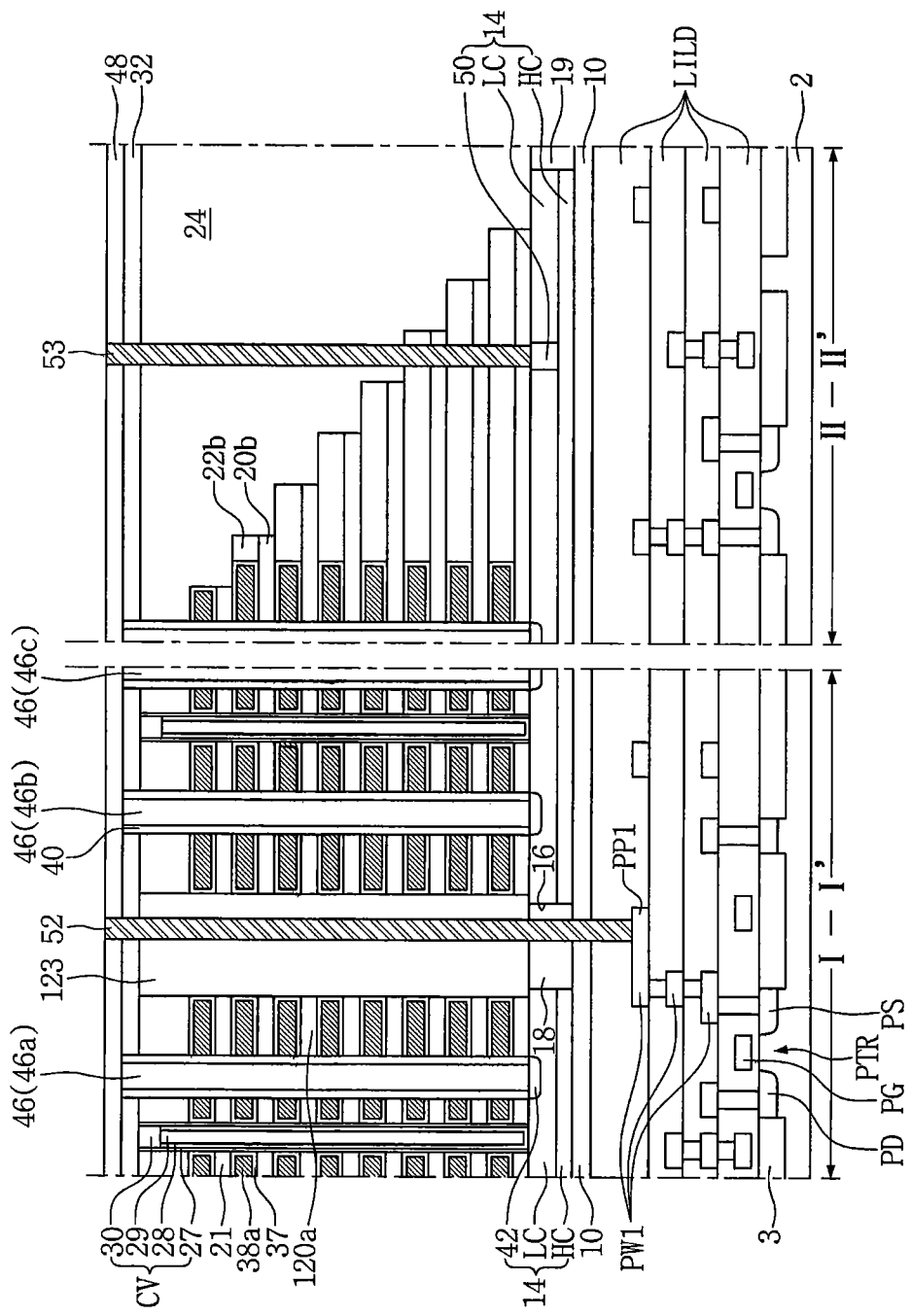
Figure 32B:
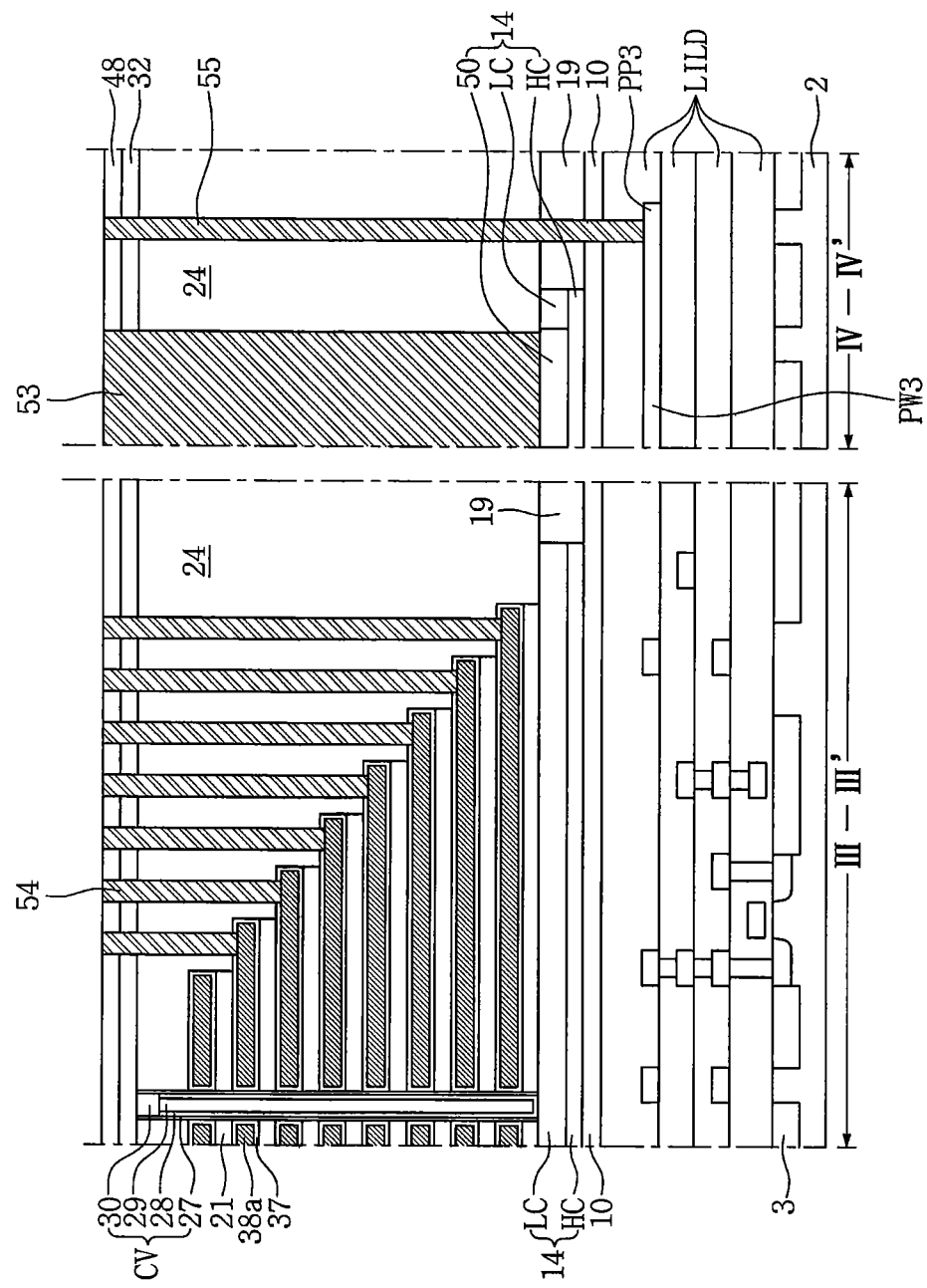

Referring to FIG. 29, as described in FIG. 19, the peripheral circuit area may be formed on the semiconductor substrate (S10), the semiconductor pattern may be formed in the peripheral circuit area (S20), and the molding structure may be formed on the semiconductor pattern (S30). An insulating structure may be formed to pass through the molding structure (S340). Contact structures may be formed (S350). Interconnection structures may be formed (S360).

A method of forming a semiconductor device in accordance with an embodiment of inventive concept will be described with reference to FIGS. 1, 10, 29, and 30A to 32B.

Figure 20A:
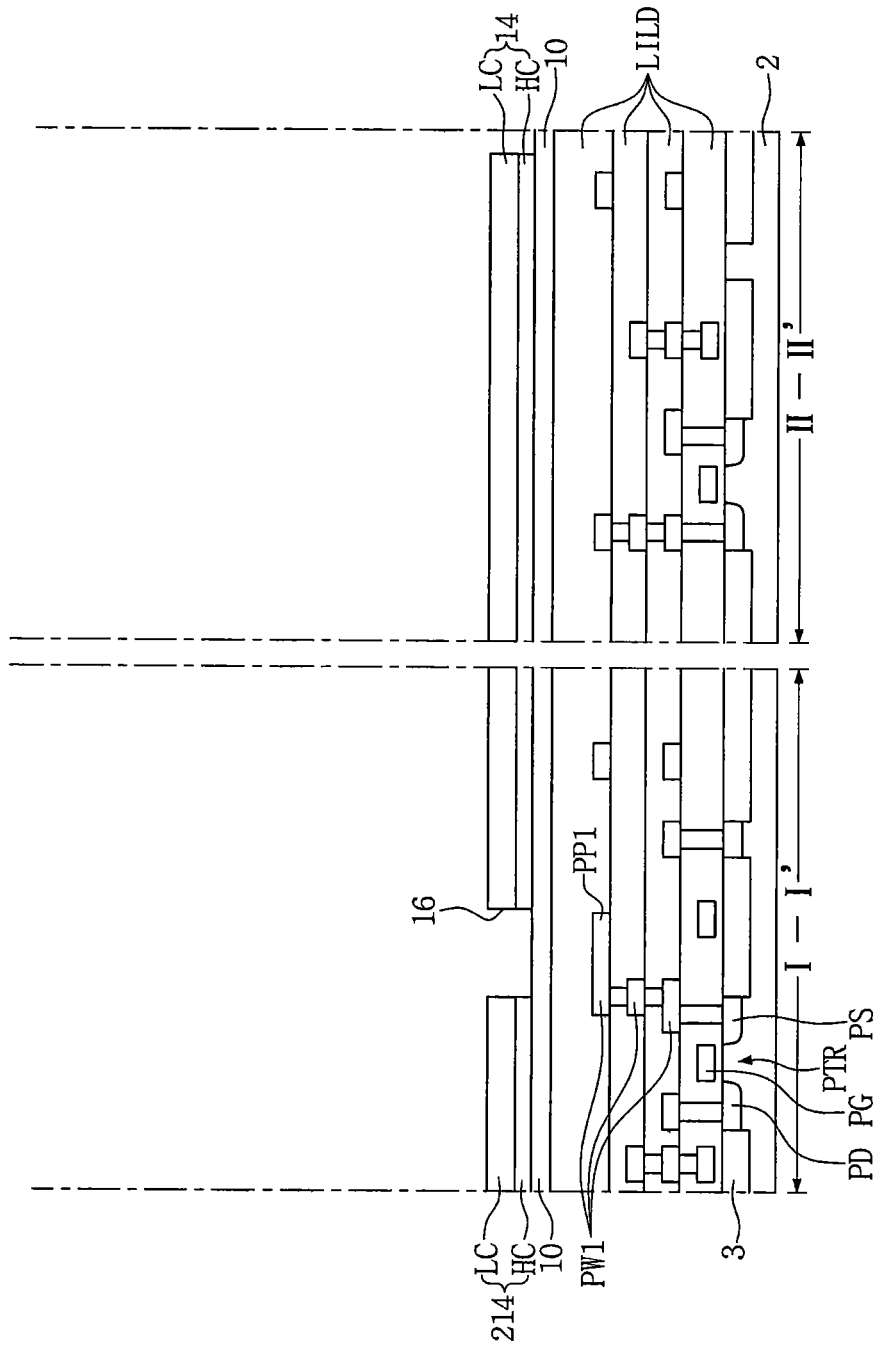
FIGS. 20A to 26B are cross-sectional views showing a method of forming a semiconductor device according to embodiments of the inventive concept.
Figure 20B:
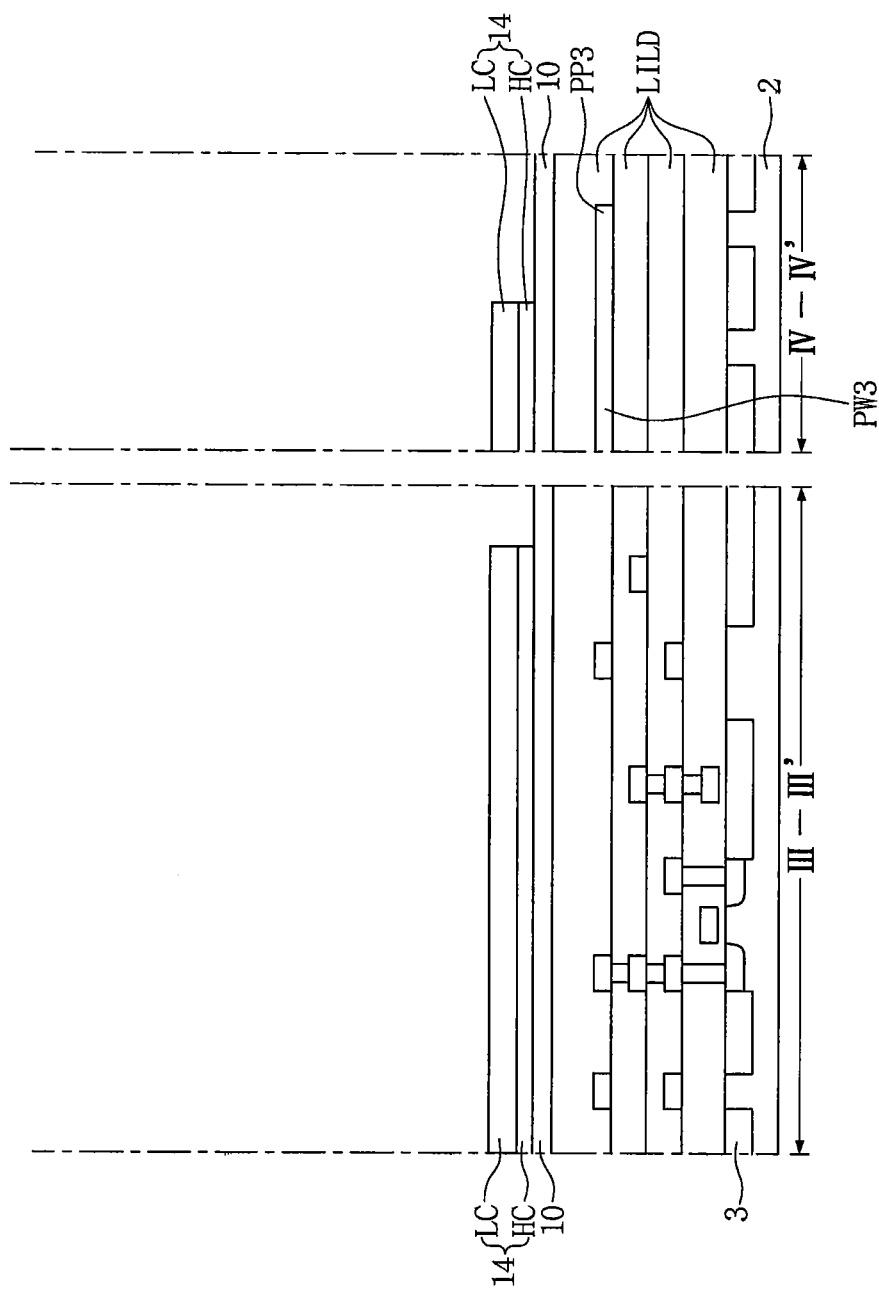

Referring to FIGS. 1, 10, 29, and 30A to 32B, as described in FIGS. 20A and 20B, the peripheral circuit areas PC1, PC2, and PC3 may be formed on the semiconductor substrate 2 (S10), the peripheral transistor PTR that may configure the peripheral circuit areas PC1, PC2, and PC3 and the lower interlayer insulating layer LILD which covers the peripheral interconnection structure PW may be formed on the semiconductor substrate 2, and the buffer insulating layer 10 and the semiconductor pattern 14 having the opening 16 may be formed on the lower interlayer insulating layer LILD. The semiconductor pattern 14 may be formed on the peripheral circuit areas PC1, PC2, and PC3 (S20).

Figure 21A:
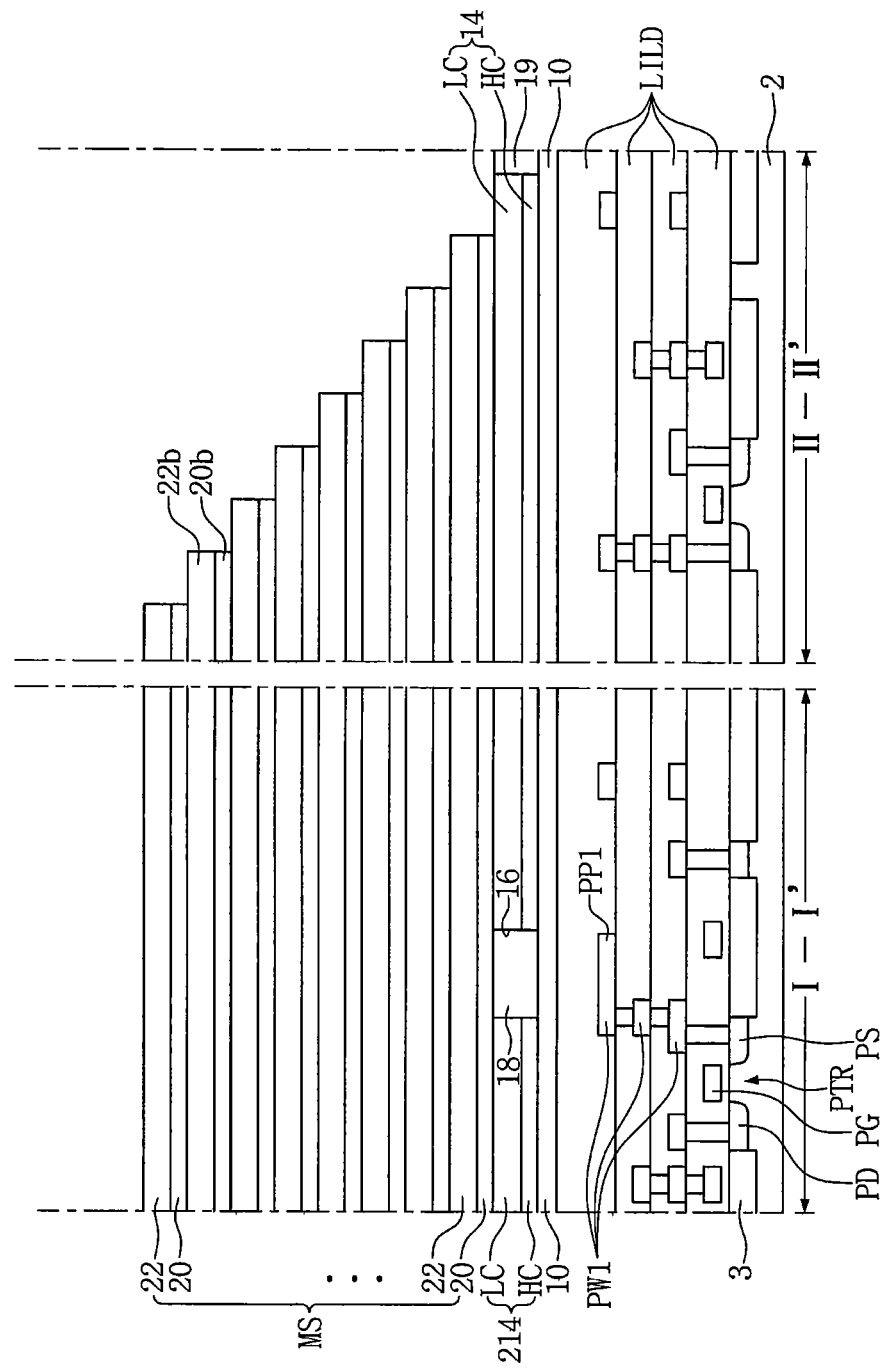
Figure 21B:
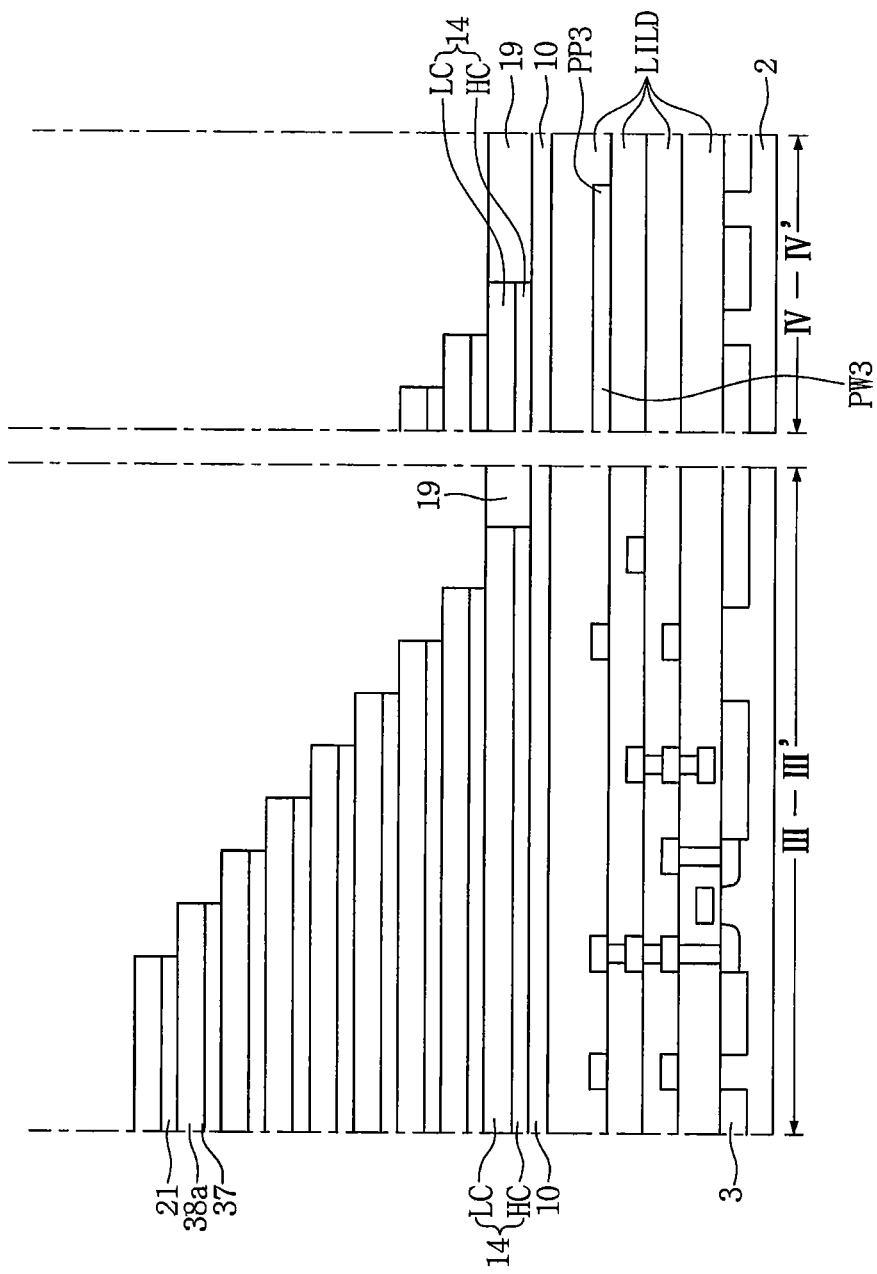

As described in FIGS. 21A and 21B, the gap fill insulating layer 18 which fills the opening 16 of the semiconductor pattern 14 and the intermediate interlayer insulating layer 19 which covers a side surface of the semiconductor pattern 14 may be formed, and the molding structure MS may be formed on the semiconductor pattern 14 and the gap fill insulating layer 18. The molding structure MS may include the first molding layer 20 and the second molding layer 22, which are alternately and repeatedly stacked.

Figure 22A:
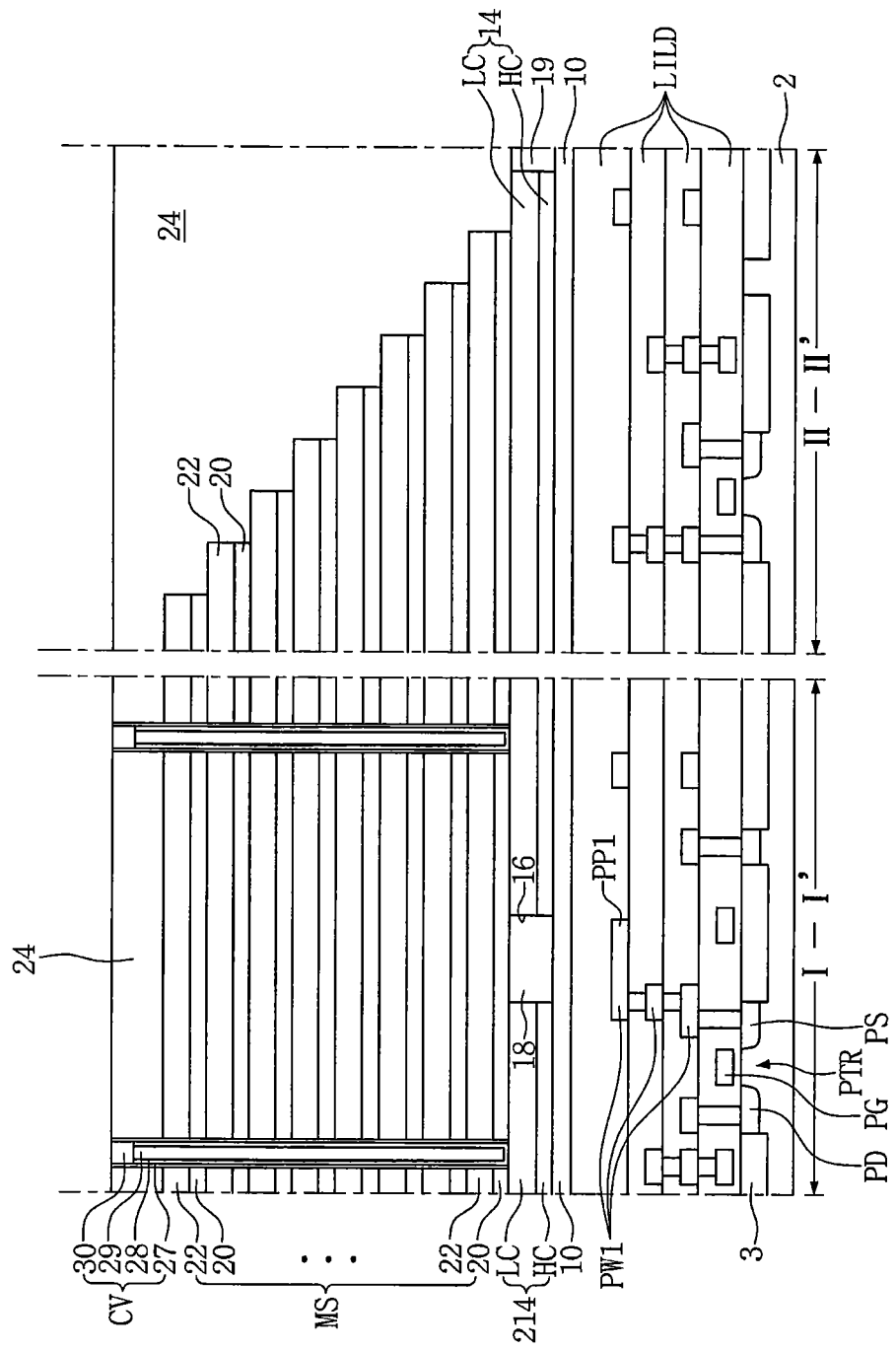
Figure 22B:
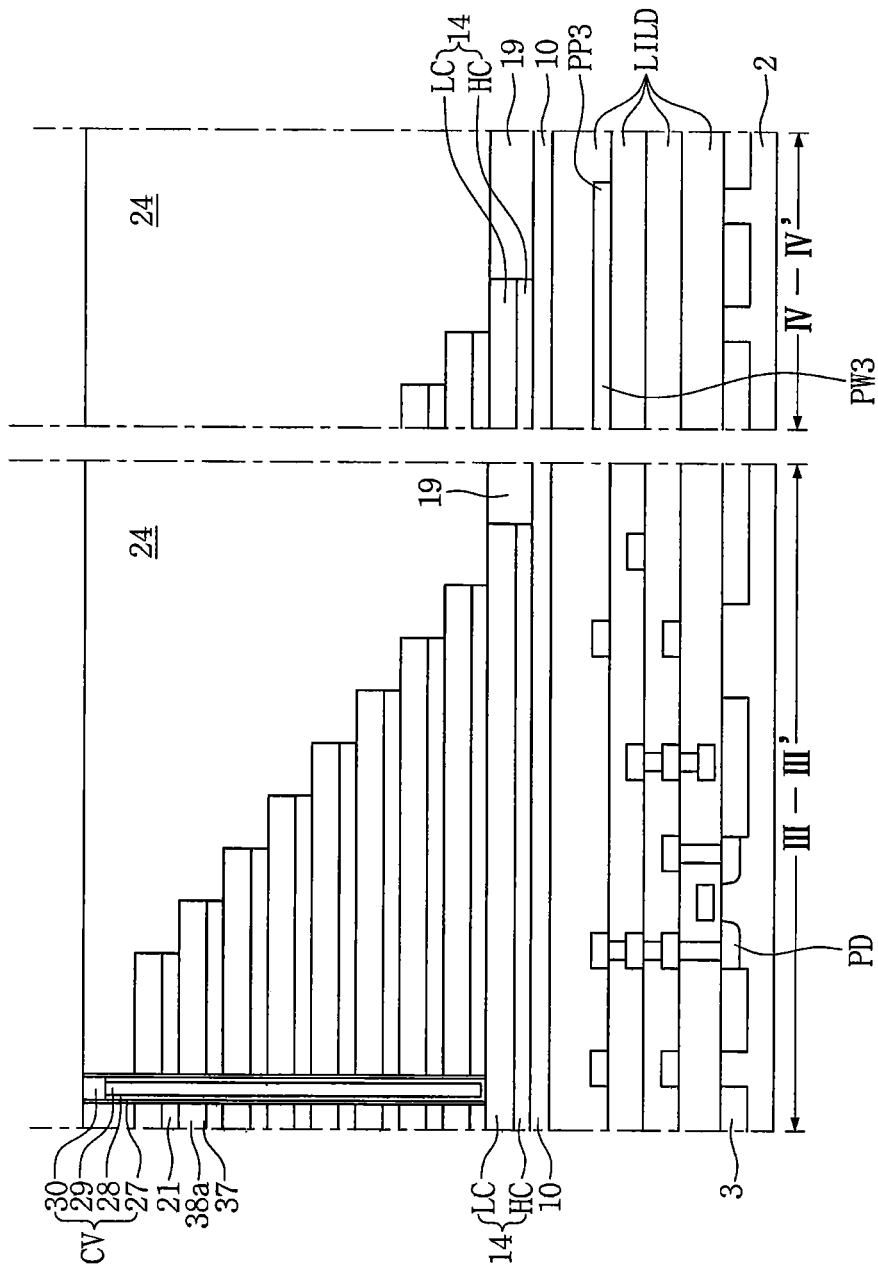

As described in FIGS. 22A and 22B, the first upper interlayer insulating layer 24 may be formed on the semiconductor substrate 2 having the molding structure MS and a plurality of cell vertical structures CV may be formed to pass through the first upper interlayer insulating layer 24 and the molding structure MS on the molding structure MS and to be connected to the semiconductor pattern 14.

In an embodiment, the insulating structure 123 may be formed to be interposed between the cell vertical structures CV and on the opening 16 of the semiconductor pattern 14 and to pass through the first upper interlayer insulating layer 24 on the molding structure MS and the molding structure MS.

The insulating structure 123 may be formed of silicon oxide. An area size of the insulating structure 123 may be greater than an area size of the opening 16 of the semiconductor pattern 14.

In an embodiment, after the cell vertical structures CV are formed, the insulating structure 123 may be formed. However, the scope of the inventive concept is not limited thereto. For example, after the insulating structure 123 is formed, the cell vertical structures CV may be formed.

Referring to FIGS. 1, 20, 31A, and 31B, as described in FIGS. 23A and 23B, the second upper interlayer insulating layer 32 may be formed on the semiconductor substrate 2 having the cell vertical structures CV and the insulating structure 123, trenches 34 may be formed to pass through the first and second upper interlayer insulating layers 24 and 32 and the molding structure MS, and empty spaces 36 may be formed by partially etching the second molding layers 22 exposed by the trenches 34.

Since the insulating structure 123 may be formed of a material having an etch selectivity with respect to the second molding layers 22, the insulating structure 123 may have an etch-resistant characteristic in a process of etching the second molding layers 22.

As described in FIGS. 23A and 23B, the trenches 34 may include the first trench 34a, the second trench 34b, and the third trench 34c, the first molding layers 20 may remain between the first and second trenches 34a and 34b which are relatively and widely spaced apart from each other and may be formed as first insulating patterns 120a, and the insulating structure 123 may be located therebetween. Therefore, the first insulating patterns 120a may have a shape which is disposed on a side surface of the insulating structure 123.

Figure 24A:
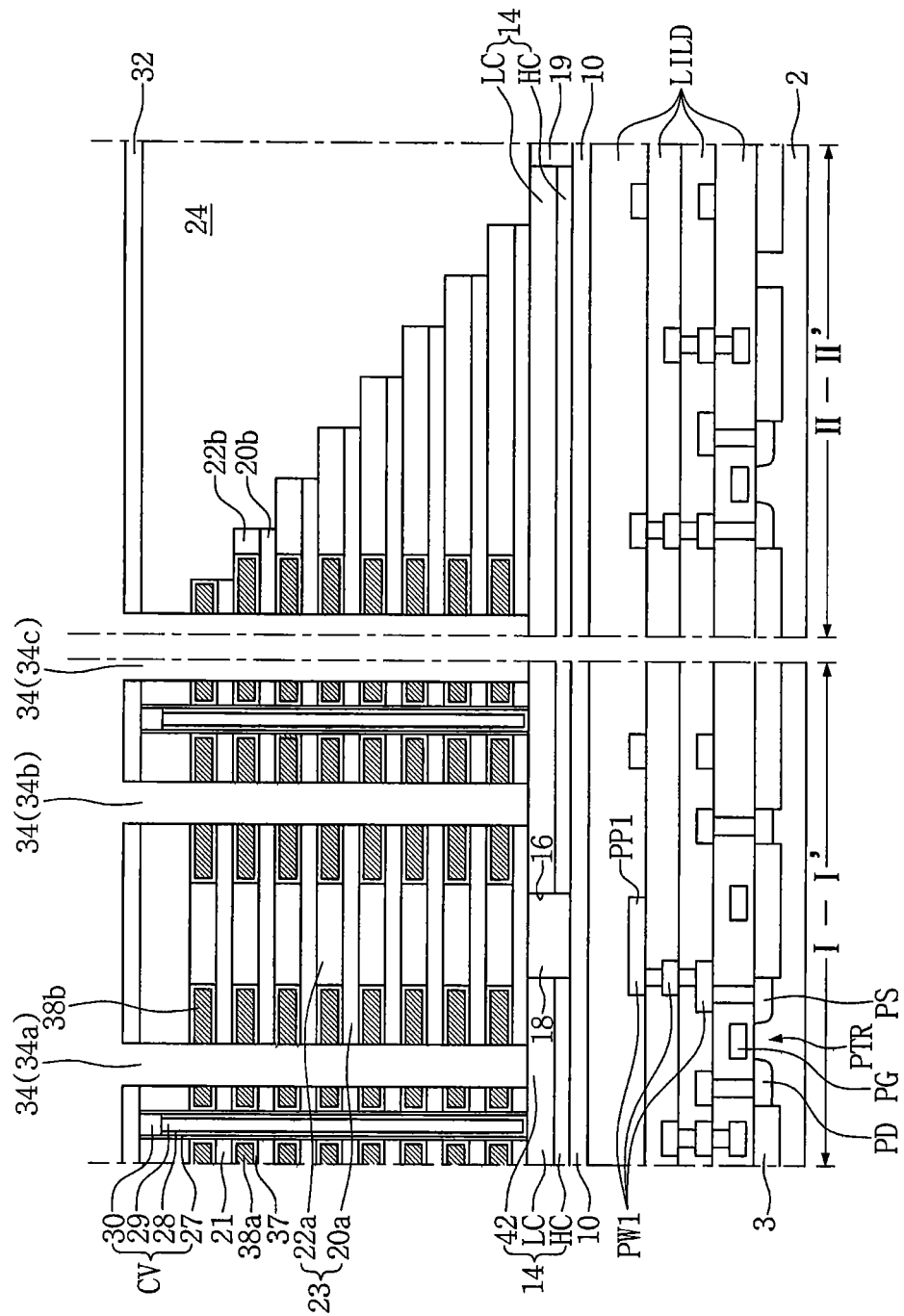
Figure 24B:
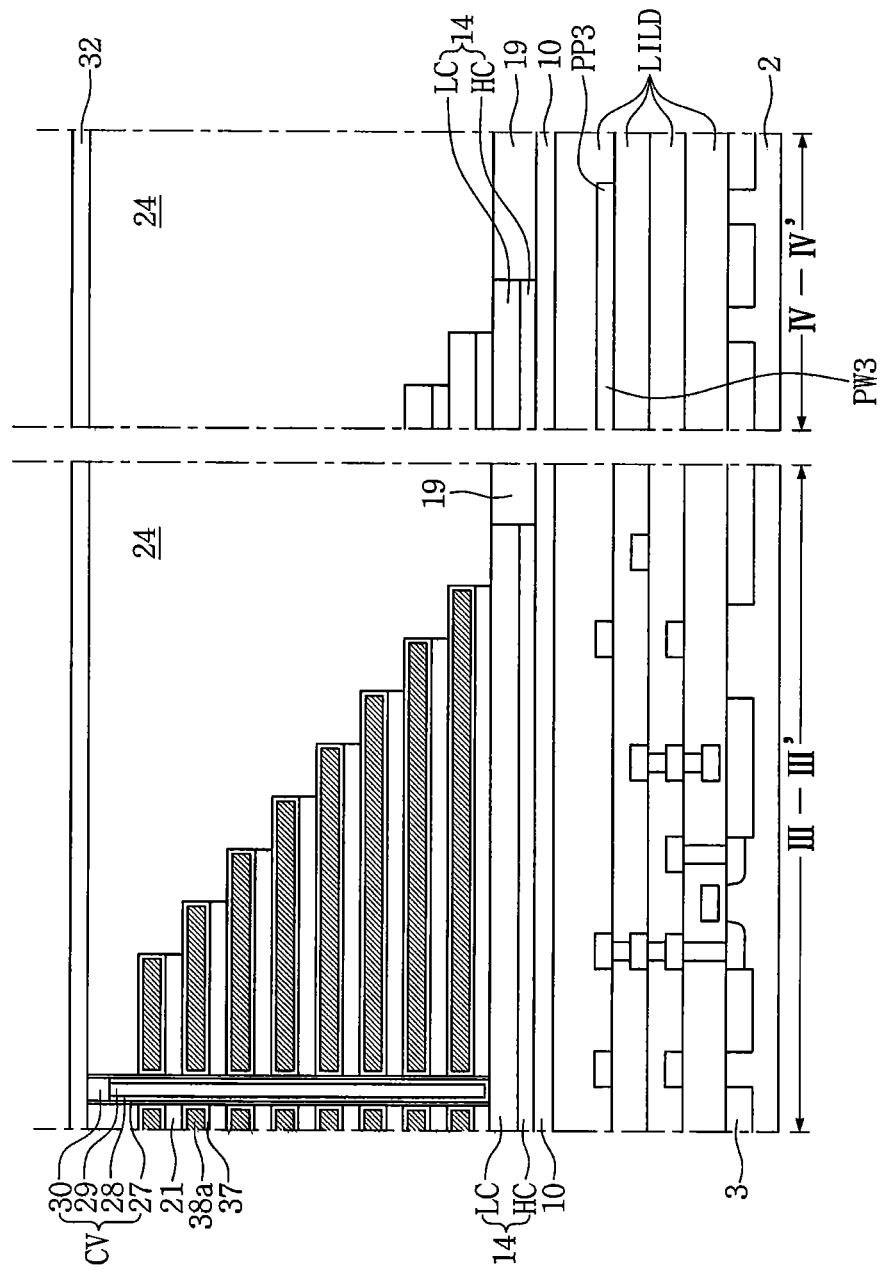

Referring to FIGS. 1, 10, 32A, and 32B, as described in FIGS. 24A and 24B, the second dielectric 37 may be formed on the semiconductor substrate 2 having the empty spaces 36, and the cell gate conductive patterns 38a and the dummy gate conductive patterns 38b and 38c may be formed.

Figure 25A:
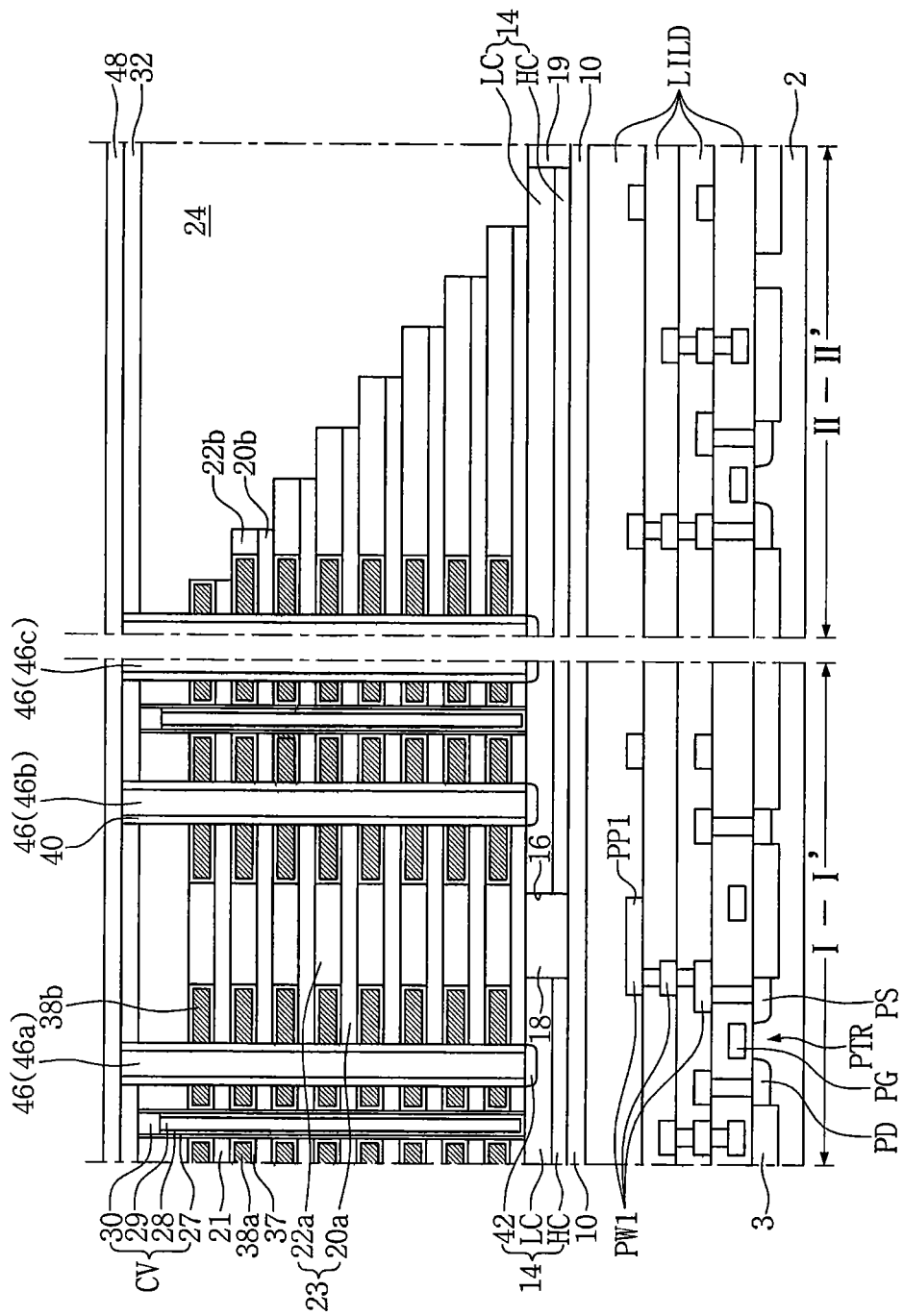
Figure 25B:
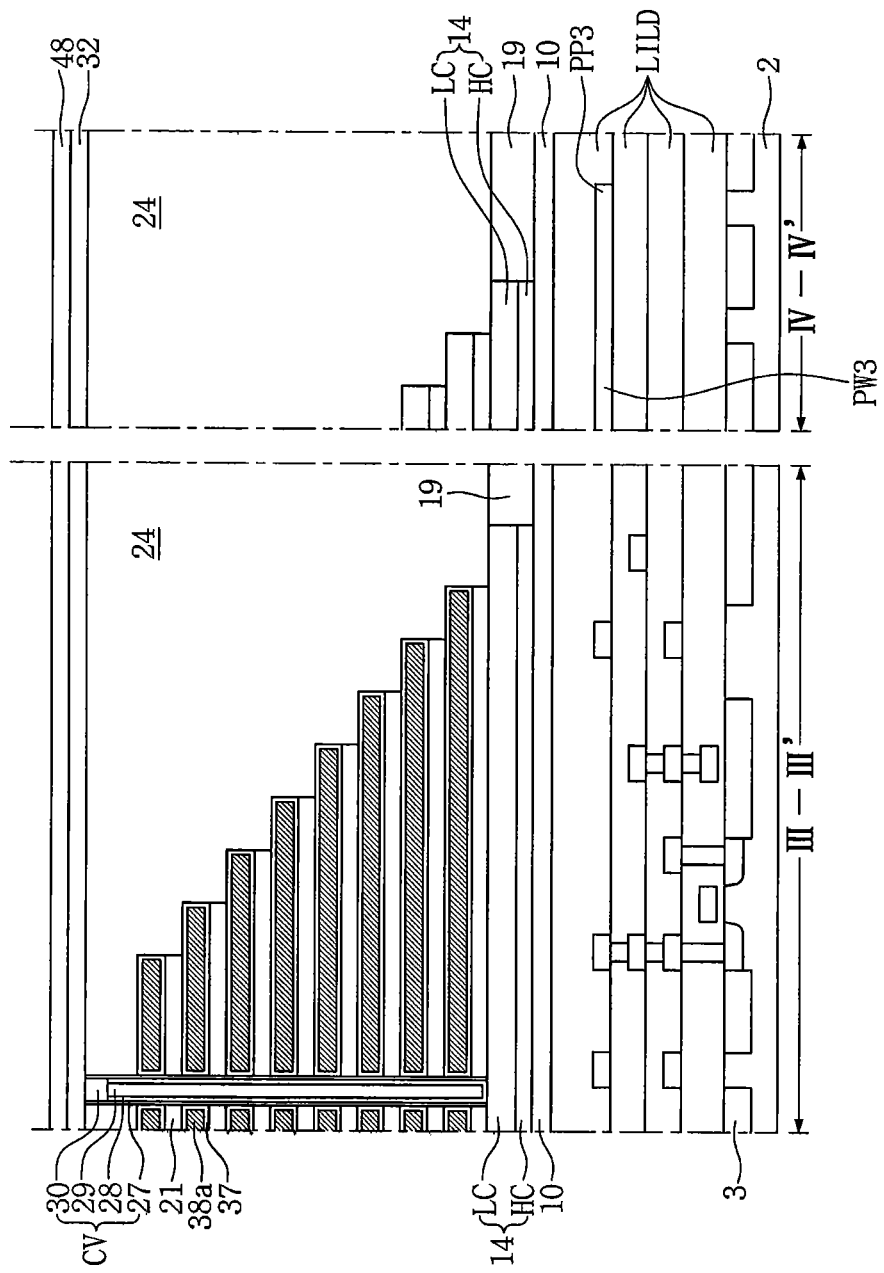

As described in FIGS. 25A and 25B, the method may include forming the insulating spacer 40 on side walls of the trenches 34, forming the cell source impurity region 42 in the semiconductor pattern 14 under the trenches 34, forming the source patterns 46 which fill the trenches 34, and forming the third upper interlayer insulating layer 48.

Figure 26A:
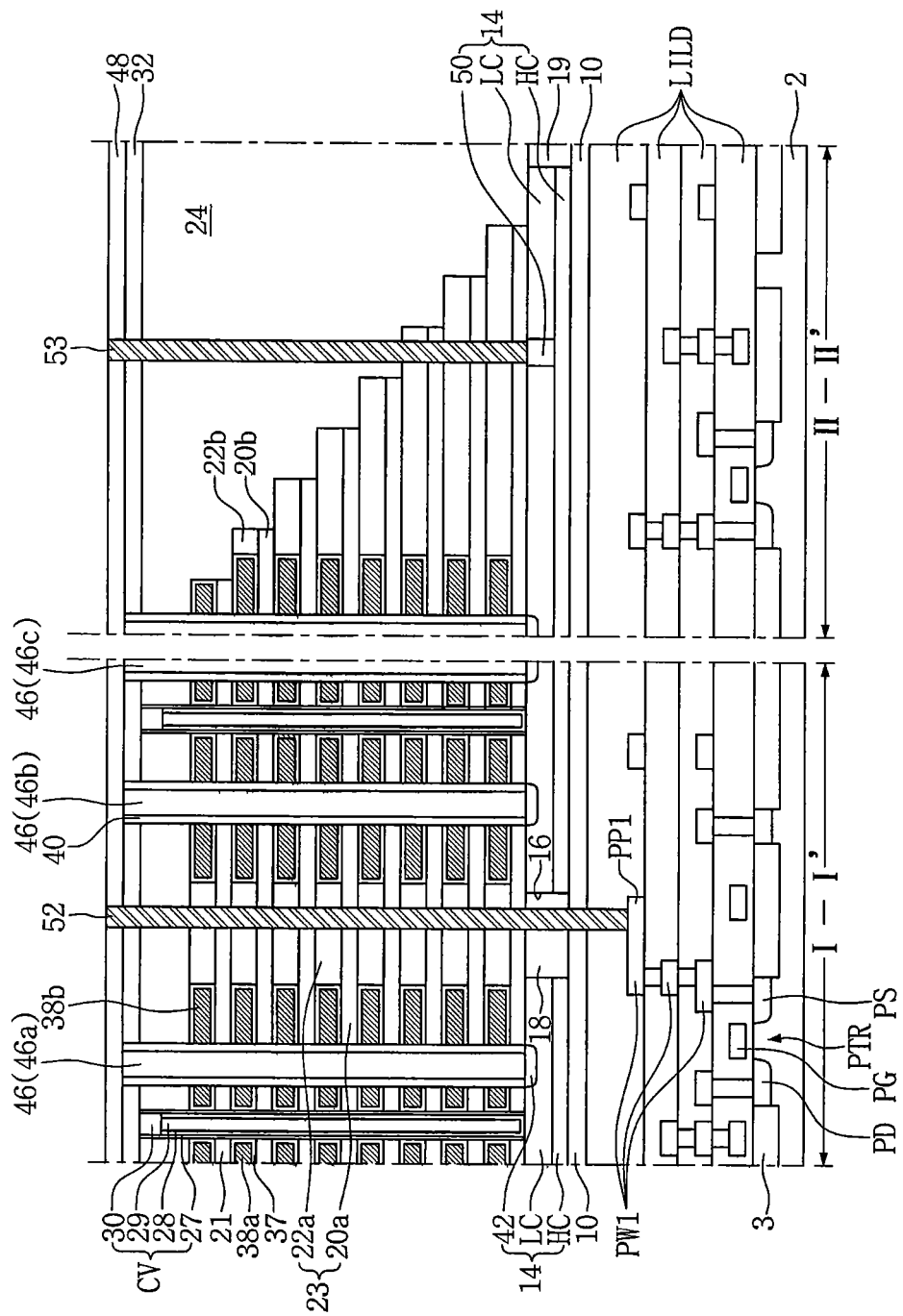
Figure 26B:
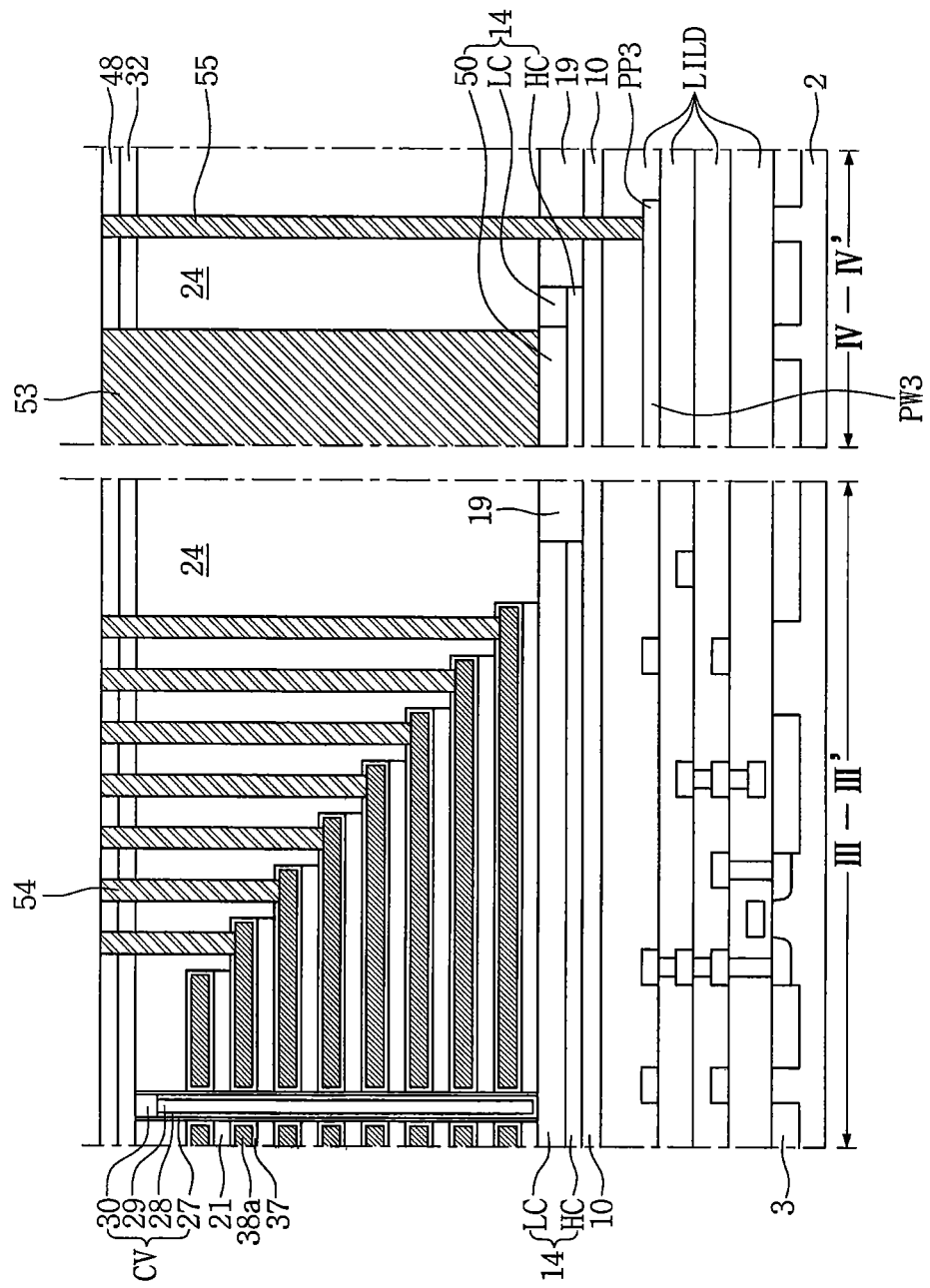

As described in FIGS. 26A and 26B, the peripheral bit line lower contact plug 52, the cell body lower contact structure 53, the cell gate lower contact plug 54, and the peripheral body lower contact structure 55 may be formed.

The peripheral bit line lower contact plug 52 may pass through the second and third upper interlayer insulating layers 32 and 38, insulating structure 123, the gap fill insulating layer 18 in the opening 16 of the semiconductor pattern 14, the buffer insulating layer 10, and the lower interlayer insulating layer LILD on the first peripheral contact pad PP1.

As described in FIGS. 26A and 26B, after contact holes for forming the peripheral bit line lower contact plug 52, the cell body lower contact structure 53, the cell gate lower contact plug 54, and the peripheral body lower contact structure 55 are formed, the cell body contact impurity region 50 may be formed in the semiconductor pattern 14.

Referring again to FIGS. 1, 10, 11A, and 11B, as described again with reference to FIGS. 3A and 3B in addition to in FIGS. 1, 2A, 2B, and 19, the fourth upper interlayer insulating layer 60 may be formed, the peripheral bit line upper contact plug 62, the cell body upper contact structure 63, the cell gate upper contact plugs 64, the peripheral body upper contact structure 65, and the cell bit line contact plugs 68 may be formed, and the interconnection structures 80, 81, and 82 may be formed.

Next, an example of the method of forming the semiconductor device such as that described in FIGS. 12, 13A, 13B, and 14 will be described with reference to FIGS. 33 to 35.

Figure 33:
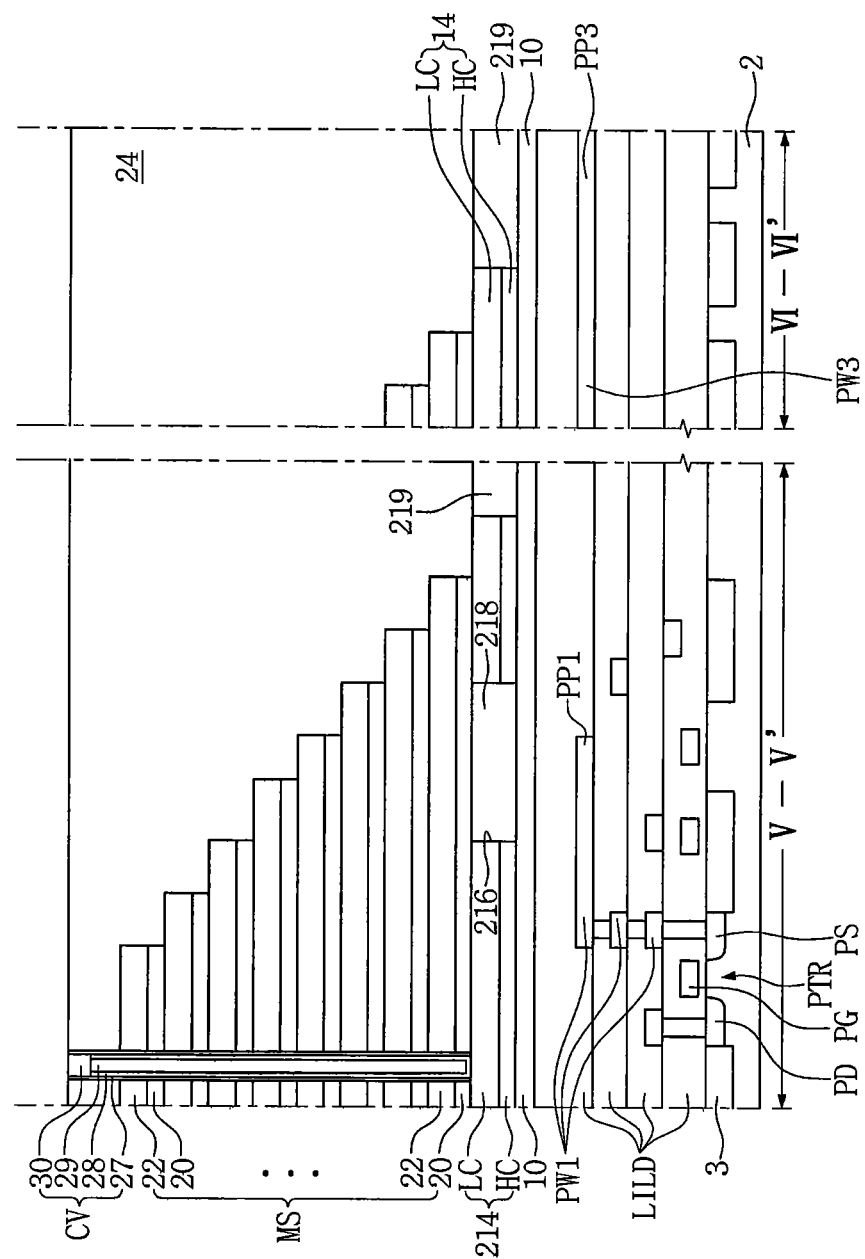
FIGS. 33 to 35 are cross-sectional views showing a method of forming a semiconductor device according to embodiments of the inventive concept.

Referring to FIGS. 12, 13A, and 33, as described in FIGS. 20A and 20B, the peripheral circuit areas PC1, PC2, and PC3 may be formed on the semiconductor substrate 2, the peripheral transistor PTR that configures circuits of the peripheral circuit areas PC1, PC2, and PC3 on the semiconductor substrate 2 and the lower interlayer insulating layer LILD which covers the peripheral interconnection structure PW may be formed on the semiconductor substrate 2, and the buffer insulating layer 10 may be formed on the lower interlayer insulating layer LILD.

A semiconductor pattern 214 having an opening 216 may be formed on the buffer insulating layer 10.

A gap fill insulating layer 218 which fills the opening 216 of the semiconductor pattern 214 and an intermediate interlayer insulating layer 219 which covers the side surface of the semiconductor pattern 214 may be formed.

As shown in FIGS. 21A and 21B, the molding structure MS may be formed on the semiconductor pattern 214 and the gap fill insulating layer 218. The molding structure MS may include the first molding layer 20 and the second molding layer 22, which are alternately and repeatedly stacked.

As shown in FIGS. 22A and 22B, the first upper interlayer insulating layer 24 may be formed on the semiconductor substrate 2 having the molding structure MS and the plurality of cell vertical structures CV may be formed to pass through the first upper interlayer insulating layer 24 on the molding structure MS and the molding structure MS and to be connected to the semiconductor pattern 14.

Figure 34:
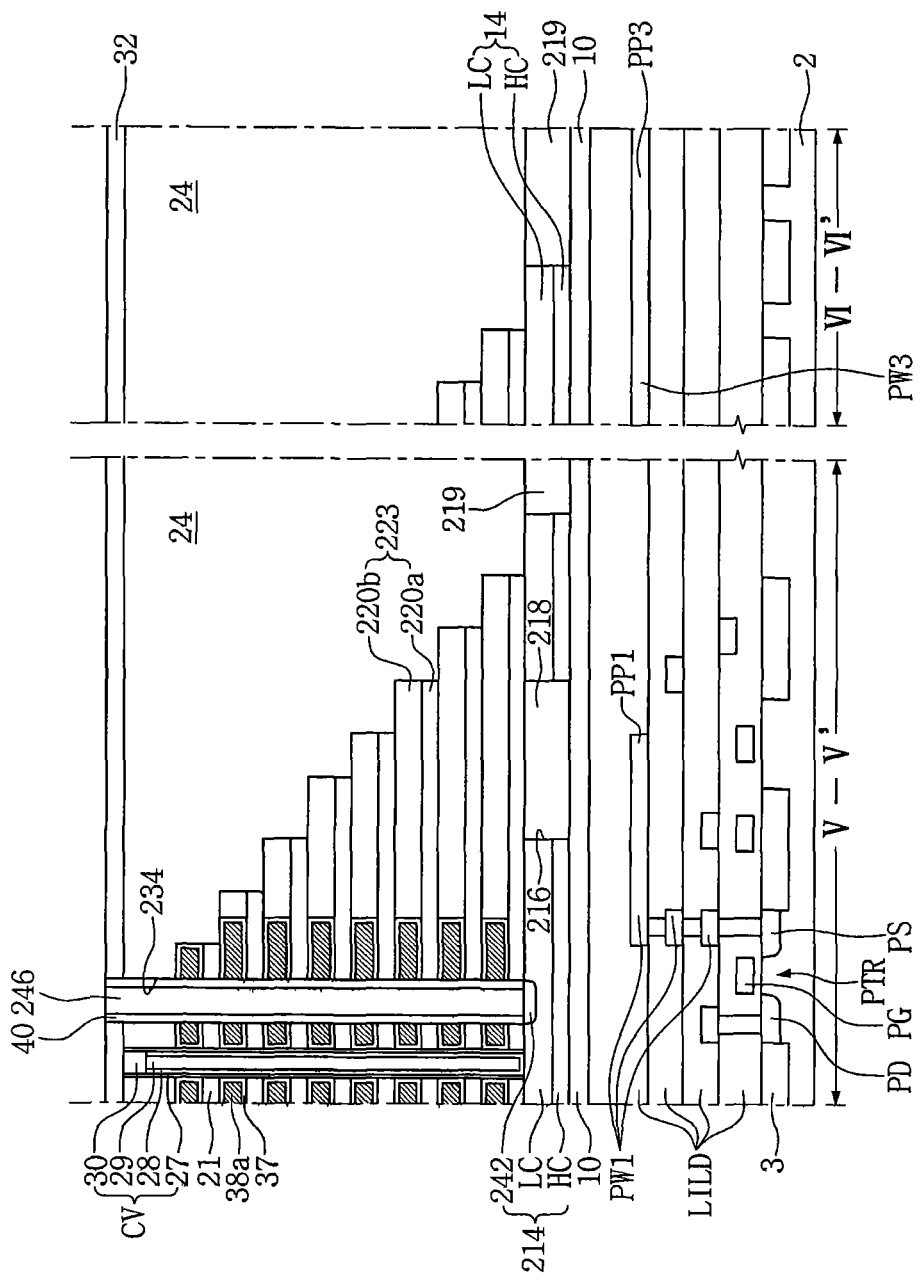

Referring to FIGS. 12, 13A and 34, the second upper interlayer insulating layer 32 may be formed on the semiconductor substrate 2 having the cell vertical structures CV.

The trenches 234 may be formed to pass through the first and second upper interlayer insulating layers 24 and 32 and the molding structure MS. The trenches 234 may be arranged to have a predetermined distance.

The empty spaces 36 may be formed by partially etching the second molding layers 22 exposed by the trenches 234, and the second dielectric 37 and cell gate conductive patterns 38a may be formed in the empty spaces 36 by performing substantially the same process described in FIGS. 23A and 23B.

In an embodiment, the molding structure MS may be formed as an insulating structure 223 by remaining in the second and fourth step areas ST2 and ST4. The insulating structure 223 may include a first insulating pattern 220a and a second insulating pattern 220b, which are alternately and repeatedly stacked to have a step structure.

The first molding layer 20 which remains between the cell gate conductive patterns 38a may be defined as cell interlayer insulating patterns 21.

An insulating spacer 40 may be formed on side walls of the trenches 234.

A cell source impurity region 242 may be formed in the semiconductor pattern 214 under the trenches 234 by performing an ion implantation process. The cell source impurity region 242 may be formed to have a conductivity type different from a low concentration impurity region LC of the semiconductor pattern 214. Source patterns 246 may be formed on the trenches 234.

Figure 35:
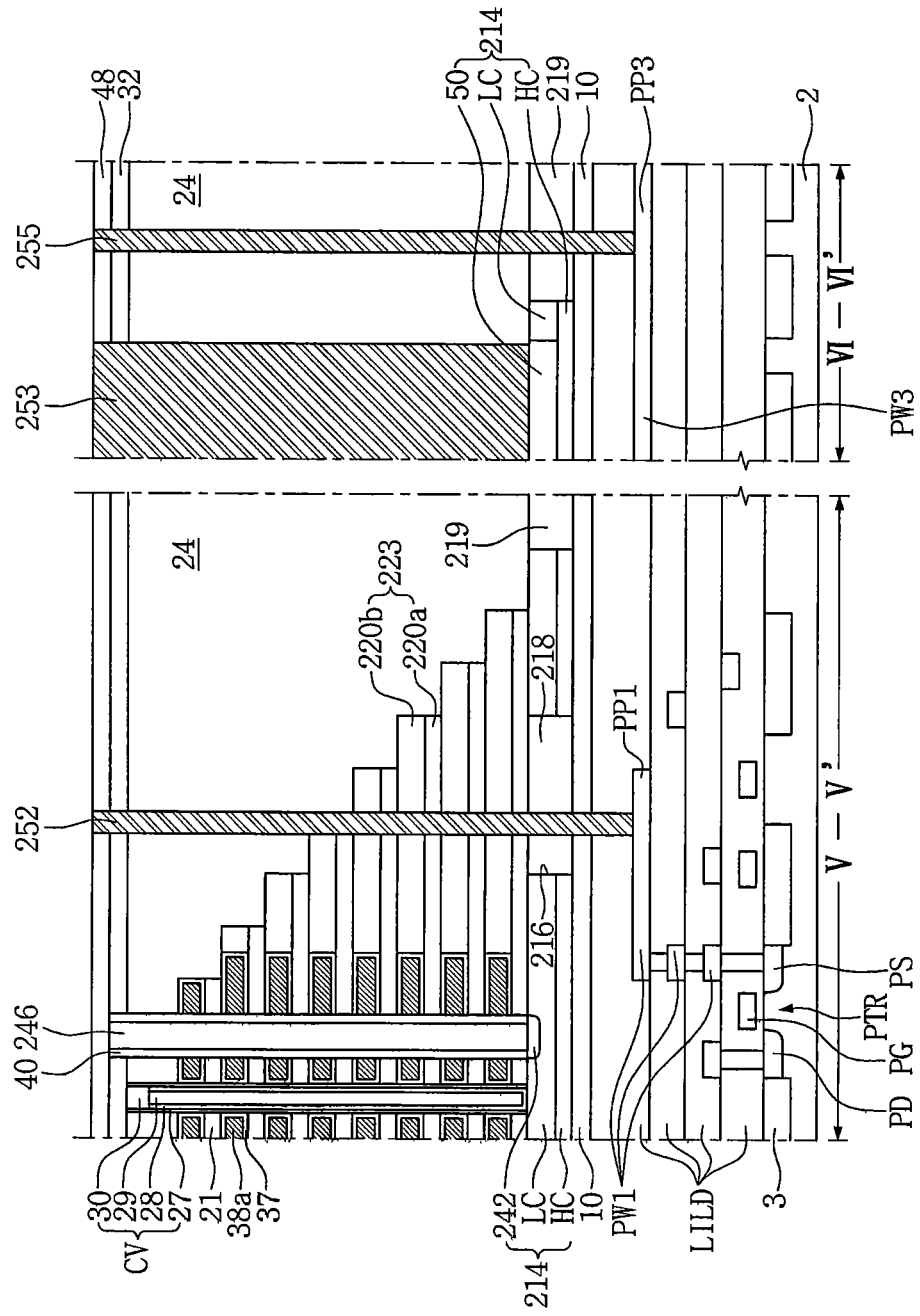

Referring to FIGS. 12, 13A, and 35, a second upper interlayer insulating layer 32 may be formed on the semiconductor substrate 2 having the source patterns 246. Lower contact plugs 252, 253, and 255 may be formed to pass through the second upper interlayer insulating layer 32.

In an embodiment, before the lower contact plugs 252, 253, and 255 are formed, contact holes for forming the lower contact plugs 252, 253, and 255 may be formed, and impurities may be implanted in contact parts exposed by the contact holes by performing an ion implantation process. Therefore, a cell body contact impurity region 50 may be formed in the semiconductor pattern 14 under the cell body lower contact plug 253.

Referring again to FIGS. 12, 13A, 13B, and 14, a fourth upper interlayer insulating layer 60 may be formed on the semiconductor substrate 2 having the lower contact plugs 252, 253, and 255. Cell bit line plugs 68 may be formed to pass through the second to fourth interlayer insulating layers 32, 48, and 60 and to be connected to the cell vertical structures CV. A bit line upper contact plug 262 may be formed to pass through the fourth upper interlayer insulating layer 60 and to be connected to the lower contact plug 252. A cell body upper contact structure 63 may be formed to be connected to the cell body lower contact structure 53. A peripheral body upper contact structure 65 may be formed to be connected to the peripheral body lower contact structure 55.

Then, interconnection structures may be formed on the fourth upper interlayer insulating layer 60. The interconnection structures may include bit lines 280, word line interconnection structures 81, and body interconnection structures 82. The bit lines 280 may be connected to the cell bit line plugs 68 and the bit line upper contact plug 262.

Next, an example of the method of forming the semiconductor device such as that described in FIGS. 12, 17, and 18 will be described with reference to FIGS. 36 and 37.

Figure 36:
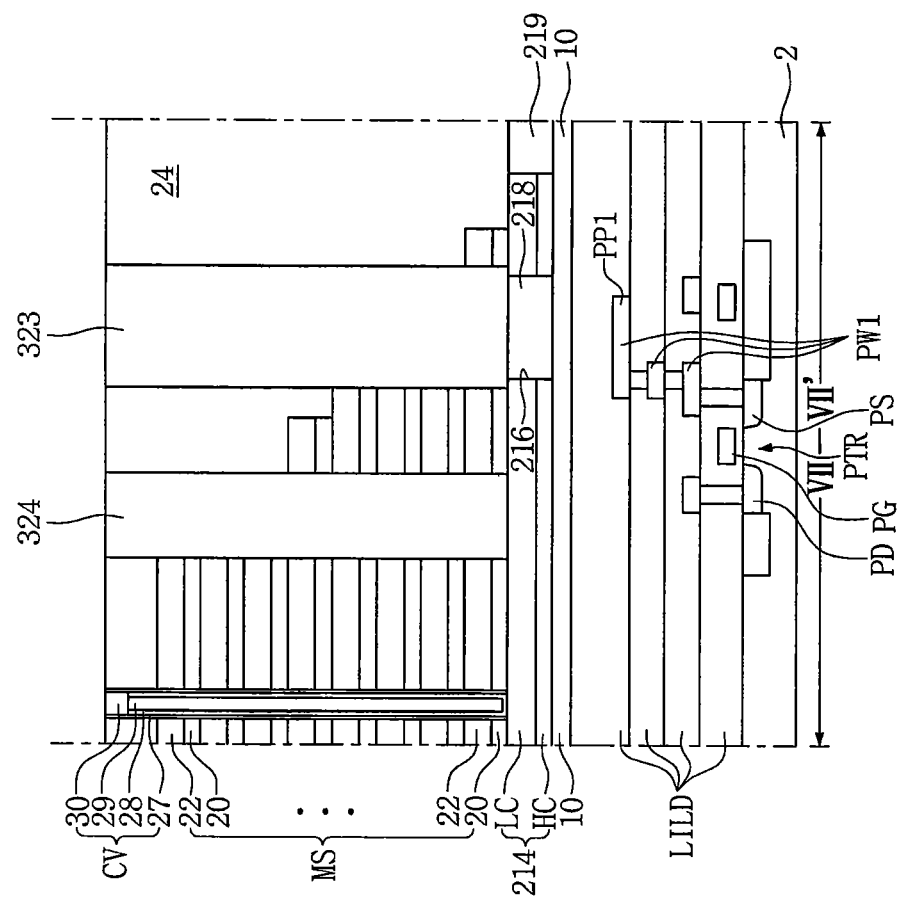
FIGS. 36 to 37 are cross-sectional views showing a method of forming a semiconductor device according to embodiments of the inventive concept.

Referring to FIGS. 12, 17, and 36, as described in FIG. 33, the peripheral circuit areas PC1, PC2, and PC3, the buffer insulating layer 10, the semiconductor pattern 214 having the opening 216, the molding structure MS, the first upper interlayer insulating layer 24, and the vertical structures CV may be formed on the semiconductor substrate 2.

In an embodiment, before the vertical structures CV are formed, a first insulating structure 323 and a second insulating structure 324 may be formed to pass through the first upper interlayer insulating layer 24 and the molding structure MS. However, the scope of the inventive concept is not limited thereto. For example, after the vertical structures CV are formed, the first insulating structure 323 and the second insulating structure 324 may be formed to pass through first upper interlayer insulating layer 24 and the molding structure MS.

The first and second insulating structures 323 and 324 may be formed of silicon oxide. The first insulating structure 323 may overlap the opening 216 of the semiconductor pattern 214. The second insulating structure 324 may not overlap the opening 216 of the semiconductor pattern 214.

Figure 37:
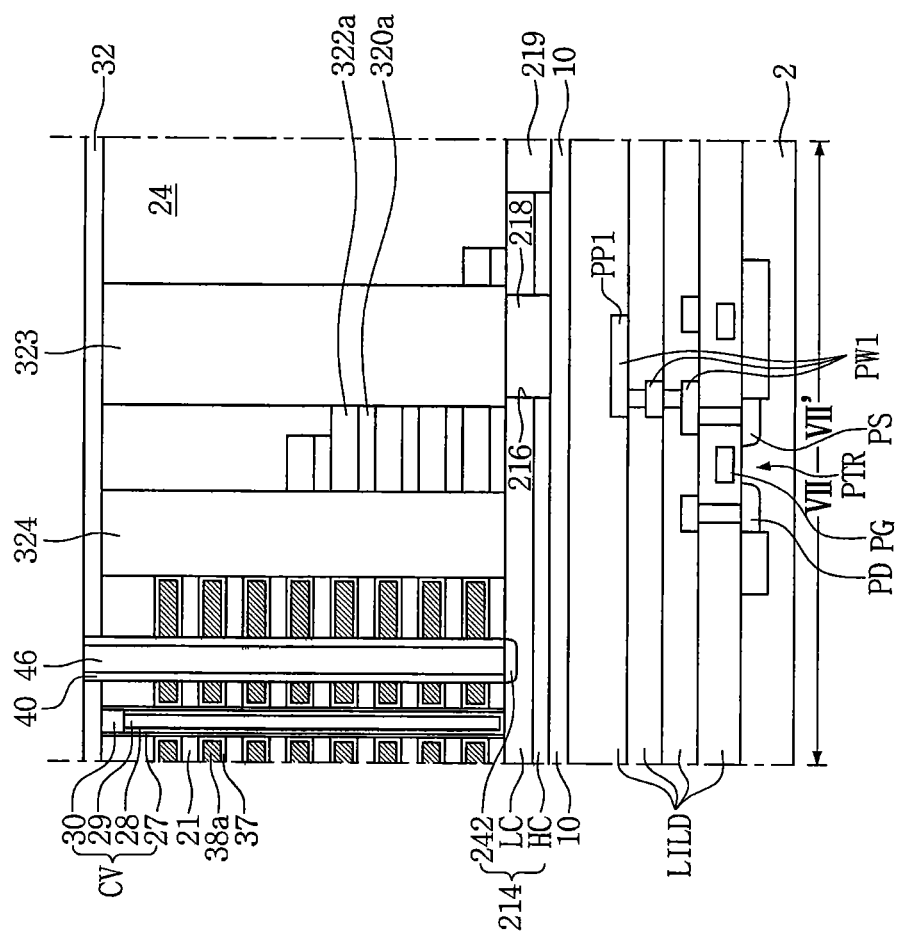

Referring to FIGS. 12, 17, and 37, a second upper interlayer insulating layer 32 may be formed on the first upper interlayer insulating layer 24. The cell source patterns 46, the cell source impurity region 242 under the cell source patterns 46, and the insulating spacers 40 on side surfaces of the cell source patterns 46 may be formed by performing substantially the same process described in FIGS. 25A and 25B.

Referring again to FIGS. 12, 17, and 18, a third upper interlayer insulating layer 48 may be formed on the second upper interlayer insulating layer 32 to cover the cell source patterns 46.

A bit line lower contact plug 352 may be formed to pass through the second and third upper interlayer insulating layers 32 and 48, the first insulating structure 323, and the gap fill insulating layer 218 in the opening 216 of the semiconductor pattern 214 and to be connected to the first peripheral pad PP1 of the first peripheral circuit area PC1.

In an embodiment, while the bit line lower contact plug 352 is formed, a cell body lower contact plug 355 may be formed to pass through the second and third upper interlayer insulating layers 32 and 48 and the second insulating structure 324 and to be connected to the semiconductor pattern 214.

In an embodiment, the formation of the lower contact plugs 352 and 355 may include forming a bit line peripheral lower contact hole which exposes the first peripheral pad PP1 and a cell body contact hole which exposes the semiconductor pattern 214, forming a cell body contact impurity region 50 in the semiconductor pattern 214 by performing an ion implantation process, and filling the contact holes with a metal material. Then, a fourth upper interlayer insulating layer 60 may be formed, upper contact plugs 68 and 372 may be formed, and interconnection structures may be formed.

Figure 38:
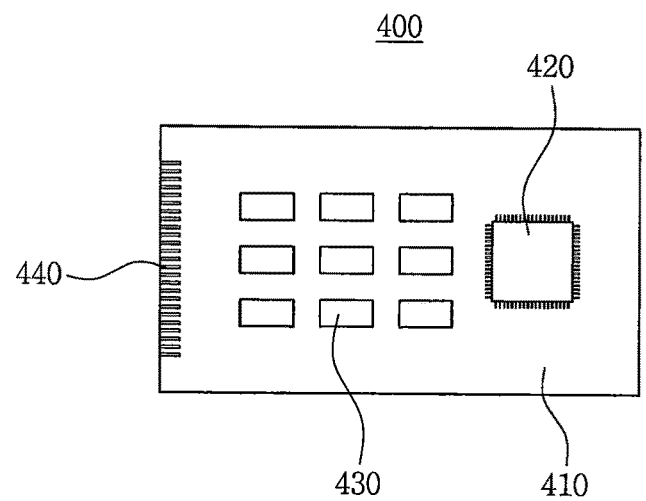
FIG. 38 is a schematic view showing a semiconductor module according to the embodiments of the inventive concept.

FIG. 38 is a schematic view showing a semiconductor module 400 according to the embodiments of the inventive concept.

Referring to FIG. 38, the semiconductor module 400 may include memory devices 430 formed on a module substrate 410. The semiconductor module 400 may include a semiconductor device 420 mounted on the module substrate 410.

The memory device 430 may include the semiconductor device according to the embodiments of the inventive concept. Input/output terminals 440 may be disposed on at least one side of the module substrate 410.

Figure 39:
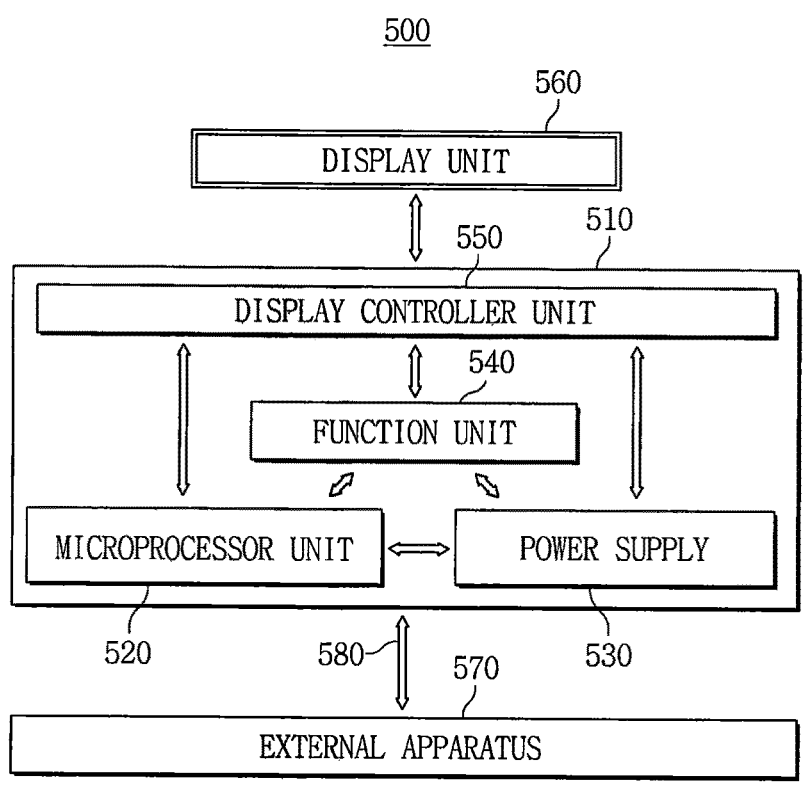
FIG. 39 is a conceptual block diagram showing an electronic system according to the embodiments of the inventive concept.

FIG. 39 is a conceptual block diagram showing an electronic system 500 according to the embodiments of the inventive concept.

Referring to FIG. 39, the electronic system 500 including the semiconductor device manufactured according to the embodiment of the inventive concept may be provided.

The electronic system 500 may include a body 510. The body 510 may include a microprocessor unit 520, a power supply 530, a function unit 540, and/or a display controller unit 550. The body 510 may be a system board or a motherboard having a printed circuit board (PCB), etc.

The microprocessor unit 520, the power supply 530, the function unit 540, and the display controller unit 550 may be installed or mounted on the body 510. A display unit 560 may be disposed on an upper surface of the body 510 or outside the body 510. For example, the display unit 560 may be disposed on a surface of the body 510, and then may display an image processed by the display controller unit 550. The power supply 530 may receive a constant voltage from an external power supply, divide the voltage into various voltage levels, and supply those voltages to the microprocessor unit 520, the function unit 540, the display controller unit 550, etc. The microprocessor unit 520 may receive a voltage from the power supply 530 to control the function unit 540 and the display unit 560.

The function unit 540 may perform various functions of the electronic system 500. For example, when the electronic system 500 is a mobile electronic product such as a cellular phone, etc., the function unit 540 may include various components which perform dialing, or wireless communication functions such as outputting an image to the display unit 560 or outputting a voice to a speaker through communication with an external apparatus 570, and when a camera is included, the function unit 540 may serve as an image processor.

In an embodiment, when the electronic system 500 is connected to a memory card to expand the capacity thereof, the function unit 540 may be a memory card controller. The function unit 540 may exchange signals with the external apparatus 570 through a wired or wireless communication unit 580.

Further, when the electronic system 500 requires a Universal Serial Bus (USB) to extend the functions thereof the function unit 540 may serve as an interface controller.

Figure 40:
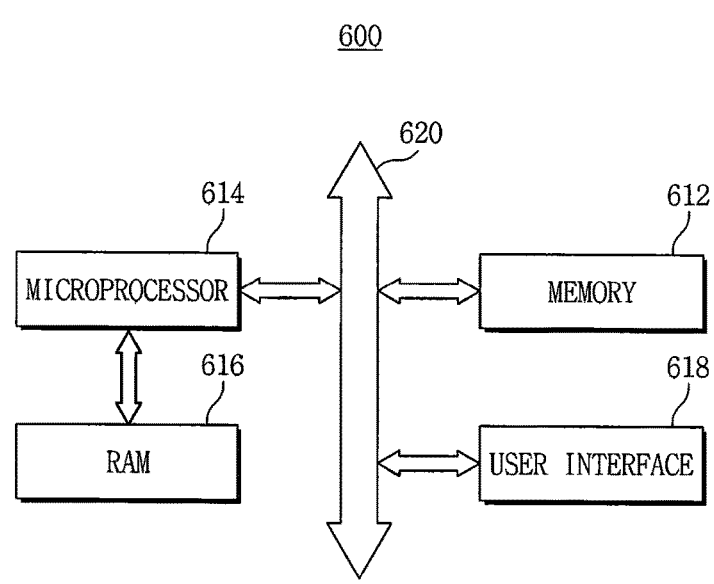
FIG. 40 is a schematic block diagram showing an electronic system according to the embodiments of the inventive concept.

FIG. 40 is a schematic block diagram showing an electronic system 600 according to the embodiments of the inventive concept Referring to FIG. 40, the electronic system 600 may include the semiconductor device in accordance with the embodiment of the inventive concept. The electronic system 600 may include a memory system 612, a microprocessor 614, a RAM 616, and a user interface 618 which performs data communication using a bus 620. The microprocessor 614 may program and control the electronic system 600. The RAM 616 may be used as an operational memory of the microprocessor 614. The microprocessor 614, the RAM 616, and/or other components may be assembled within a single package. The memory system 612 may include the semiconductor device according to the embodiments of the inventive concept.

The user interface 618 may be used to input data to the electronic system 600 or output data from the electronic system 600. The memory system 612 may store operational codes of the microprocessor 614, data processed by the microprocessor 614, or data received from the outside. The memory system 612 may include a controller and a memory.

According to the embodiments of the inventive concept, a 3-dimensional semiconductor device capable of improving a degree of integration can be provided.

According to the embodiments of the inventive concept, since a peripheral circuit area and a memory cell array area are vertically arranged, and a contact structure, which electrically connects a bit line of the memory cell array area to the peripheral circuit area, is disposed to vertically pass through the memory cell array area or is disposed at a location close to the memory cell array area, a degree of integration can be improved.

Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims.

What is claimed is:

1. A three-dimensional semiconductor memory device comprising:
 a semiconductor pattern that is disposed on a semiconductor substrate and comprises an opening;
 a first peripheral interconnection structure that is disposed between the semiconductor substrate and the semiconductor pattern and comprises a first peripheral contact pad;
 a second peripheral interconnection structure disposed between the semiconductor substrate and the semiconductor pattern, wherein the second peripheral interconnection structure extends outside of the semiconductor pattern and comprises a second peripheral contact pad;
 a memory cell array area disposed on the semiconductor pattern;
 a step area disposed on the semiconductor pattern and, on a side of the memory cell array area;
 a memory cell gate conductive pattern disposed on the semiconductor pattern, wherein the memory cell gate conductive pattern is disposed in the memory cell array area and extends to the step area;
 a memory cell vertical structure that extends through the memory cell gate conductive pattern in the memory cell array area and is connected to the semiconductor pattern;
 a memory cell hit line disposed on the memory cell vertical structure;
 a peripheral bit line contact structure that is disposed between the memory cell bit line and the first peripheral contact pad and extends through the opening of the semiconductor pattern;
 a cell gate contact structure disposed on the memory cell gate conductive pattern of the step area on the semiconductor pattern;
 a peripheral word line contact structure disposed on the second peripheral contact pad and outside of the semiconductor pattern; and
 a word line interconnection structure that electrically connects the cell gate contact structure to the peripheral word line contact structure.

2. The device of claim 1, wherein the opening is disposed in the memory cell array area.

3. The device of claim 1, wherein the opening is disposed in the step area.

4. The device of claim 1, wherein the opening is disposed in the memory cell array area and extends to the step area.

5. A three-dimensional semiconductor memory device comprising:
- a semiconductor pattern disposed on a semiconductor substrate;
- an insulating structure disposed on the semiconductor pattern, wherein the insulating structure comprises first insulating patterns and second insulating patterns that are alternately stacked, and wherein the first insulating patterns comprise a material having an etch selectivity with respect to the second insulating patterns;
- third insulating patterns and fourth insulating patterns that are disposed on the semiconductor pattern and alternately stacked;
- a peripheral transistor disposed between the semiconductor substrate and the semiconductor pattern;
- a peripheral interconnection structure disposed between the semiconductor substrate and the semiconductor pattern, wherein the peripheral interconnection structure is electrically connected to the peripheral transistor and comprises, a peripheral contact pad;
- a memory cell gate conductive structure disposed on the semiconductor pattern, wherein the memory cell gate conductive structure comprises a plurality of memory cell gate conductive patterns stacked in a direction perpendicular to the semiconductor pattern;
- a memory cell vertical structure extending through the memory cell gate conductive structure;
- a memory cell conductive line disposed on the memory cell vertical structure, wherein the memory cell conductive line has a length smaller than a width of the semiconductor pattern; and
- a peripheral contact structure disposed between the memory cell conductive, line and the peripheral contact pad,
- wherein the peripheral contact structure extends through the insulating structure, and
- wherein ones of the third insulating patterns and respective ones of the first insulating patterns are disposed at an equal height and comprise a first material, and ones of the fourth insulating patterns and respective ones of the second insulating patterns are disposed at an equal height and comprise a second material.

6. The device of claim 5, further comprising a body contact structure that extends through the third and fourth insulating patterns and is connected to the semiconductor pattern.

7. A three-dimensional semiconductor memory device comprising:
- a peripheral transistor disposed on a semiconductor substrate;
- a peripheral interconnection structure disposed on the semiconductor substrate, wherein the peripheral interconnection structure is electrically connected to the peripheral transistor and comprises a peripheral contact pad;
- a lower interlayer insulating layer that is disposed on the semiconductor substrate and on the peripheral transistor and the peripheral interconnection structure;
- a buffer insulating layer disposed on the lower interlayer insulating layer;
- a semiconductor pattern disposed on the buffer insulating layer, wherein the semiconductor pattern overlaps the peripheral transistor and the peripheral interconnection structure;
- a first gate conductive structure, a second gate conductive structure, and a third gate conductive structure that are disposed on the semiconductor pattern and are sequentially arranged in a horizontal direction, wherein each of the first, second and third gate conductive structures comprises a plurality of memory cell gate conductive patterns stacked in a direction perpendicular to the semiconductor pattern;
- memory cell vertical structures extending through respective ones of the first, second and third gate conductive structures;
- cell bit line contact plugs disposed on respective ones of the memory cell vertical structures;
- a memory cell bit line disposed on the cell bit line contact plugs; and
- a peripheral bit line contact structure that extends through the semiconductor pattern and is disposed between the memory cell bit line and the peripheral contact pad.

8. The device of claim 7, wherein a distance between the first and second gate conductive structures is greater than a distance between the second and third gate conductive structures, and the peripheral bit line contact structure extends between the first and second gate conductive structures.

9. The device of claim 7, further comprising:
- a cell body contact structure disposed on the semiconductor pattern; and
- a body interconnection structure disposed on the cell body contact structure.

10. The device of claim 9, wherein the peripheral bit line contact structure comprises a peripheral bit line lower contact plug and a peripheral bit line upper contact plug disposed on the peripheral bit line lower contact plug, and wherein the cell body contact structure comprises a cell body lower contact plug and a cell body upper contact plug disposed on the cell body lower contact plug.

11. The device of claim 10, wherein lower surfaces of the peripheral bit line lower contact plug and the cell body lower contact plug are non-coplanar, and upper surfaces of the peripheral bit line lower contact plug and the cell body lower contact plug are coplanar.

* * * * *

UNITED STATES PATENT AND TRADEMARK OFFICE
CERTIFICATE OF CORRECTION

PATENT NO. : 10,038,009 B2
APPLICATION NO. : 15/662714
DATED : July 31, 2018
INVENTOR(S) : Lim et al.

Page 1 of 1

It is certified that error appears in the above-identified patent and that said Letters Patent is hereby corrected as shown below:

In the Claims

Column 30, Line 49, Claim 1: Please correct "hit line" to read -- bit line --

Column 32, Line 26, Claim 7: Please correct "hit line" to read -- bit line --

Column 32, Line 50, Claim 11: Please correct "hit line" to read -- bit line --

Signed and Sealed this
Twenty-eighth Day of July, 2020

Andrei Iancu
*Director of the United States Patent and Trademark Office*